US010658423B2

(12) United States Patent
Daikoku et al.

(10) Patent No.: US 10,658,423 B2
(45) Date of Patent: May 19, 2020

(54) METHOD OF MANUFACTURING LIGHT EMITTING DEVICE

(71) Applicant: NICHIA CORPORATION, Anan-shi, Tokushima (JP)

(72) Inventors: Shinichi Daikoku, Tokushima (JP); Hirofumi Nishiyama, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 16/455,549

(22) Filed: Jun. 27, 2019

(65) Prior Publication Data

US 2019/0319065 A1 Oct. 17, 2019

Related U.S. Application Data

(63) Continuation of application No. 15/906,912, filed on Feb. 27, 2018, now Pat. No. 10,381,400.

(30) Foreign Application Priority Data

Feb. 28, 2017 (JP) .................................. 2017-037240
Jun. 14, 2017 (JP) .................................. 2017-116476

(51) Int. Cl.
| H01L 33/62 | (2010.01) |
| H01L 27/15 | (2006.01) |
| H01L 33/46 | (2010.01) |
| H01L 33/60 | (2010.01) |
| H01L 33/30 | (2010.01) |

(Continued)

(52) U.S. Cl.
CPC ............ *H01L 27/156* (2013.01); *H01L 33/46* (2013.01); *H01L 33/60* (2013.01); *H01L 33/62* (2013.01);

(Continued)

(58) Field of Classification Search
CPC ........... H01L 27/156; H01L 2933/0025; H01L 2933/0058; H01L 2933/0066;

(Continued)

(56) References Cited

U.S. PATENT DOCUMENTS 7,079,093 B2 * 7/2006 Sun ..................... H01L 27/3244
                                                      313/293
7,829,902 B2 * 11/2010 El-Ghoroury .......... B82Y 20/00
                                                      257/89

(Continued)

FOREIGN PATENT DOCUMENTS

JP   H01-312875 A   12/1989
JP   2003-115611 A   4/2003

(Continued)

OTHER PUBLICATIONS

Notice of Allowance on U.S. Appl. No. 15/906,912, dated Mar. 28, 2019.

(Continued)

*Primary Examiner* — Jaehwan Oh
(74) *Attorney, Agent, or Firm* — Foley & Lardner LLP

(57) ABSTRACT

A method of manufacturing a light emitting device includes: providing a wafer that comprises: a supporting substrate, and a plurality of light emitting structures arranged in a two-dimensional array on a first principal surface of the supporting substrate along a first direction and a second direction, each of the plurality of light emitting structures comprising a first semiconductor layer, which includes a first region and a second region, and a second semiconductor layer, which covers the second region of the first semiconductor layer, wherein the plurality of light emitting structures includes a first light emitting structure and a second light emitting structure; forming a recess in the first principal surface of the supporting substrate between the first light emitting structure and the second light emitting structure;

(Continued)

forming a resin layer in the recess; and removing the supporting substrate so as to expose the first semiconductor layer.

23 Claims, 34 Drawing Sheets

(51) Int. Cl.
  *H01L 33/50* (2010.01)
  *H01L 33/00* (2010.01)
  *H01L 33/32* (2010.01)

(52) U.S. Cl.
  CPC .......... *H01L 33/0079* (2013.01); *H01L 33/30* (2013.01); *H01L 33/32* (2013.01); *H01L 33/502* (2013.01); *H01L 2933/0016* (2013.01); *H01L 2933/0025* (2013.01); *H01L 2933/0058* (2013.01); *H01L 2933/0066* (2013.01)

(58) Field of Classification Search
  CPC ... H01L 33/0079; H01L 33/30; H01L 33/502; H01L 33/60; H01L 33/62
  See application file for complete search history.

(56) References Cited

U.S. PATENT DOCUMENTS

| | | | | |
|---|---|---|---|---|
| 7,838,878 | B2* | 11/2010 | Greisen | H01L 33/0095 257/48 |
| 10,152,923 | B2* | 12/2018 | Li | G09G 3/3266 |
| 2012/0146066 | A1 | 6/2012 | Tischler et al. | |
| 2017/0221962 | A1 | 8/2017 | Tajima et al. | |
| 2017/0294417 | A1* | 10/2017 | Edmond | H01L 25/0753 |
| 2018/0247973 | A1* | 8/2018 | Daikoku | H01L 27/156 |
| 2018/0358339 | A1* | 12/2018 | Iguchi | G09G 3/3233 |
| 2019/0316742 | A1* | 10/2019 | Tischler | F21V 23/06 |

FOREIGN PATENT DOCUMENTS

| | | |
|---|---|---|
| JP | 2005-039041 A | 2/2005 |
| JP | 2014-073551 A | 4/2014 |
| JP | 2015-026731 A | 2/2015 |
| JP | 2016-039361 A | 3/2016 |

OTHER PUBLICATIONS

Notice of Allowance on U.S. Appl. No. 15/906,912, dated Jun. 20, 2019.

* cited by examiner

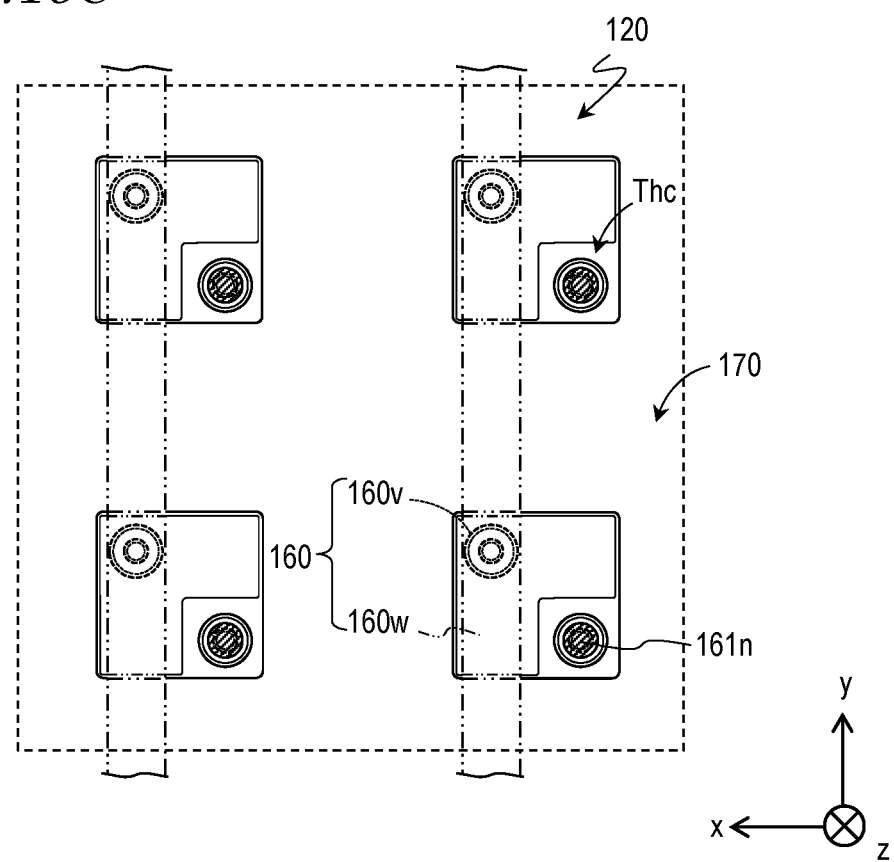

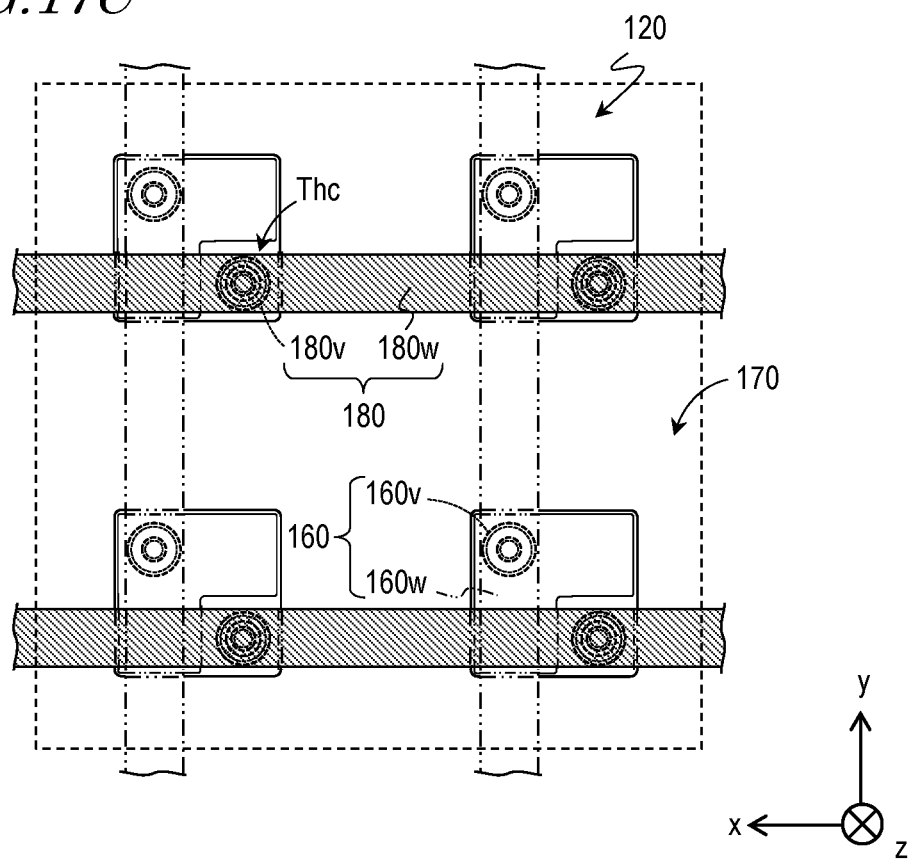

METHOD OF MANUFACTURING LIGHT EMITTING DEVICE

CROSS-REFERENCE TO RELATED APPLICATIONS

This application is a continuation of U.S. patent application Ser. No. 15/906,912, filed on Feb. 27, 2018, which claims priority to Japanese Patent Application No. 2017-116476, filed on Jun. 14, 2017, and Japanese Patent Application No. 2017-037240, filed on Feb. 28, 2017, the disclosures of which are hereby incorporated by reference in their entireties.

BACKGROUND

The present disclosure relates to a light emitting element manufacturing method.

Semiconductor light emitting elements that include a substrate and a semiconductor multilayer structure on the substrate have been known. The semiconductor multilayer structure in the semiconductor light emitting elements usually includes an n-type semiconductor layer grown on a transparent substrate, a p-type semiconductor layer, and an active layer provided between the n-type and the p-type semiconductor layers. On the n-type semiconductor layer and on the p-type semiconductor layer, electrodes for supplying electricity, etc., are provided. The electrodes on the n-type semiconductor layer and the p-type semiconductor layer are usually located at a side opposite to the substrate.

A structure where semiconductor multilayer structures are arranged at a plurality of positions on the same substrate has been proposed. For example, Japanese Patent Publication No. 2015-026731 discloses a blue light-emitting diode array including a plurality of blue light-emitting diode unit cells arranged in rows and columns.

SUMMARY

In the case of forming a plurality of semiconductor multilayer structure arrays on the same substrate, wirings that are to be connected with the n-type semiconductor layer and wirings that are to be connected with the p-type semiconductor layer are needed to be arranged so as to intersect with each other, so that the manufacturing process is likely to become complicated. According to the technique described in Japanese Patent Publication No. 2015-026731 as mentioned above, the semiconductor light emitting element is disposed between stripe-shaped electrode layers that intersect with each other, so that intersection of the striped electrode layers on the same surface side of the semiconductor light emitting element is avoided. However, in such a structure, it is necessary to grow a semiconductor layer on one of the striped electrode layers. Therefore, there are many restrictions on the materials, and as a result, the manufacturing process may become complicated.

The present disclosure provides a method of manufacturing a light emitting device including a plurality of light emitting structures that is two-dimensionally arranged, in which complication of the process is suppressed.

A method of manufacturing a light emitting device according to one embodiment of the present disclosure includes: (a) providing a wafer that includes a supporting substrate and a plurality of light emitting structures, the plurality of light emitting structures being two-dimensionally arranged on one of principal surfaces of the supporting substrate along a first direction and a second direction that is different from the first direction, each of the plurality of light emitting structures including a first semiconductor layer of a first conductivity type that includes a first region and a second region and a second semiconductor layer of a second conductivity type that covers the second region of the first semiconductor layer; (b) forming a first insulating layer so as to cover the plurality of light emitting structures, the first insulating layer defining first through-holes and second through-holes, each of the first through-holes being disposed on the first region of the first semiconductor layer of a respective one of the light emitting structures, each of the second through-holes defined on the second semiconductor layer of a respective one of the light emitting structures; (c) forming a plurality of first electrically-conductive structures and a plurality of first wirings, each of the plurality of first electrically-conductive structures being disposed with respect to a respective one of the first through-holes and electrically connected with the first semiconductor layer, the plurality of first wirings being electrically separated from the plurality of first electrically-conductive structures, each of the plurality of first wirings being electrically connected with of the second semiconductor layers of respective ones of the plurality of light emitting structures that are aligned in the second direction at the second through-holes; (d) forming a second insulating layer so as to cover the plurality of first wirings, the second insulating layer defining a third through-holes each disposed at a position overlapping a respective one of the plurality of first electrically-conductive structures when viewed from above; and (e) forming a plurality of second wirings, each of the plurality of second wirings being electrically connected with respective ones of the plurality of first electrically-conductive structures that are aligned in the first direction at the third through-holes.

According to one embodiment of the present disclosure, a method of manufacturing a light emitting device including a plurality of light emitting structures is provided, in which complication of the process is suppressed, is provided.

BRIEF DESCRIPTION OF DRAWINGS

FIG. 16C is a schematic enlarged bottom view showing a part of an array of light emitting structures 120 after formation of a second insulating layer.

FIG. 17C is a schematic enlarged bottom view showing part of an array of light emitting structures after formation of an n-side wiring layer.

DETAILED DESCRIPTION

Figure 1:
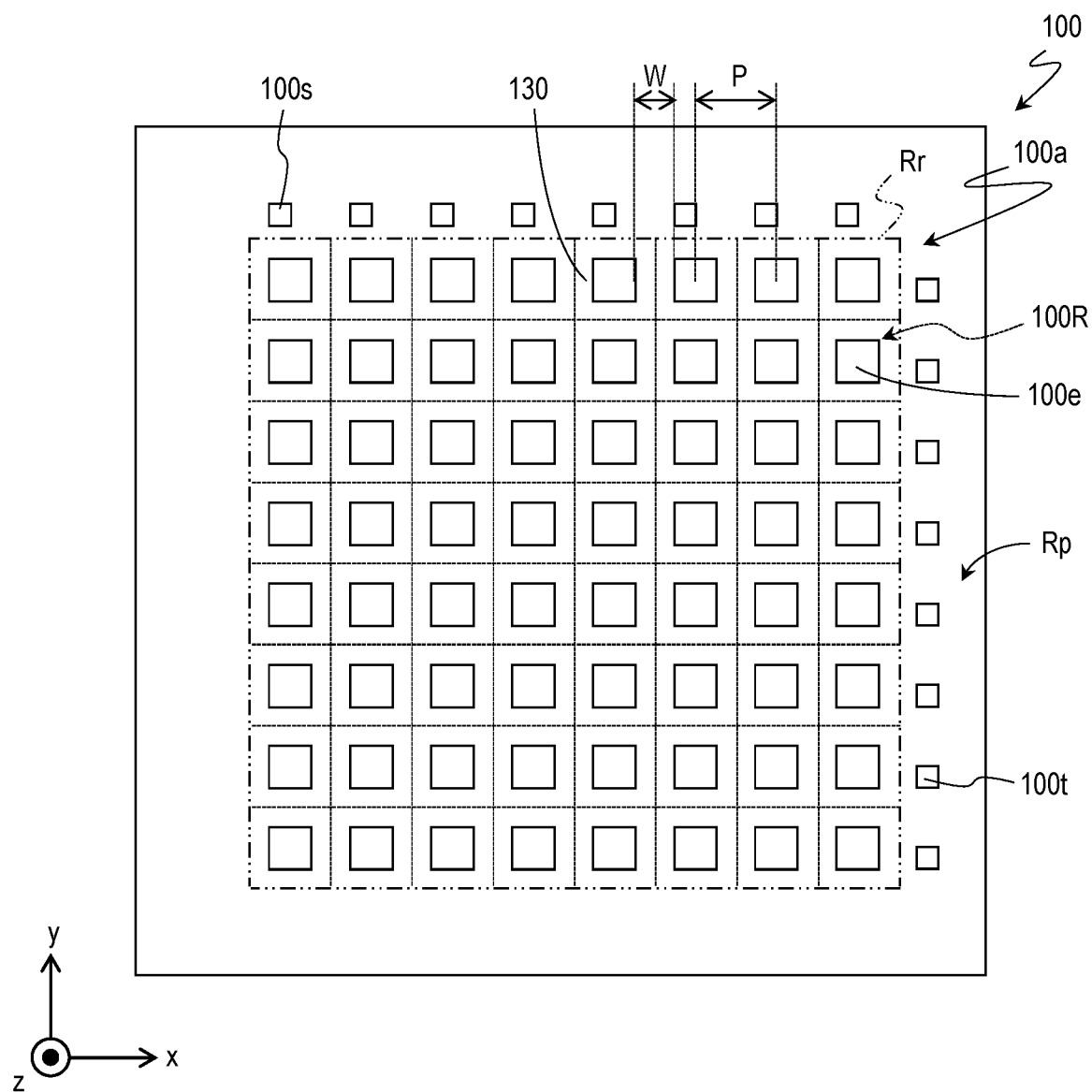
FIG. 1 is a schematic top view of an exemplary light emitting device obtained by a manufacturing method of one embodiment of the present disclosure.

Hereinafter, certain embodiments of the present disclosure will be described in detail with reference to the drawings. The embodiments described below are examples, and the present invention is not limited to the embodiments described below. For example, values, shapes, materials, steps and the order of steps that will be described below are examples, and various modifications thereto are possible so long as no technical inconsistency occurs.

In the following description, terms that designate directions or positions (e.g., "upper", "lower", "right", "left", and other terms including such terms) are sometimes used. Such terms are used for clear understanding of relative directions or positions in the drawings. So long as the relationship of relative directions or positions designated by terms such as "upper", "lower", etc., in the referred drawings is the same as in the referred drawings, corresponding components in drawings other than those in the present disclosure or products may not be arranged as in the referred drawings. In the description below, components that have substantially the same function are designated by the same reference numeral, and the description thereof may be omitted. To avoid excessively complicated drawings, some components may not be shown in the drawings. The size or positional relationship of components shown in the drawings may be exaggerated for ease of understanding. The sizes of components in a light-emitting device, or the relative sizes of the components in the light-emitting device may not be reflected in the drawings. In this specification, "parallel" and "vertical" (or "perpendicular") allows variations in the range of about ±5° from 0° and in the range of about ±5° from 90°, respectively, between two lines, sides or planes unless otherwise specified.

Exemplary Configuration of Light Emitting Device

Hereinafter, the configuration of a light emitting device 100 obtained by using a manufacturing method according to one embodiment of the present disclosure is described with reference to FIG. 1 to FIG. 5, FIG. 6A and FIG. 6B. For the sake of reference, x-axis, y-axis and z-axis, which are perpendicular to one another, are shown in each of FIG. 1 to FIG. 5, FIG. 6A and FIG. 6B. In the other drawings, x-axis, y-axis and z-axis may also be shown.

First, refer to FIG. 1. FIG. 1 is a schematic top view of the light emitting device 100. The light emitting device 100 includes an array 100a of a plurality of light emitting portions 100e that are two-dimensionally arranged. The light emitting portions 100e are arranged in a matrix including a plurality and rows and columns. The arrangement of the light emitting portions 100e in the array 100a is not limited to the matrix arrangement but may be any appropriate arrangement, e.g., a honeycomb arrangement. The light emitting portions 100e in the array 100a can be arranged such that, for example, the centers of the light emitting portions 100e are on the lattice points of a triangular lattice, a square lattice, a rectangular lattice, a rhombic lattice, or the like.

In the example illustrated in FIG. 1, the array 100a includes 8 light emitting portions 100e along each of the row and column directions, i.e., 64 light emitting portions 100e in total. In this specification, the "row direction" refers to a direction in which the rows of the plurality of light emitting portions 100e extend (in FIG. 1, the left-right direction in the sheet surface), and the "column direction" refers to a direction in which the columns of the plurality of light emitting portions 100e extend (in FIG. 1, the top-bottom direction in the sheet surface).

In this example, each of the light emitting portions 100e has a substantially square shape. The length of one side of the square shape can be approximately in the range of, for example, 15 μm or greater and 600 μm or less. In this example, the external shape of the light emitting device 100 is also a square shape. The size of one side of the square light emitting device 100 can be, for example, approximately 4.2 mm. The number and shape of the light emitting portions 100e in the array 100a can be appropriately selected. The shape of the light emitting device 100 may also be appropriately selected.

As schematically shown in FIG. 1, the light emitting device 100 includes a plurality of unit light emitting regions 100R, each of which includes a single light emitting portion 100e. The array 100a of the light emitting device 100 can be referred to as a repetition of the unit light emitting regions 100R. As will be specifically described below, the light emitting device 100 includes a two-dimensional array of a plurality of light emitting structures, each including an n-type semiconductor layer (i.e., first semiconductor layer) and a p-type semiconductor layer (i.e., second semiconductor layer). The light emitting portion 100e corresponds to a portion of each light emitting structure appearing at the surface of the light emitting device 100. That is, each unit light emitting region 100R includes a corresponding one of the plurality of light emitting structures. The shape and size of the unit light emitting regions in the array 100a may be the same among all of these regions. Alternatively, some of unit light emitting regions in the array 100a may have different shapes and/or different sizes.

In the configuration illustrated in FIG. 1, adjacent two of the light emitting portions 100e are separate from each other, and a part of a reflecting layer 130 is disposed between the two adjacent light emitting portions 100e. In FIG. 1, a part of the reflecting layer 130 is disposed between respective two adjacent light emitting portions 100e such that the reflecting layer 130 has a grid shape corresponding to the matrix arrangement of the light emitting portions 100e. The width W of the portion of the reflecting layer 130 between the two adjacent light emitting portions 100e can be approximately in the range of, for example, 10 µm or greater and 1200 µm or less.

With the arrangement of respective adjacent two of the light emitting portions 100e spaced from each other via the reflecting layer 130, leakage of light across the reflecting layer 130 can be prevented when, for example, one of adjoining two of the unit light emitting regions 100R is turned on and the other thereof is turned off. Therefore, a pattern such as a figure, a character, etc., formed by turned-on unit light emitting regions 100R, can be recognized more easily, so that this arrangement is advantageous. Hereinafter, in the light emitting device 100, a region in which the repetition of the unit light emitting regions 100R (which may also be referred to as "array 100a") is disposed may also be referred to as "display region Rr." The light emitting device 100 can also be used as a surface-emission light source by turning on all of the unit light emitting regions 100R in the display region Rr.

The light emitting device 100 can have a peripheral region Rp at an outside of the display region Rr including the plurality of unit light emitting regions 100R. In the configuration illustrated in FIG. 1, a plurality of terminal portions 100s and 100t for supplying electricity are disposed in the peripheral region Rp. In this example, in a top view, at an upper side of the display region Rr, 8 terminal portions 100s are arranged in a substantially straight line along the row direction of the plurality of light emitting portions 100e arranged in a matrix. On the right side of the display region Rr, in a top view, 8 terminal portions 100t are arranged in a substantially straight line along the column direction of the plurality of light emitting portions 100e. The arrangement of the terminal portions 100s and the arrangement of the terminal portions 100t are not limited to a straight line.

Figure 2:
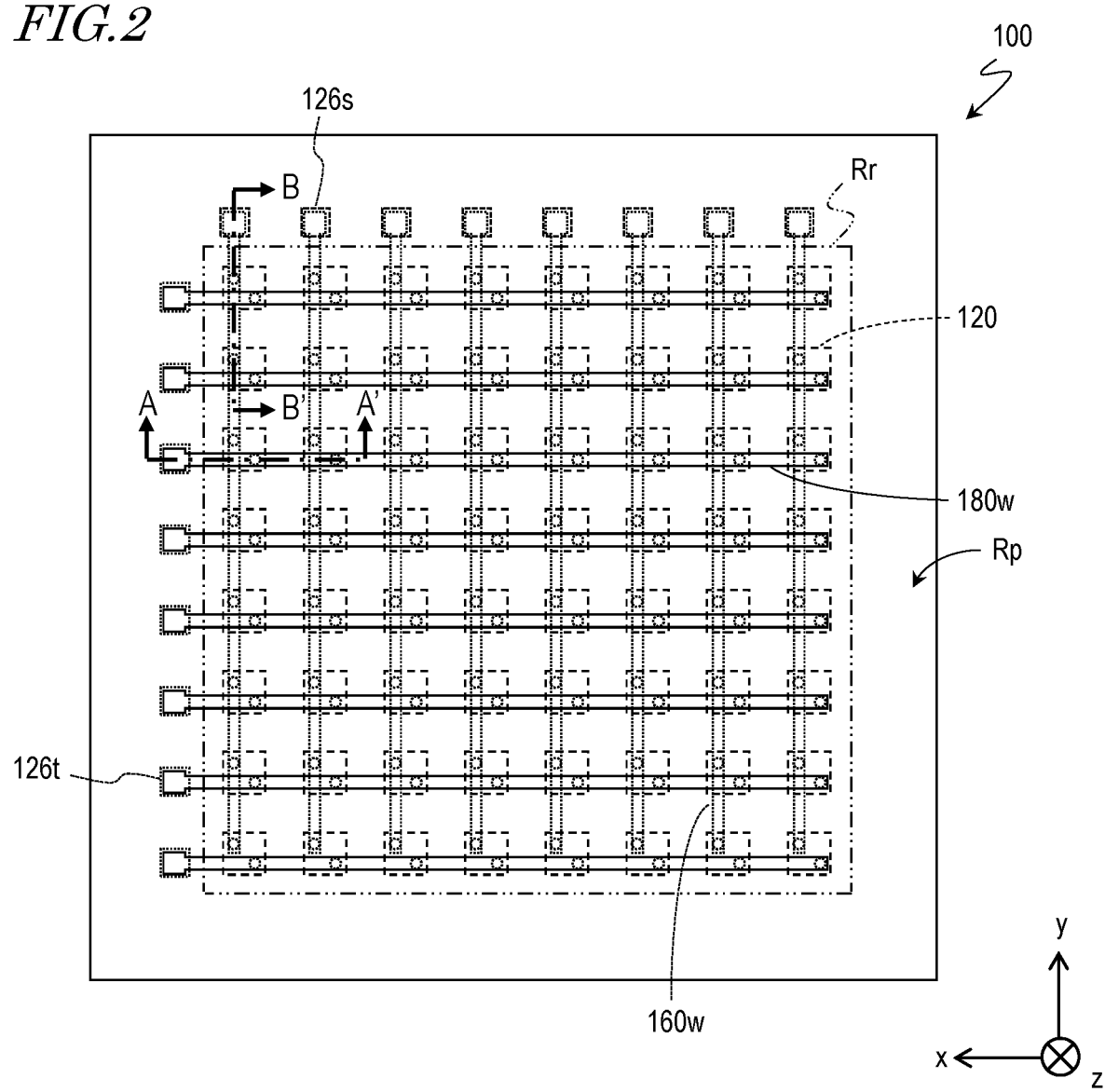
FIG. 2 is a schematic bottom view of the light emitting device shown in FIG. 1.

Refer to FIG. 2. FIG. 2 is a schematic bottom view of the light emitting device 100. As will be described below, the light emitting device 100 includes a light reflective resin layer at a bottom surface side. In FIG. 2, for the sake of convenience in description, the light reflective resin layer is omitted from the illustration of the configuration of the light emitting device 100.

As schematically shown in FIG. 2, corresponding to the matrix arrangement of 8 rows and 8 columns of the unit light emitting regions 100R, a plurality of light emitting structures 120 are arranged in a matrix of 8 rows and 8 columns in the display region Rr. The light emitting device 100 includes a plurality of first wirings 160w, each of which is arranged for a respective one of the columns of the plurality of light emitting structures 120, and a plurality of second wirings 180w, each of which is arranged for a respective one of the rows of the plurality of light emitting structures 120. Each of the first wirings 160w extends in the column direction of the matrix arrangement of the light emitting structures 120 and electrically connects a column of 8 light emitting structures 120 aligned in the column direction together. As will be described below in detail, each of the first wirings 160w is electrically connected with the p-type semiconductor layer of each of a plurality of rows of light emitting structures 120 aligned in the column direction. The first wirings 160w may also be referred to as "p-side wirings." Meanwhile, each of the second wirings 180w extends in the row direction of the matrix arrangement of the light emitting structures 120 and electrically connects together the n-type semiconductor layers of a row of light emitting structures 120 aligned in the row direction. The second wirings 180w may also be referred to as "n-side wirings."

In this example, one end of each of the first wirings 160w extends to reach the position of the terminal portion 100s provided in the peripheral region Rp (see FIG. 1). At the positions of the terminal portions 100s, first island portions 126s are provided. One end of each of the first wirings 160w overlaps a corresponding one of these first island portions 126s. Similarly, in this example, one end portion of each of the second wirings 180w is located at the position of the terminal portion 100t provided in the peripheral region Rp (see FIG. 1). One end of each of the second wirings 180w overlaps a second island portion 126t provided at the position of a corresponding terminal portion 100t.

As will be described later, each of the first wirings 160w and each of the second wirings 180w are electrically separated from each other by an insulating layer interposed therebetween. Specifically, FIG. 2 illustrates a configuration of wirings that allows so-called passive matrix driving. According to such a structure of wirings, some of the light emitting structures 120 in the array 100a can be selected to supply an electric current. Therefore, light can be selectively emitted from some of the light emitting portions 100e in the display region Rr.

Figure 3:
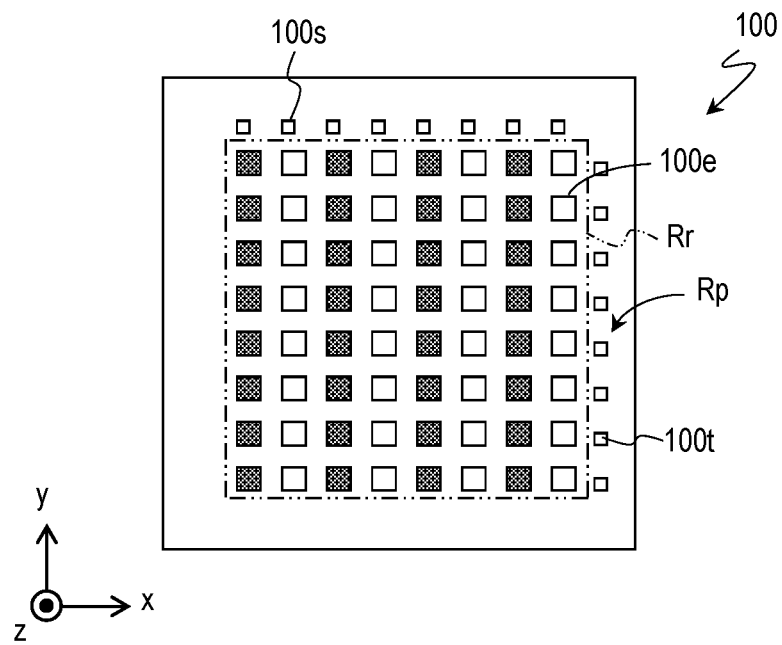
FIG. 3 is a top view showing an example of the pattern of light emission in the light emitting device.
Figure 4:
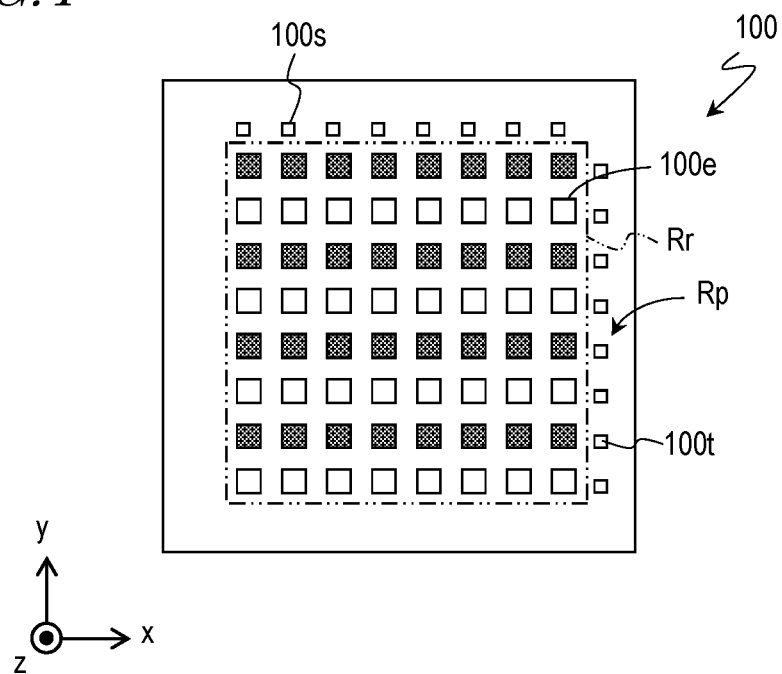
FIG. 4 is a top view showing another example of the pattern of light emission in the light emitting device.
Figure 5:
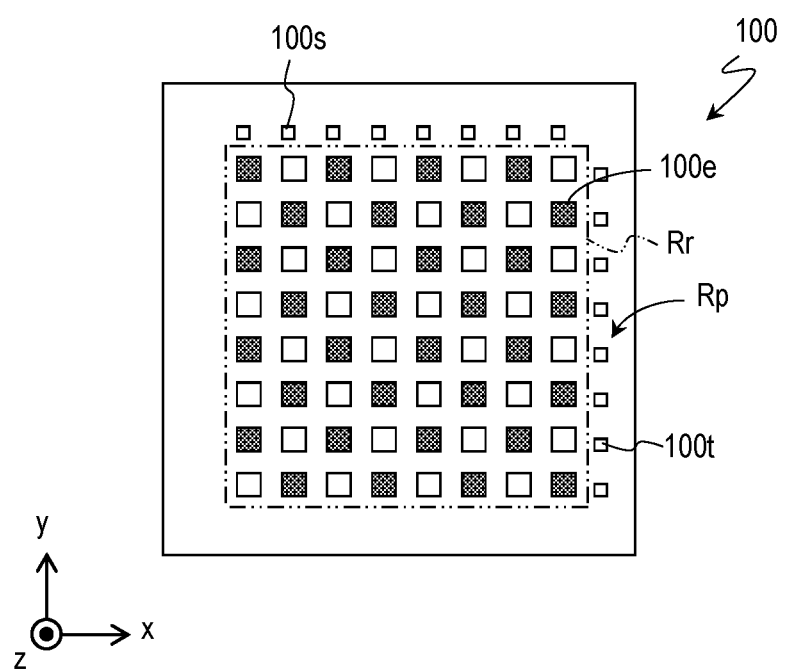
FIG. 5 is a top view showing still another example of the pattern of light emission in the light emitting device.

FIG. 3 and FIG. 4 show examples of the pattern of light emission in the light emitting device 100. In FIG. 3 and FIG. 4, hatching in a rectangle, which represents a light emitting portion 100e, indicates that the light emitting portion 100e is in OFF state. With dummy light emitting structures, which would not emit light, intermingled in the array 100a, light emission pattern such as shown in, for example, FIG. 5 can be realized.

The manner of wiring in the light emitting device 100 is not limited to a configuration such as shown in FIG. 2, which is adapted to a passive matrix driving, and a different wiring pattern can be employed. In the example described with reference to FIG. 2, each of the first wirings 160w and the second wirings 180w has a linear shape. However, the shape of each of the first and second wirings is not limited to a linear shape. For example, either or both of the first wirings 160w and the second wirings 180w may include a bent portion, a fork portion, etc.

Figure 6A:
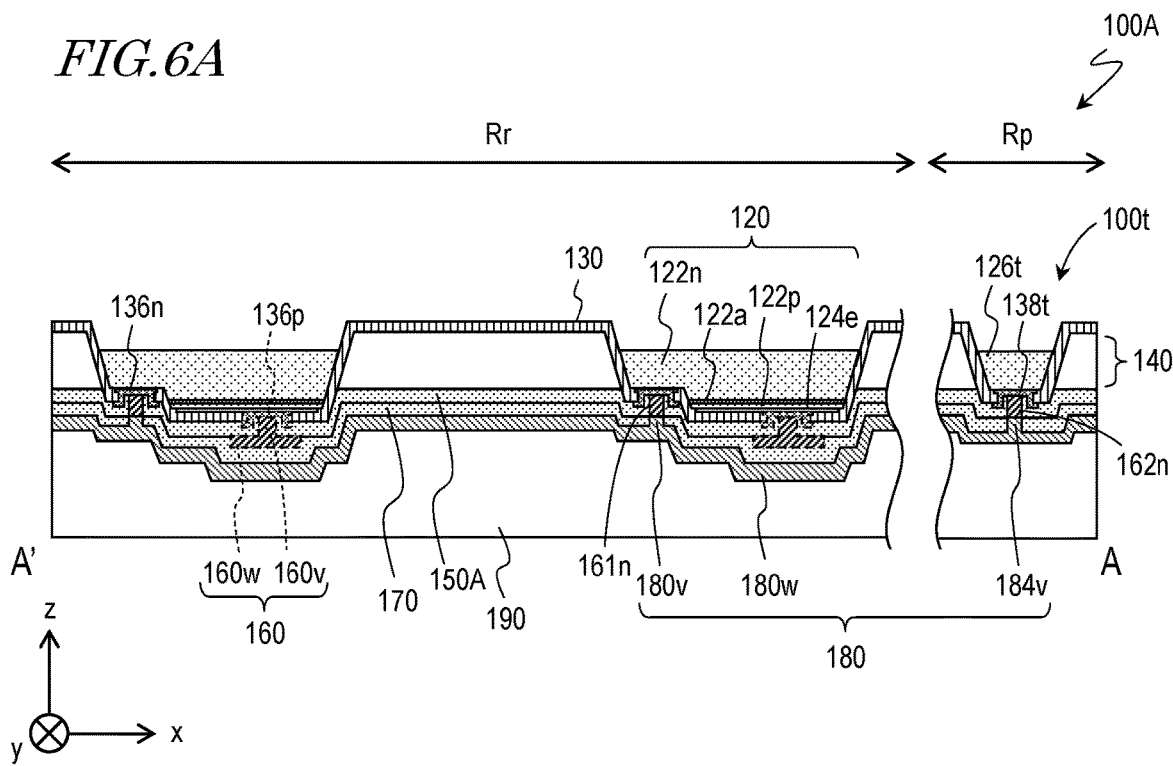
FIG. 6A is a diagram schematically showing an example of a cross section taken along line A-A' of FIG. 2.
Figure 6B:
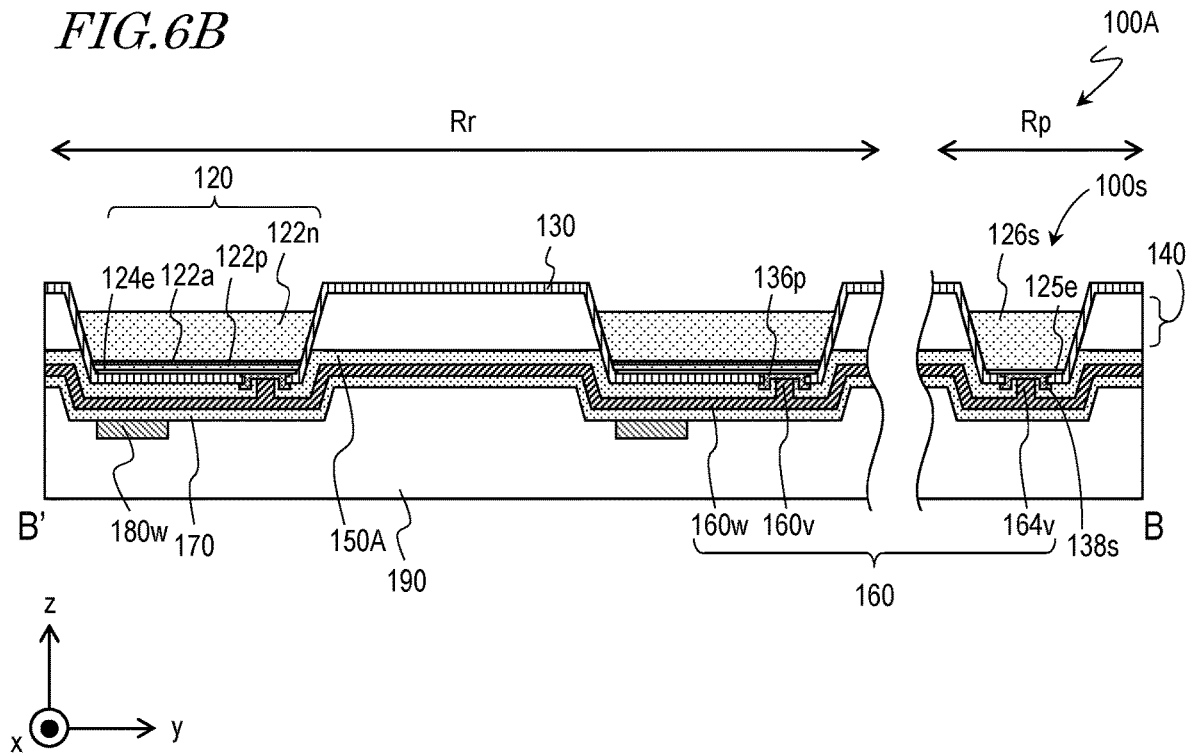
FIG. 6B is a diagram schematically showing an example of a cross section taken along line B-B' of FIG. 2.

Next, further details of the configuration of the light emitting device 100 is described with reference to FIG. 6A and FIG. 6B. A light emitting device 100A shown in FIG. 6A and FIG. 6B is an example of the above-described light emitting device 100. FIG. 6A schematically shows a cross section of the light emitting device 100A taken along line A-A' of FIG. 2. FIG. 6B schematically shows a cross section of the light emitting device 100A taken along line B-B' of FIG. 2. As shown in FIG. 6A and FIG. 6B, the light emitting device 100A includes a light reflective resin layer 190, a plurality of light emitting structures 120 supported by the light reflective resin layer 190, and a reflecting layer 130 covering a lateral portion and a bottom portion of the light emitting structures 120. In this example, a portion of the resin layer 140 is present between respective adjacent two of the light emitting structures 120.

First, the description is focused on the display region Rr. As shown in FIG. 6A, each of the light emitting structures 120 includes an n-type semiconductor layer 122n, a p-type semiconductor layer 122p, an active layer 122a between the n-type semiconductor layer 122n and the p-type semiconductor layer 122p, and an electrode layer 124e covering the substantially an entire upper surface of the p-type semiconductor layer 122p. The n-type semiconductor layer 122n is connected with an n-side electrode 136n. The p-type semiconductor layer 122p is connected with the p-side electrode 136p via the electrode layer 124e. The n-side electrode 136n and the p-side electrode 136p penetrate through the reflecting layer 130.

For each of the light emitting structures 120, a structure configured to emit light of a desired wavelength can be selected. For example, the n-type semiconductor layer 122n, the p-type semiconductor layer 122p and the active layer 122a, are formed using nitride semiconductors ($In_xAl_yGa_{1-x-y}N$, $0 \leq x$, $0 \leq y$, $x+y \leq 1$), which allows for obtaining a light emitting structure configured to emit blue light or green light. Forming a light emitting structure that includes a semiconductor such as GaAlAs, AlInGaP, GaAsP, GaP allows for obtaining red light. Hereinafter, a case where all of the light emitting structures 120 are configured to emit blue light will be described, but a plurality of types of light emitting structures which are configured to emit light of different colors may be included. For example, the light emitting device may include three types of light emitting structures 120 configured to emit red light, blue light and green light.

Alternatively, wavelength conversion layers may be formed so as to overlap the plurality of light emitting portions 100e of the array 100a. The wavelength conversion layer is, for example, a layer in which phosphor particles are dispersed in a resin. For example, all of the light emitting structures 120 included in the array 100a may be light emitting structures configured to emit blue light, a wavelength conversion layer including a phosphor configured to convert blue light to green light may be disposed over each of some of the light emitting portions 100e, and a wavelength conversion layer including a phosphor configured to convert blue light to red light may be disposed over each of some of the others of the light emitting portions 100e. Such a configuration also enables RGB color display. Known materials can be used for the phosphors. Examples of the phosphor adapted to convert blue light to green light include β-SiAlON phosphor. Examples of the phosphor adapted to convert blue light to red light include a KSF phosphor and CASN. For the phosphor as a wavelength conversion member, a quantum dot phosphor may be used.

The reflecting layer 130 substantially covers the lateral portion and the bottom portion of each of the light emitting structures 120 and is adapted to reflect a portion of the light emitted from the light emitting structures 120 traveling to the lateral portion or the bottom portion of the light emitting structures 120, in a direction away from the bottom portion (herein, positive z-direction). The reflecting layer 130 includes, for example, a single-layered or multilayer metal film or a multilayer dielectric film including two or more types of dielectric films In view of light utilization efficiency, using the multilayer dielectric film for the reflecting layer 130 is advantageous because the multilayer dielectric allows for reducing absorption as compared with the metal film The multilayer dielectric film used as the reflecting layer 130 includes, for example, two or more films selected from the group consisting of $SiO_2$ film, $TiO_2$ film and $Nb_2O_5$ film The reflecting layer 130 may contain $Al_2O_3$. In the case where the metal film is used as the reflecting layer 130, Ti, Al, or Ag, for example, can be used as a material of the reflecting layer 130.

In the configuration illustrated in FIG. 6A and FIG. 6B, a light reflective resin layer 190 is further disposed at a bottom portion side of the light emitting structures 120 (also may be referred to as the bottom surface side of the light emitting device 100A). The light reflective resin layer 190 is, for example, a resin layer in which a light reflective filler is dispersed. The light reflective resin layer 190 has the function of reflecting light traveling downward in a direction away from the bottom portion as does the reflecting layer 130. The reflectance of the light reflective resin layer 190 for light emitted from the light emitting structures 120 is, for example, 60% or more. The reflectance of the light reflective resin layer 190 for light emitted from the light emitting structures 120 may be 70% or more, 80% or more, or 90% or more, and can be appropriately selected.

Between the resin layer 140 and the light reflective resin layer 190, a first insulating layer 150A, a p-side wiring layer 160, a second insulating layer 170 and an a-side wiring layer 180 are disposed. The first insulating layer 150A is disposed between the resin layer 140 and the p-side wiring layer 160. Meanwhile, the second insulating layer 170 is disposed between the p-side wiring layer 160 and the n-side wiring layer 180 and electrically separates these layers from each other.

Each of the p-side wiring layers 160 includes the above-described first wiring 160w and a plurality of vias 160v, each of which has an end connected with a respective one of the first wirings 160w. Each of the vias 160v is provided for the p-type semiconductor layer 122p of a respective one of the light emitting structures 120. The other end of each of the vias 160v is connected with a respective one of the p-side electrodes 136p electrically connected with the p-type semiconductor layer 122p. As seen from FIG. 6B, each of the first wirings 160w electrically connects the p-type semiconductor layers 122p of a column of light emitting structures 120 together aligned in the column direction through the vias 160v.

Each of the first wiring 160w extends to the terminal portion 100s of the same column. As shown in the right part of FIG. 6B, in this example, the first island portion 126s is disposed at the position of each of the terminal portions 100s. As illustrated in the drawings, an electrode layer 125e and an electrode 138s are disposed on each of the first island portions 126s. In the configuration illustrated in FIG. 6B, the electrode layer 125e is disposed between each of the first island portions 126s and the electrode 138s, although formation of the electrode layer 125e is not indispensable.

Each of the above-described first wirings 160w extends to a position at which at least a portion of the first wiring 160w overlaps a respective one of the first island portions 126s. In the configuration illustrated in FIG. 6B, the p-side wiring layer 160 further includes a via 164v through which the first wiring 160w and the electrode 138s are electrically connected with each other. As will be described below, each of the first island portions 126s may be a structure formed by deposition of a semiconductor material. Each of the first island portions 126s can be electrically connected with the p-type semiconductor layers 122p of a plurality of light emitting structures 120 of the corresponding column by a respective one of the first wirings 160w.

Refer again to FIG. 6A. The n-side wiring layer 180 includes the above-described second wirings 180w and a plurality of vias 180v, each of which has one end connected with the second wirings 180w. Each of the vias 180v is provided for the n-type semiconductor layer 122n of a respective one of the light emitting structures 120. As schematically shown in FIG. 6A, a first electrically-conductive structure 161n is disposed between the via 180v and the n-side electrode 136n on the n-type semiconductor layer 122n. The first electrically-conductive structure 161n electrically connects the via 180v and the n-side electrode 136n with each other. As will be described below with reference to the drawings, the first electrically-conductive structure 161n is formed together with the first wiring 160w, the via 160v and the via 164v in the step of forming the p-side wiring layer 160. Therefore, the first electrically-conductive structure 161n is a portion of the p-side wiring layer 160. Through the vias 180v, the first electrically-conductive structures 161n and the n-side electrodes 136n, each of the second wirings 180w electrically connects the n-type semiconductor layers 122n of a row of the plurality of light emitting structures 120 aligned in the row direction together.

The description is focused on the peripheral region Rp. Each of the second wirings 180w extends to a terminal portion 100t of the same row. At least a part of each of the second wirings 180w overlaps a respective one of second island portions 126t, each of which is disposed at a respective one of the terminal portions 100t. The second island portion 126t may be a structure formed by, for example, deposition of a semiconductor material as in the first island portion 126s.

In the configuration illustrated in FIG. 6A, on each of the second island portions 126t, an electrode 138t is disposed, and a second electrically-conductive structure 162n is connected to the electrode 138t. The second electrically-conductive structure 162n is formed together with the first wiring 160w, the via 160v and the via 164v in the step of forming the p-side wiring layer 160 similarly to the first electrically-conductive structure 161n.

As shown in FIG. 6A, the n-side wiring layer 180 further includes a via 184v for electrically connecting the second wiring 180w and the second electrically-conductive structure 162n with each other. Each of the second island portions 126t can be electrically connected with the n-type semiconductor layers 122n of respective ones of light emitting structures 120 of the same row by a respective one of the second wirings 180w.

The p-side wiring layer 160 and the n-side wiring layer 180 can be formed by depositing a metal material and then patterning a metal film formed by the deposition. The first wirings 160w in the p-side wiring layer 160 and the second wirings 180w in the n-side wiring layer 180 can respectively have a multilayer structure that includes a plurality of metal layers (e.g., a multilayer structure of Ti/Rh/Au/Ti). The first wirings 160w and the second wirings 180w do not need to have the same configuration.

By applying a voltage between a first island portion 126s and a second island portion 126t, an electric current can be selectively supplied to a light emitting structure 120 at which one of the plurality of first wirings 160w electrically connected with the first island portion 126s to which the voltage is applied and one of the plurality of second wirings 180w electrically connected with the second island portion 126t to which the voltage is applied intersect. That is, by selectively supplying an electric current to a desired one of the light emitting structures 120 in the array 100a, light can be emitted from the light emitting structure 120.

First Example of Method of Manufacturing Light Emitting Device

Hereinafter, an exemplary manufacturing method of the light emitting device 100A is described.

Figure 7:
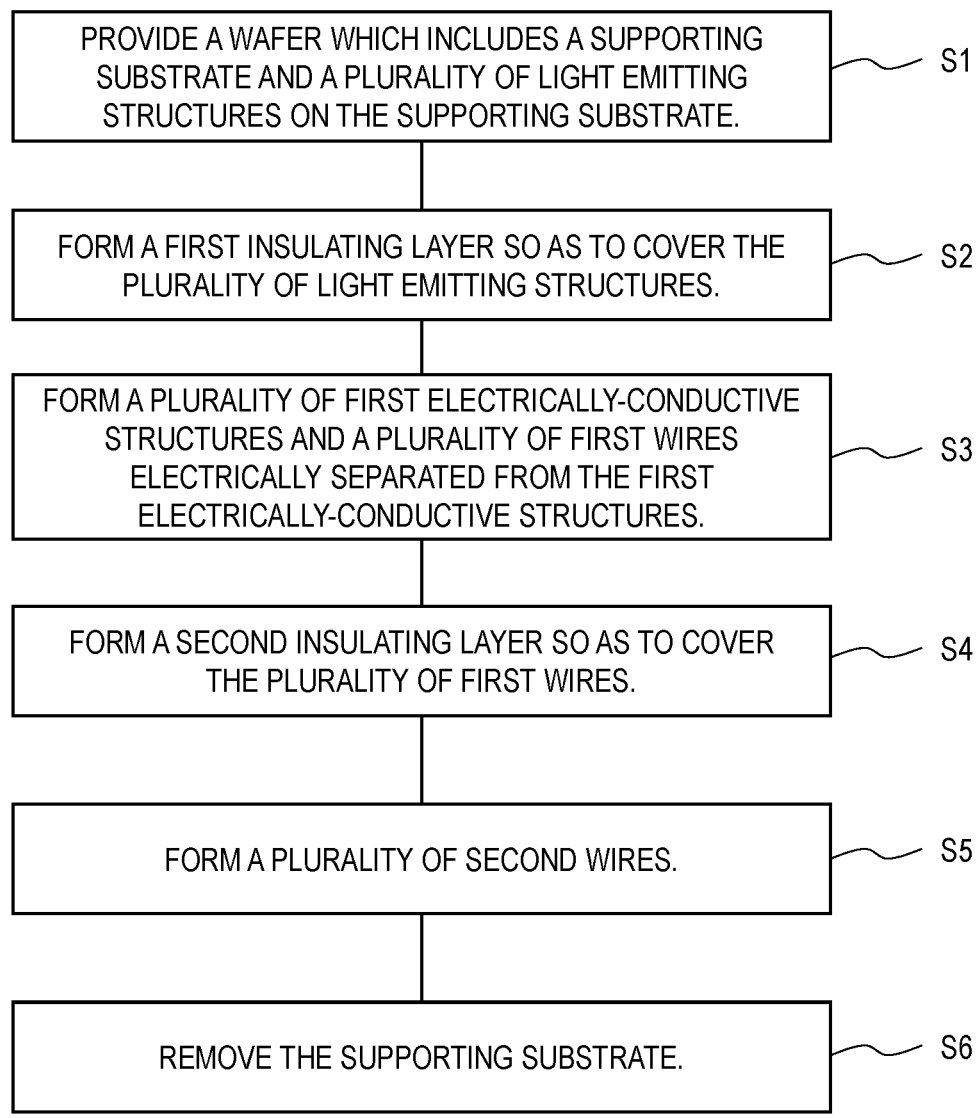
FIG. 7 is a flowchart illustrating the outline of a method of manufacturing a light emitting device of one embodiment of the present disclosure.

FIG. 7 illustrates the outline of a method of manufacturing a light emitting device according to a first embodiment of the present disclosure. The method of manufacturing the light emitting device illustrated in FIG. 7 generally includes providing a wafer that includes a supporting substrate and a plurality of light emitting structures on the supporting substrate (step S1), forming a first insulating layer so as to cover the plurality of light emitting structures (step S2), forming a plurality of first electrically-conductive structures and a plurality of first wirings electrically separated from the first electrically-conductive structures (step S3), forming a second insulating layer so as to cover the plurality of first wirings (step S4), and forming a plurality of second wirings (step S5). The method may further include removing the supporting substrate (step S6). Hereinafter, details of the respective steps are described with reference to FIG. 8A to FIG. 18B. Of FIG. 8A to FIG. 18B, each of FIG. 8A, FIG. 9A, FIG. 10A, FIG. 11A, FIG. 12A, FIG. 13A, FIG. 14A, FIG. 15A, FIG. 16A, FIG. 17A and FIG. 18A schematically shows a cross section taken along line A-A' of FIG. 2. Each of FIG. 8B, FIG. 9B, FIG. 10B, FIG. 11B, FIG. 12B, FIG. 13B, FIG. 14B, FIG. 15B, FIG. 16B, FIG. 17B and FIG. 18B schematically shows a cross section taken along line B-B' of FIG. 2.

Figure 8A:
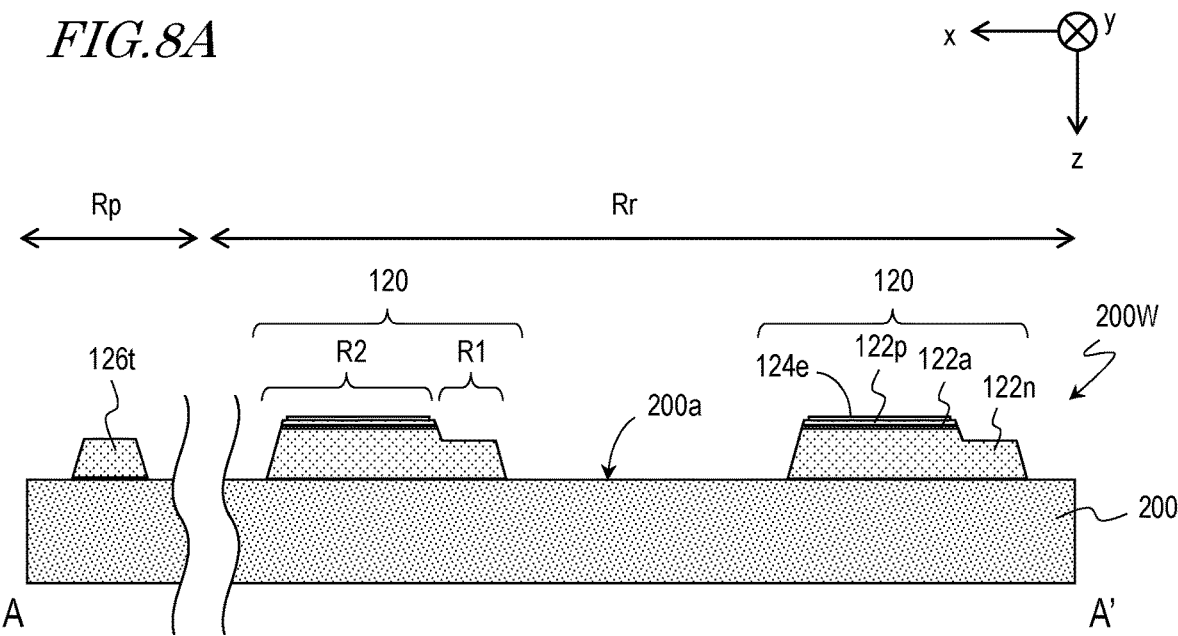
FIG. 8A is a schematic cross-sectional view for description of a method of manufacturing a light emitting device of one embodiment of the present disclosure.
Figure 8B:
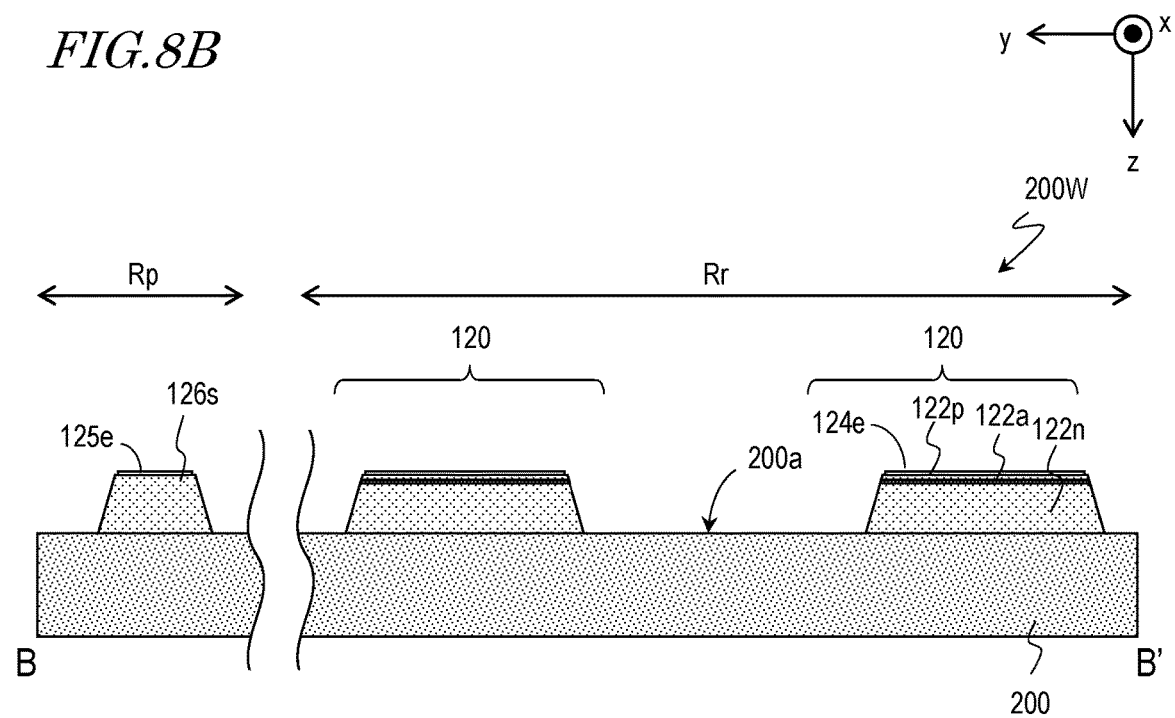
FIG. 8B is a schematic cross-sectional view for description of a method of manufacturing a light emitting device of one embodiment of the present disclosure.

As shown in FIG. 8A and FIG. 8B, a wafer that includes a plurality of light emitting structures 120 is provided (step S1 of FIG. 7). The wafer 200W shown in FIG. 8A and FIG. 8B includes a supporting substrate 200. The plurality of light emitting structures 120 are disposed on a surface 200a of the supporting substrate 200. The plurality of light emitting structures 120 are two-dimensionally arranged on the surface 200a along the first direction and the second direction that is different from the first direction. In the example described herein, directions that are perpendicular to each other are selected as the first direction and the second direction. Specifically, herein, the plurality of light emitting structures 120 are arranged in rows and columns on the surface 200a. For example, the first direction is the row direction of the matrix arrangement, and the second direction is the column direction of the matrix arrangement.

As previously described with reference to FIG. 6A and FIG. 6B, each of the light emitting structures 120 includes the n-type semiconductor layer 122n and the p-type semiconductor layer 122p. The n-type semiconductor layer 122n and the p-type semiconductor layer 122p can be formed by epitaxially growing a semiconductor layer on a principal surface of the supporting substrate 200. The supporting substrate 200 may be a substrate on which a semiconductor layer can be grown and from which the light emitting structures 120 can be removed. For example, a Si substrate, a sapphire substrate, a GaN substrate, a SiC substrate and a GaAs substrate can be used. In the example described herein, a Si substrate is used.

By deposition of a semiconductor material (herein, nitride semiconductor) on the surface 200a of the supporting substrate 200, a semiconductor multilayer structure that includes an n-type semiconductor layer, an active layer and a p-type semiconductor layer is formed on the surface 200a. Further, an electrode material (ITO, Ag, etc.) is deposited on the p-type semiconductor layer. Then, the semiconductor multilayer structure and the film of the electrode material are patterned by etching so that the plurality of light emitting structures 120 in the form of islands are formed on the surface 200a of the supporting substrate 200. At this time, the active layer, the p-type semiconductor layer and the film of the electrode material are patterned such that a portion of the n-type semiconductor layer 122n is exposed. As shown in FIG. 8A, the n-type semiconductor layer 122n includes a first region R1, which is not covered with the p-type semiconductor layer 122p, and a second region R2, which is covered with the p-type semiconductor layer 122p.

The patterning is performed such that 64 light emitting structures 120 in total remain in the form of a matrix on the surface 200a of the supporting substrate 200. At this time, together with formation of the light emitting structures 120, a plurality of first island portions 126s and a plurality of the second island portions 126t may be formed in a part of the peripheral region Rp, in which terminal portions are to be provided. For example, a semiconductor layer is grown on the entirety of the surface 200a of the supporting substrate 200, and thereafter, a portion of the semiconductor layer except for regions in which the light emitting structures 120, the first island portions 126s and the second island portions 126t are to be provided is removed from the supporting substrate 200. Accordingly, for example, at an outside of the region in which the light emitting structures 120 are to be formed, a plurality of first island portions 126s can be formed along the first direction (herein, the row direction of the matrix arrangement of the light emitting structures 120) and a plurality of second island portions 126t can be formed along the second direction (herein, the column direction of the matrix arrangement of the light emitting structures 120). In the example described herein, the patterning is performed such that the electrode material remains on the first island portions 126s, so that the electrode layer 125e is formed on the first island portions 126s.

Using the same material for formation of the first island portions 126s and the second island portions 126t and formation of the n-type semiconductor layer 122n, the active layer 122a and the p-type semiconductor layer 122p of the light emitting structures 120 allows for forming the first island portions 126s and/or the second island portions 126t during forming of the light emitting structures 120. The conductivity types of the first island portions 126s and the second island portions 126t may be n-type or may be p-type. The conductivity type of each of the first island portions 126s and that of each of the second island portions 126t do not need to be the same.

Figure 9A:
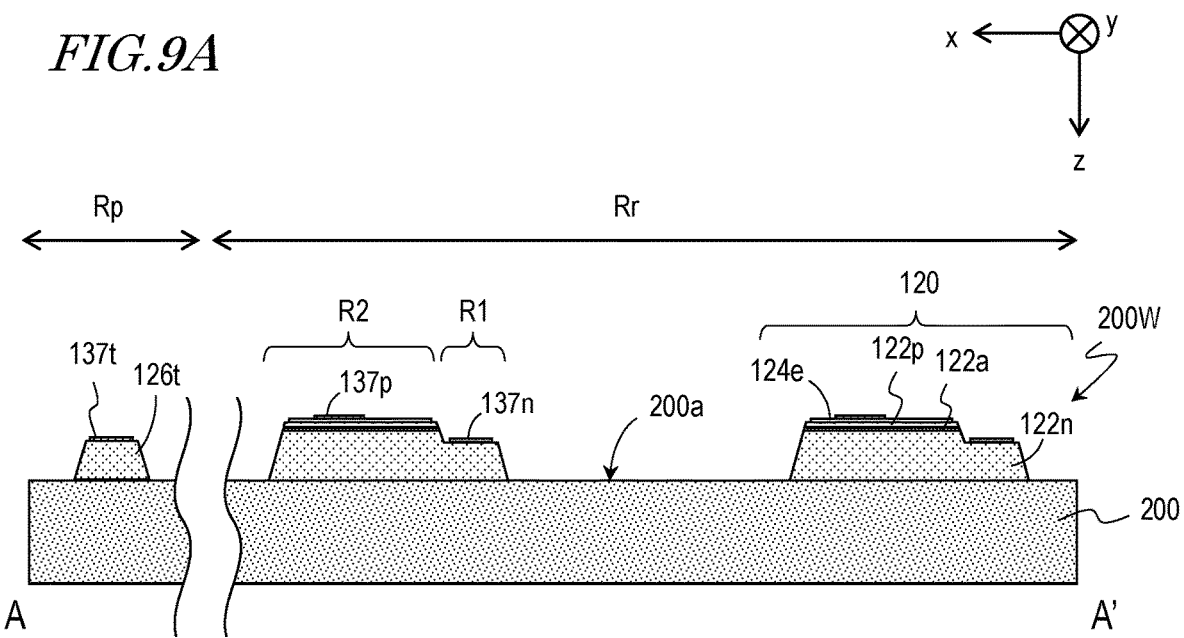
FIG. 9A is a schematic cross-sectional view for description of a method of manufacturing a light emitting device of one embodiment of the present disclosure.
Figure 9B:
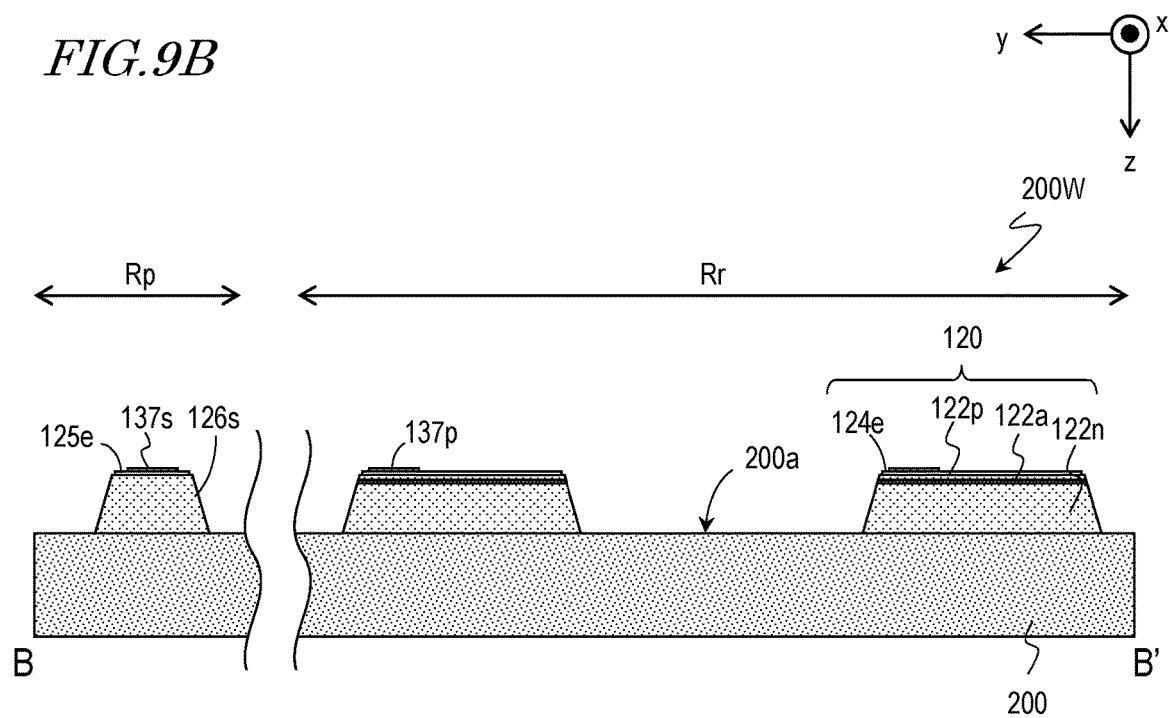
FIG. 9B is a schematic cross-sectional view for description of a method of manufacturing a light emitting device of one embodiment of the present disclosure.

Then, as shown in FIG. 9A and FIG. 9B, barrier layers 137n and 137p are respectively formed on a region of the n-type semiconductor layer 122n in which a contact is to be formed and a region of the p-type semiconductor layer 122p in which a contact is to be formed. The barrier layers 137s and 137t are respectively formed on the electrode layer 125e, which is disposed on each of the first island portions 126s, and on the second island portions 126t, respectively. For the barrier layers 137n, 137p, 137s and 137t, a material that can function as a etching stop in later steps can be selected. Such barrier layers 137n, 137p, 137s and 137t can be formed by, for example, sequentially depositing Ti and Rh and patterning the deposits.

Figure 10A:
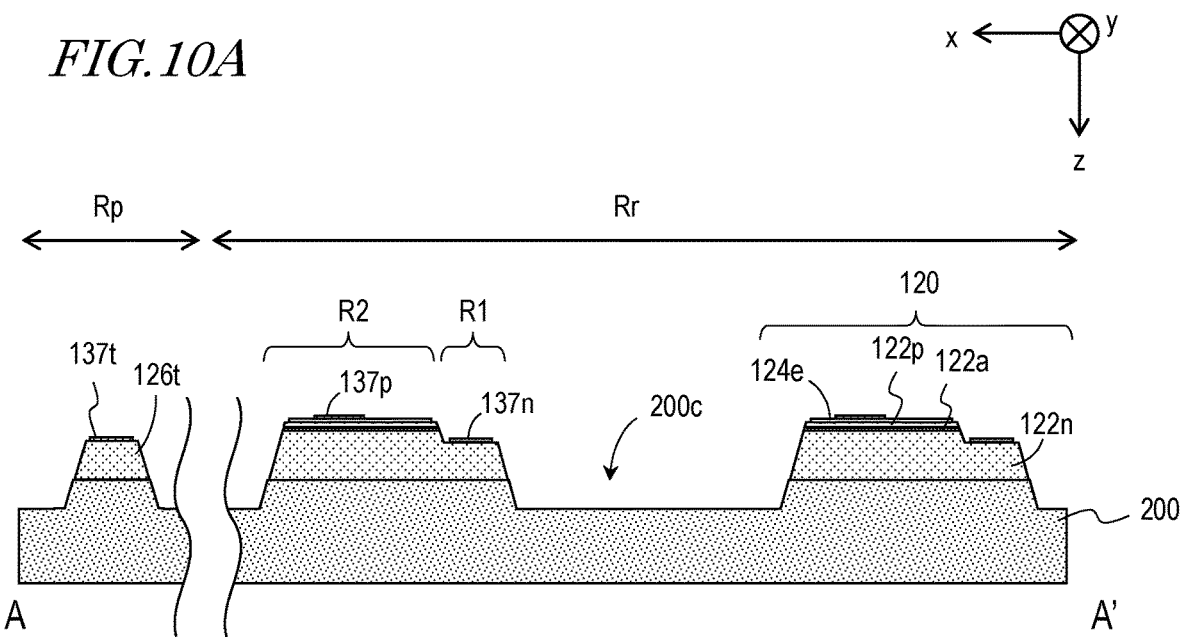
FIG. 10A is a schematic cross-sectional view for description of a method of manufacturing a light emitting device of one embodiment of the present disclosure.
Figure 10B:
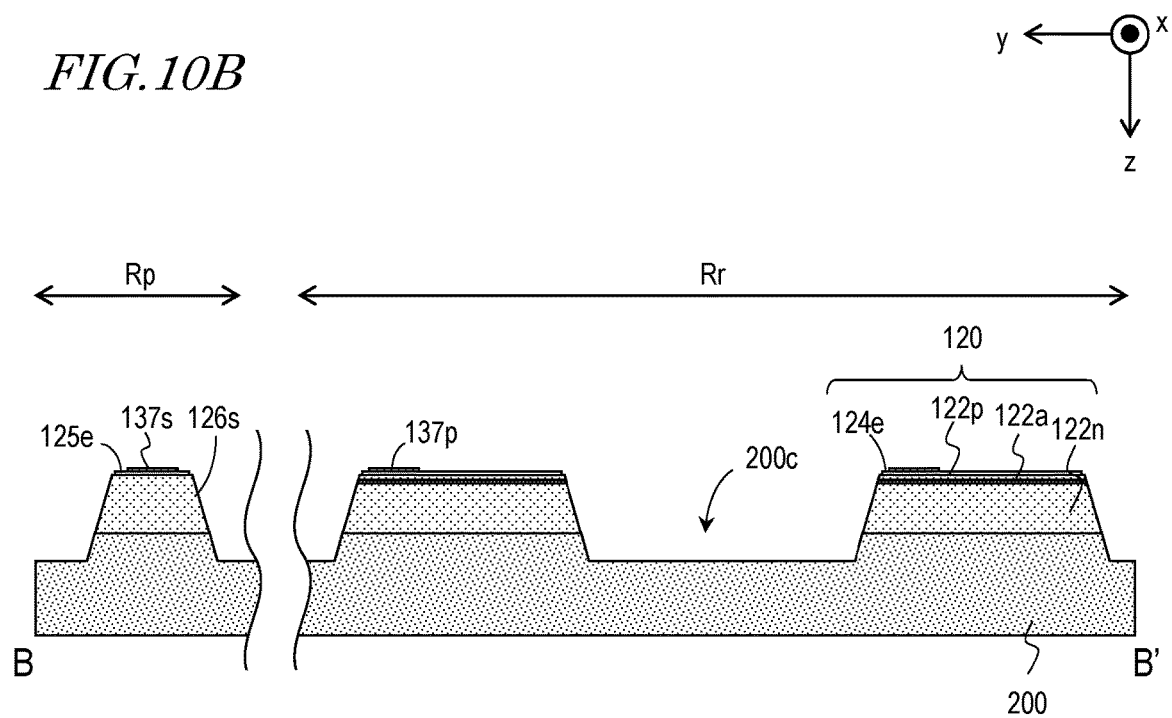
FIG. 10B is a schematic cross-sectional view for description of a method of manufacturing a light emitting device of one embodiment of the present disclosure.

Then, a portion of the supporting substrate 200 not covered with the light emitting structures 120, the first island portions 126s or the second island portions 126t is removed by, for example, etching. By etching of the supporting substrate 200 from the surface 200a side, a recess 200c is formed in the supporting substrate 200 as shown in FIG. 10A and FIG. 10B.

Figure 11A:
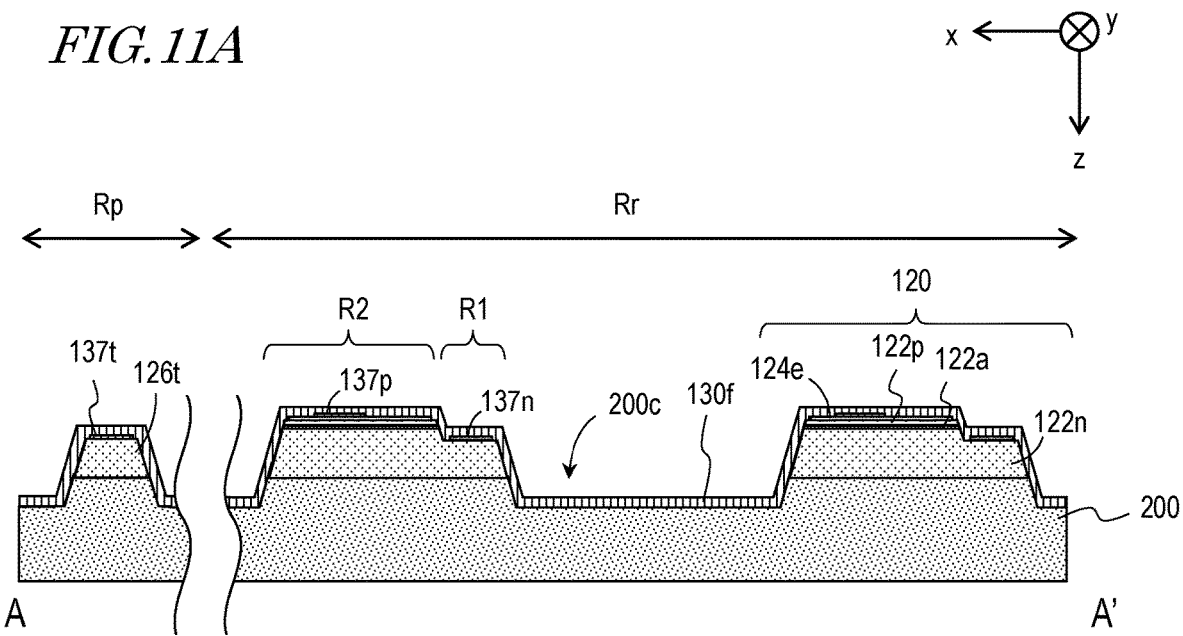
FIG. 11A is a schematic cross-sectional view for description of a method of manufacturing a light emitting device of one embodiment of the present disclosure.
Figure 11B:
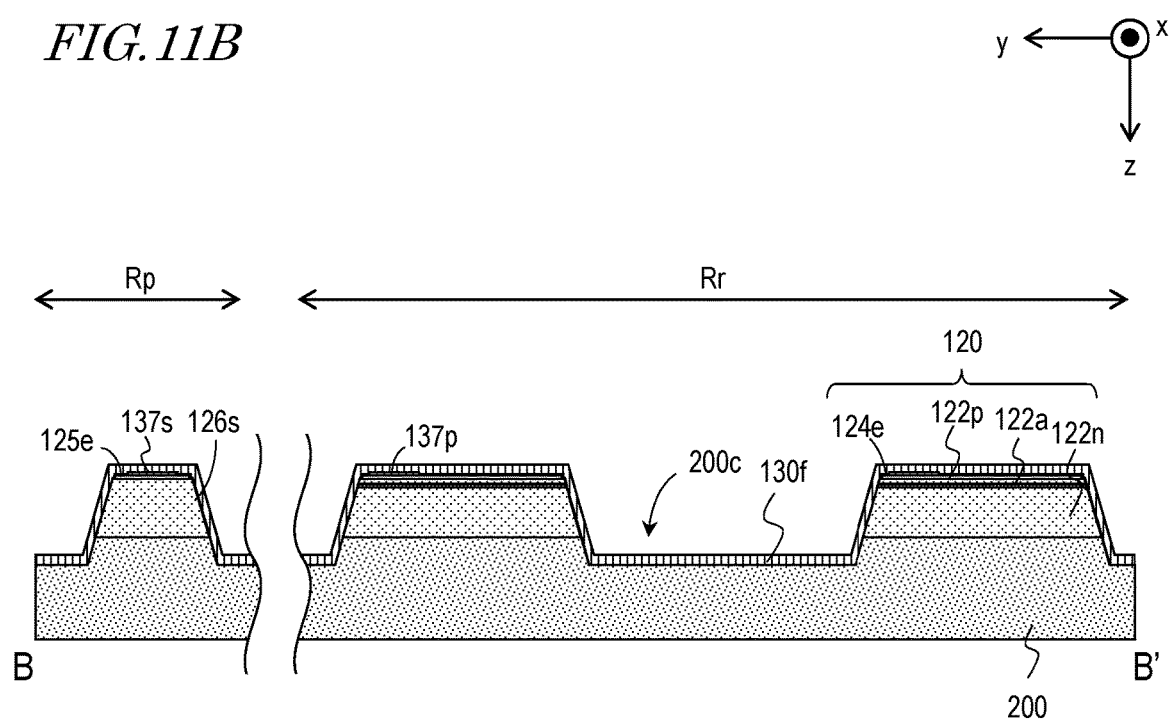
FIG. 11B is a schematic cross-sectional view for description of a method of manufacturing a light emitting device of one embodiment of the present disclosure.
Figure 12A:
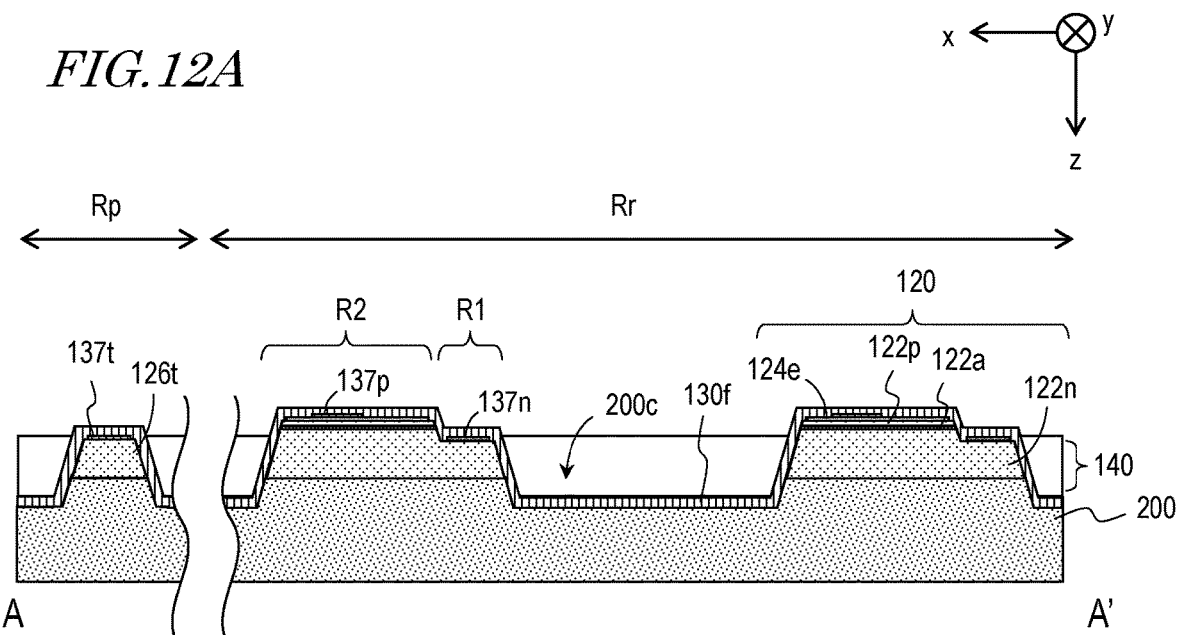
FIG. 12A is a schematic cross-sectional view for description of a method of manufacturing a light emitting device of one embodiment of the present disclosure.
Figure 12B:
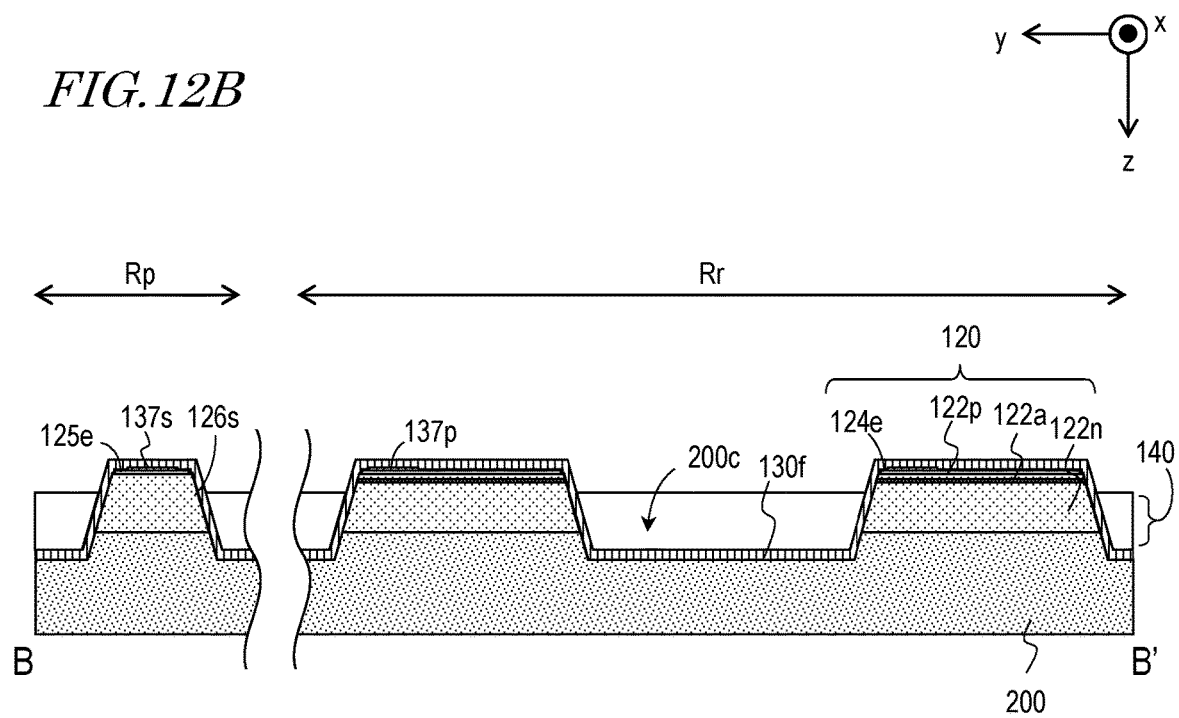
FIG. 12B is a schematic cross-sectional view for description of a method of manufacturing a light emitting device of one embodiment of the present disclosure.

Then, a reflecting film is formed so as to cover the entire surface of the supporting substrate 200. For example, formation of a multilayer film consisting of a $SiO_2$ film and a $Nb_2O_5$ film is repeated three times, so that a reflecting film 130f covering each of the light emitting structures 120 is formed as shown in FIG. 11A and FIG. 11B. Thereafter, a portion of a region overlying the reflecting film 130f that is at the position of the recess 200c of the supporting substrate 200 is filled with an uncured resin composition, and then, the resin composition is cured, so that the resin layer 140 is formed (see FIG. 12A and FIG. 12B).

The resin layer 140 is, for example, a light reflective resin layer in which a light reflective filler is dispersed. The reflectance of the resin layer 140 for light emitted from the light emitting structures 120 is, for example, 60% or more. Forming a light reflective resin layer as the resin layer with use of 140 a resin composition in which a light reflective filler is dispersed allows for reducing leakage of light emitted from the light emitting structures 120 in a lateral direction. The reflectance of the resin layer 140 for light emitted from the light emitting structures 120 may 70% or more, 80% or more, or 90% or more, and can be appropriately selected.

Examples of the resin material in which the light reflective filler is to be dispersed include a silicone resin and an epoxy resin. For the light reflective filler, metal particles or inorganic or organic particles having a higher refractive index than the resin material in which the light reflective filler is to be dispersed.

Figure 13A:
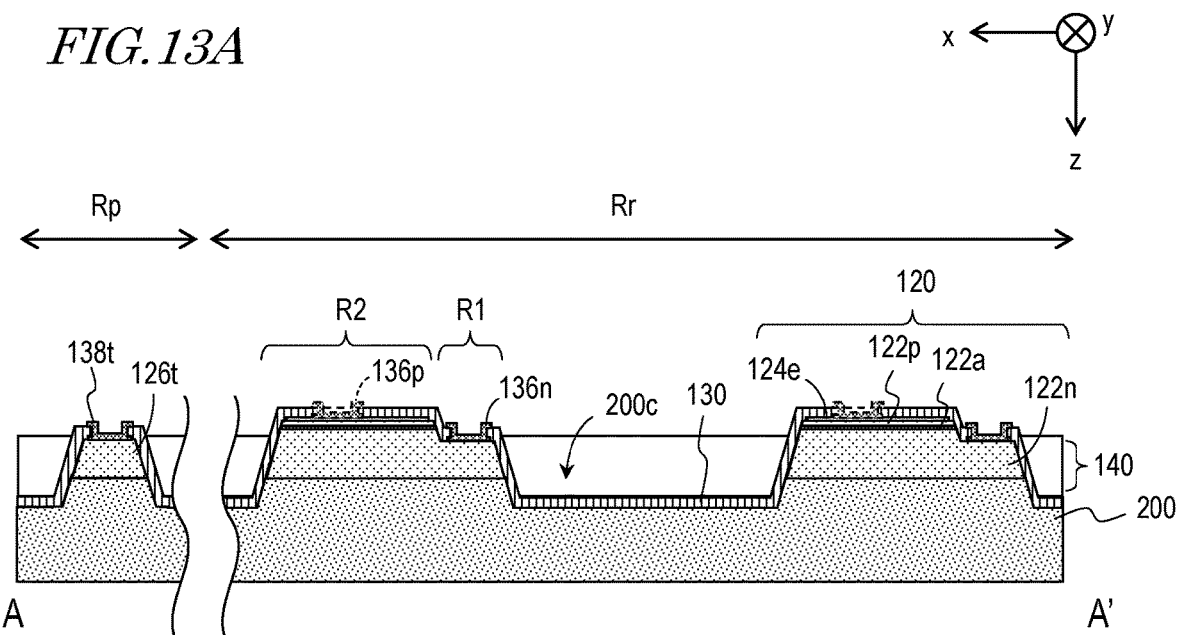
FIG. 13A is a schematic cross-sectional view for description of a method of manufacturing a light emitting device of one embodiment of the present disclosure.
Figure 13B:
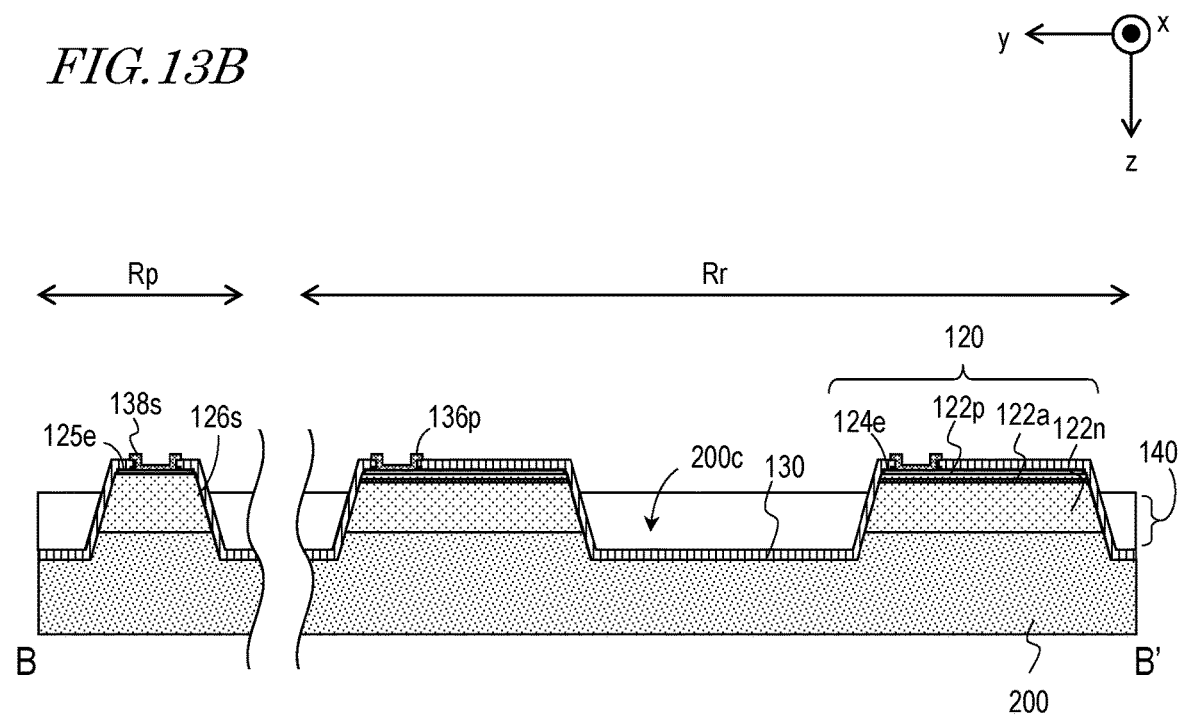
FIG. 13B is a schematic cross-sectional view for description of a method of manufacturing a light emitting device of one embodiment of the present disclosure.

Then, through-holes are formed by, for example, reactive ion etching (RIE) in a portion of the reflecting film 130f under which the barrier layers 137n, 137p, 137s and 137t are present. By formation of the through-holes, a portion of each of the barrier layers 137n, 137p, 137s and 137t is exposed from the reflecting film 130f, and the reflecting layer 130 that defines through-holes at the positions of the barrier layers 137n, 137p, 137s and 137t is formed. The barrier layers 137n, 137p, 137s and 137t function as the etch stop, so that damage to the n-type semiconductor layer 122n, the electrode layer 124e, the electrode layer 125e and the second island portion 126t in the etching process can be reduced. Further, for example, an Au film is formed on the reflecting layer 130, and the Au film is patterned such that portions of the Au film remains at the positions of the barrier layers 137n, 137p, 137s and 137t. By the patterning of the Au film, the n-side electrode 136n, the p-side electrode 136p, and the electrodes 138s and 138t are formed as shown in FIG. 13A and FIG. 13B.

Figure 14A:
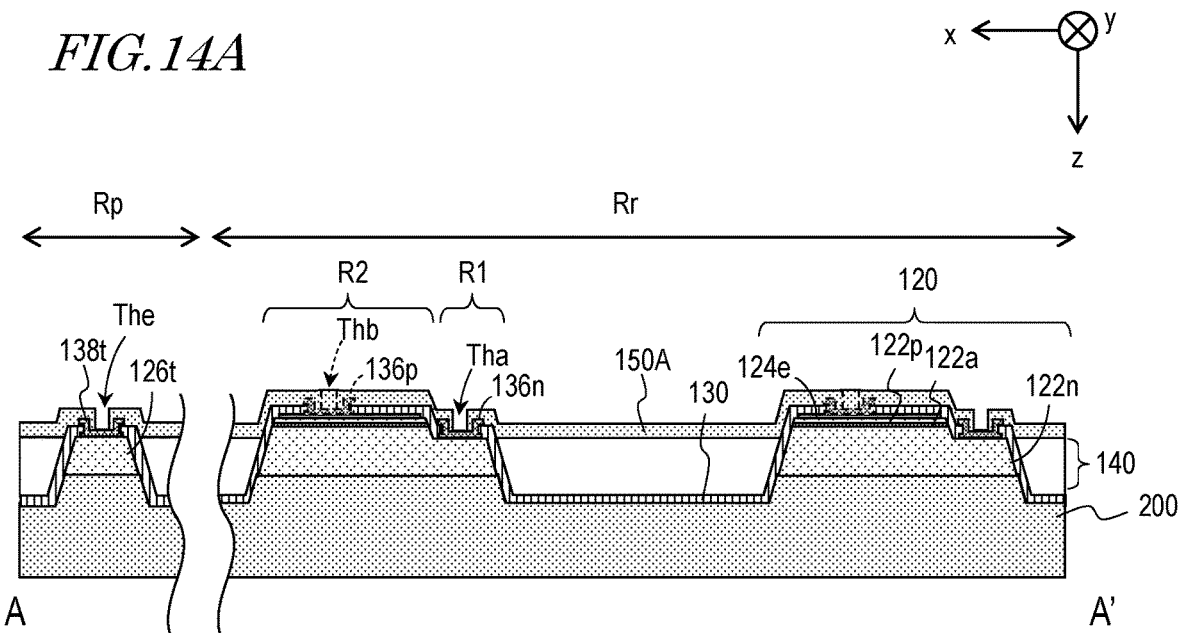
FIG. 14A is a schematic cross-sectional view for description of a method of manufacturing a light emitting device of one embodiment of the present disclosure.
Figure 14B:
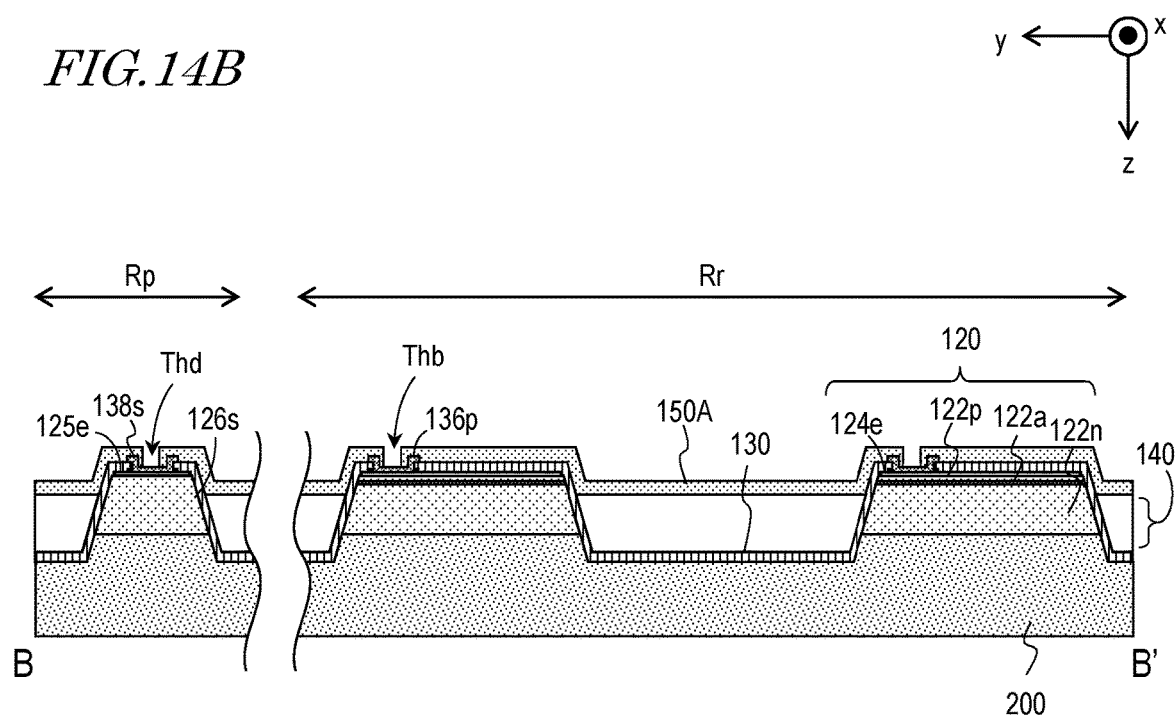
FIG. 14B is a schematic cross-sectional view for description of a method of manufacturing a light emitting device of one embodiment of the present disclosure.
Figure 14C:
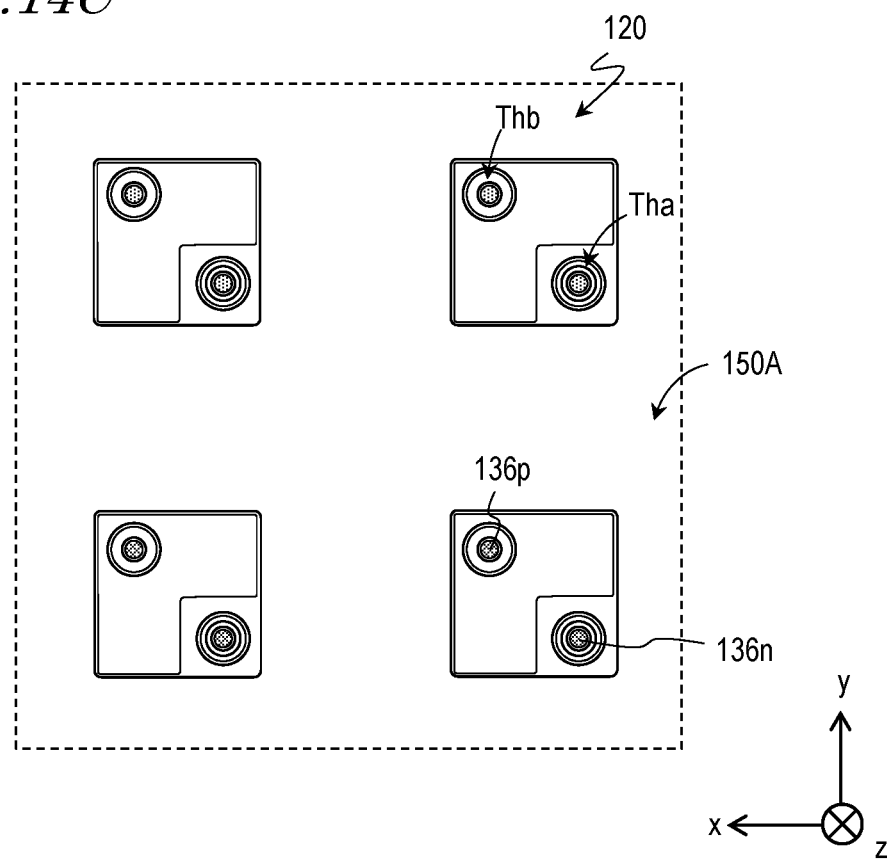
FIG. 14C is a schematic enlarged bottom view showing a part of an array of light emitting structures 120 after formation of through-holes.

Then, an insulating film (first insulating film) is formed so as to cover an entirety of a surface of the supporting substrate 200. Thereafter, by patterning the insulating film, a first insulating layer 150A is formed covering the light emitting structures 120 on the supporting substrate 200 and defining a through-hole (i.e., first through-hole) Tha and a through-hole (i.e., second through-hole) Thb for each of the light emitting structures 120 (step S2 of FIG. 7). Examples of the material of the first insulating layer 150A include an epoxy-based and silicone-based photosensitive material. By performing photolithography after application of the photosensitive material, the material of the insulating film can be left unremoved in regions other than the through-holes. As shown in FIG. 14A, the through-hole Tha is provided in a portion of the first region R1 of each of the light emitting structures 120 at the position of the n-side electrode 136n. The through-hole Thb is defined in a portion of the second region R2 of each of the light emitting structures 120 at the position of the p-side electrode 136p. FIG. 14C is a schematic enlarged view showing a part of the array of the light emitting structures 120 when viewed from the bottom surface side. A portion of the n-side electrode 136n and a portion of the p-side electrode 136p are exposed at the through-holes Tha and Thb, respectively.

The insulating film is formed so as to cover not only the light emitting structures 120 but also the first island portions 126s and the second island portions 126t. Further, at the time of patterning the insulating film, a through-hole (i.e., fourth through-hole) Thd and a through-hole (i.e., fifth through-hole) The are formed at the position of the electrode 138s on the first island portion 126s and at the position of the electrode 138t on the second island portion 126t, respectively, as well as forming of the through-holes Tha and Thb.

Then, a plurality of first electrically-conductive structures and a plurality of first wirings are formed (step S3 of FIG. 7). First, an electrically-conductive film is formed over an entirety of a surface of the supporting substrate 200. For example, the electrically-conductive film can be formed in the form of a multilayer film by, for example, sequentially depositing Ti, Rh, Au and Ti on the first insulating layer 150A. Thereafter, the electrically-conductive film is patterned to form p-side wiring layers 160, each of which includes a first wiring 160w, vias 160v and vias 164v.

Figure 15A:
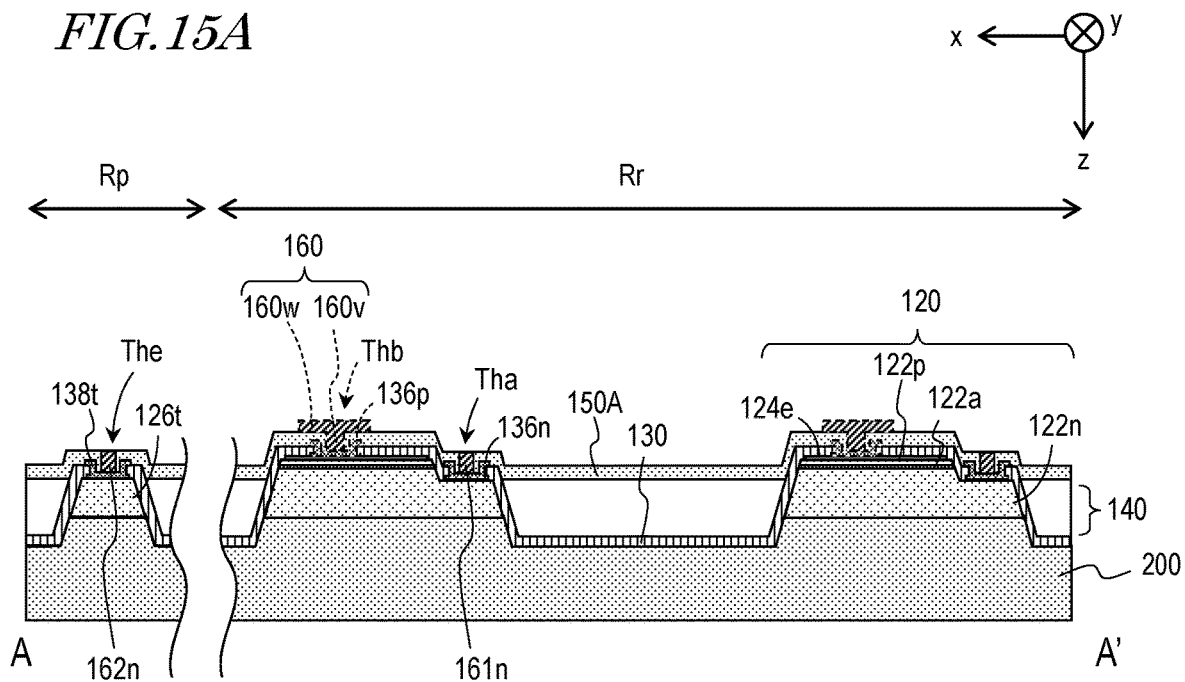
FIG. 15A is a schematic cross-sectional view for description of a method of manufacturing a light emitting device of one embodiment of the present disclosure.

In this step, a portion of the electrically-conductive film at each of the through-holes Tha is left unremoved so that a first electrically-conductive structure 161n, which has an end connected with the n-side electrode 136n, can be formed for each of the through-holes Tha as shown in FIG. 15A. The first electrically-conductive structure 161n is electrically connected with the n-type semiconductor layer 122n through the n-side electrode 136n. Further, at this time, a portion of the electrically-conductive film at the position of each of the through-holes The is left unremoved so that a second electrically-conductive structure 162n, which have an end connected with the electrode 138t, can be formed for each of the through-holes The. The second electrically-conductive structure 162n is electrically connected with each second island portion 126t through the electrode 138t.

Figure 15B:
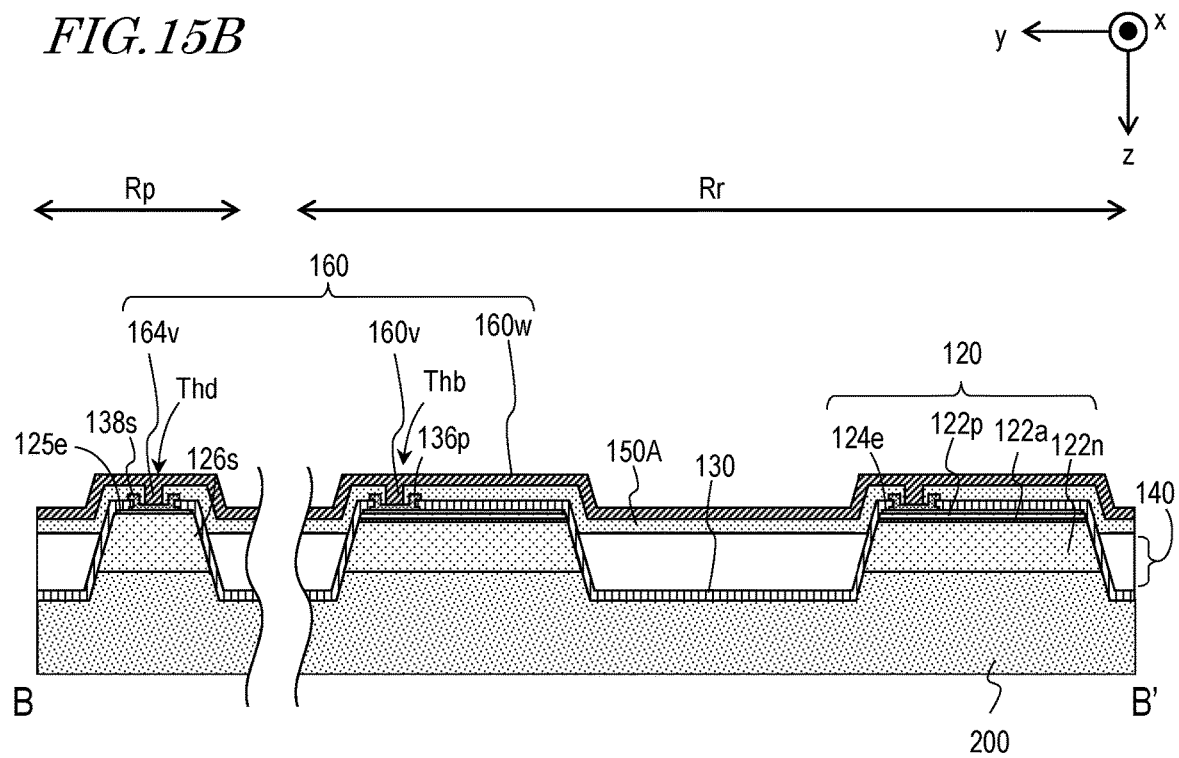
FIG. 15B is a schematic cross-sectional view for description of a method of manufacturing a light emitting device of one embodiment of the present disclosure.

As shown in FIG. 15A, the via 160v of the p-side wiring layer 160 is disposed at an inner side of the through-hole Thb and electrically connects the p-side electrode 136p and the first wiring 160w with each other. As shown in FIG. 15B, the first wiring 160w extends in the second direction (herein, column direction) and electrically connects together a column of the p-type semiconductor layers 122p of light emitting structures 120 that are aligned in the second direction through the vias 160v, the p-side electrodes 136p and the electrode layers 124e.

In this example, the first wiring 160w extends to the first island portion 126s and is electrically connected with the first island portion 126s through the via 164v, which has an end connected with the electrode 138s. As described above with reference to FIG. 2, the first wiring 160w is provided for, for example, each column of the plurality of light emitting structures 120. In the patterning of the electrically-conductive film, a portion of the electrically-conductive film at the through-hole Thd and a portion of the electrically-conductive film over a region between the through-hole Thd and the through-hole Thb are left unremoved, so that each of the first wirings 160w can be electrically connected with a corresponding one of the plurality of first island portions 126s at the through-hole Thd. By applying a voltage to a first island portion 126s, the voltage can be applied collectively through a first wiring 160w to the p-type semiconductor layers 122p of the column of the light emitting structures 120 that are aligned in the second direction and connected with that first wiring 160w.

Figure 15C:
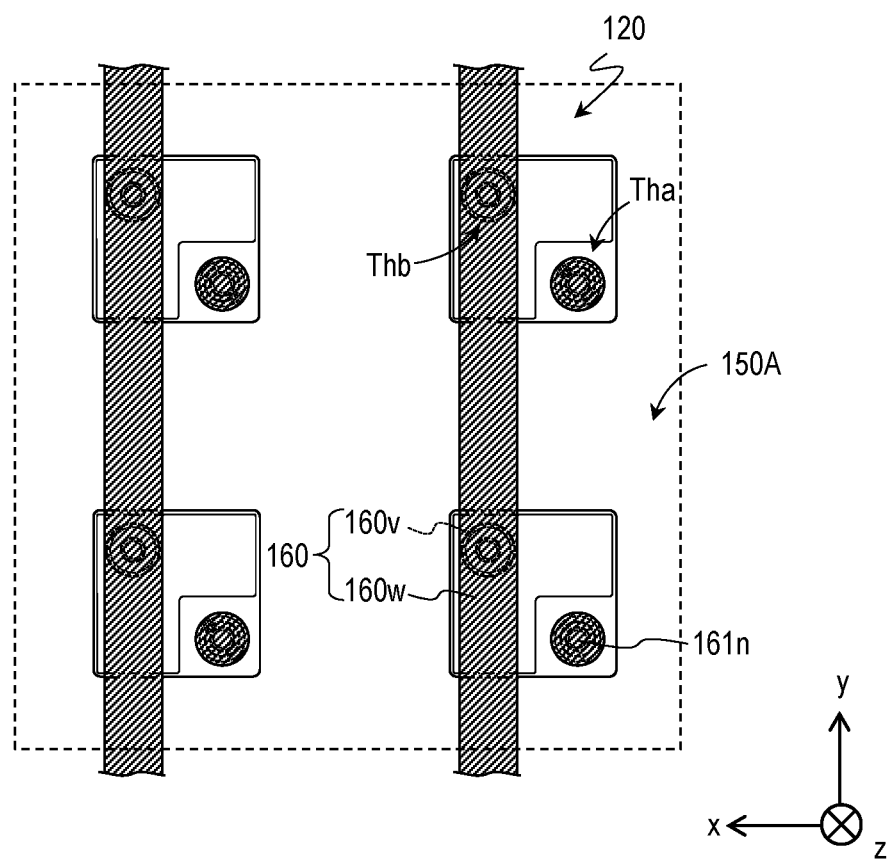
FIG. 15C is a schematic enlarged bottom view showing part of an array of light emitting structures after formation of a p-side wiring layer.
Figure 16A:
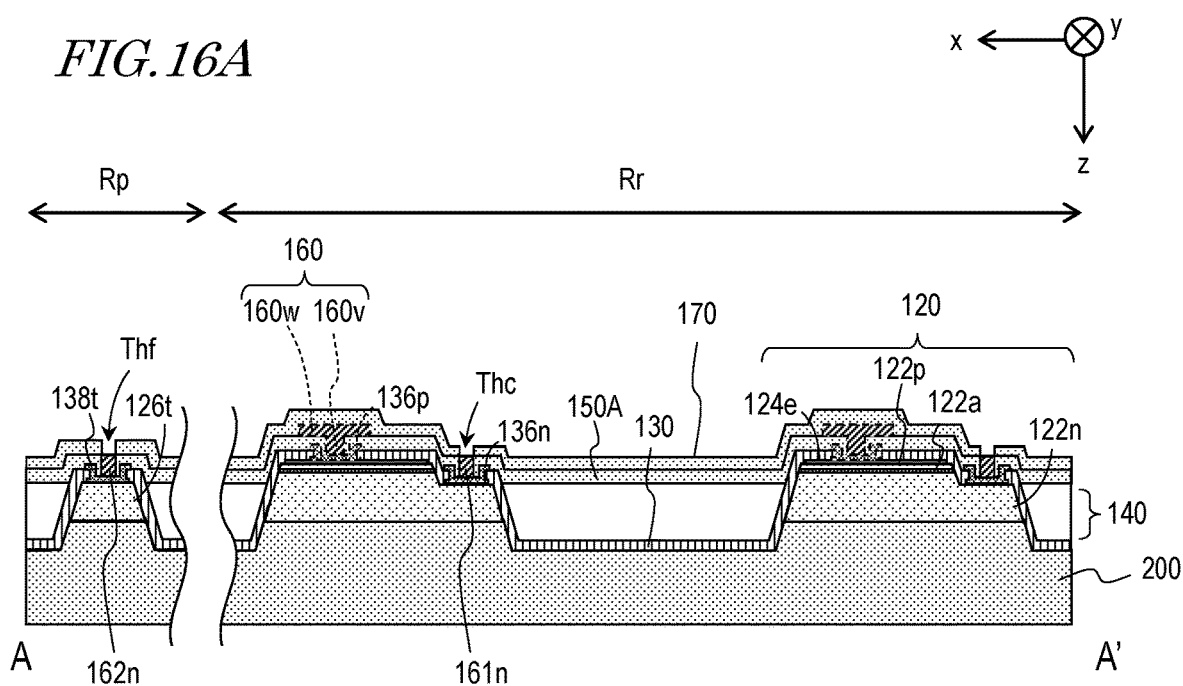
FIG. 16A is a schematic cross-sectional view for description of a method of manufacturing a light emitting device of one embodiment of the present disclosure.
Figure 16B:
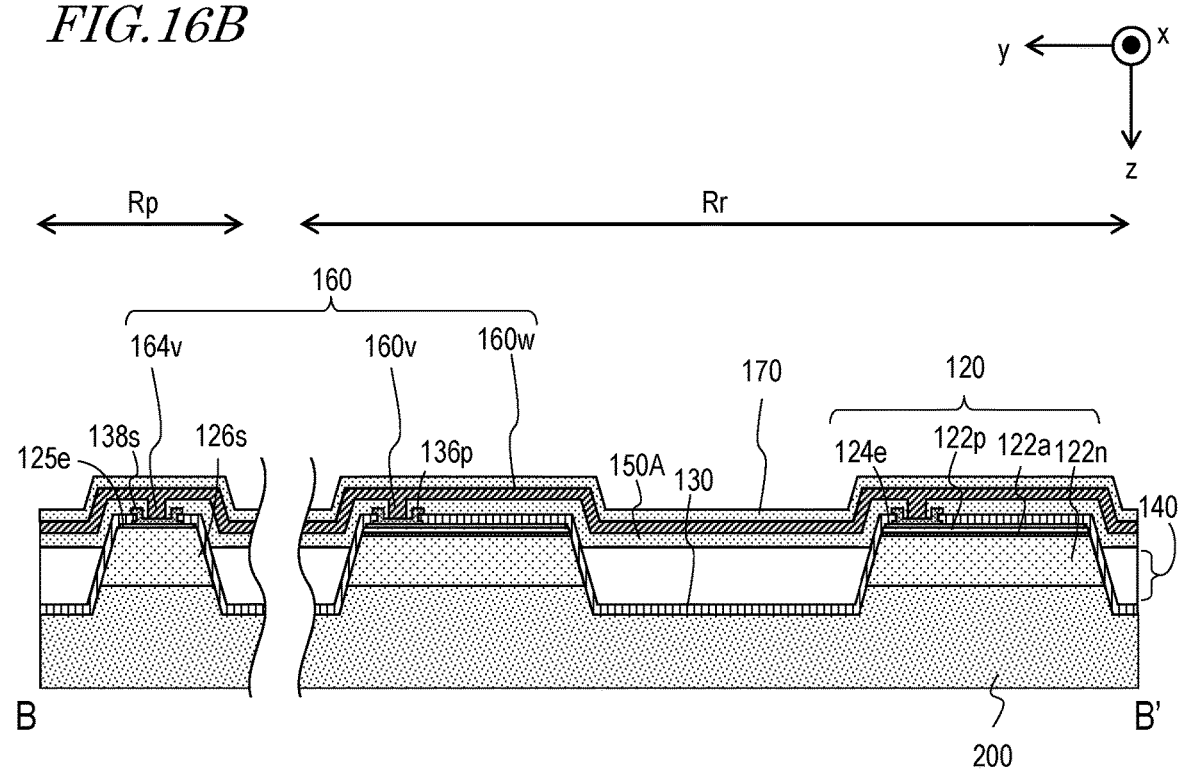
FIG. 16B is a schematic cross-sectional view for description of a method of manufacturing a light emitting device of one embodiment of the present disclosure.

FIG. 15C is a schematic enlarged view showing a part of the array of the light emitting structures 120 after formation of the p-side wiring layers 160. As shown in FIG. 15C, the first electrically-conductive structure 161n is formed at the through-hole Tha for each of the through-holes Tha. As can be understood from FIG. 15C, each of the first electrically-conductive structures 161n is spatially apart from a corresponding one of the first wirings 160w extending in the column direction. Therefore, each of the first electrically-conductive structures 161n is also electrically separated from the first wiring 160w.

Then, a second insulating film is formed so as to cover an entirety of a surface of the supporting substrate 200. The second insulating film may be formed so as to cover not only the light emitting structures 120 but also the first island portions 126s and the second island portions 126t similarly to the above-described first insulating film After formation of the second insulating film, the second insulating film is patterned to form a second insulating layer 170 covering the plurality of first wirings 160w and defining through-holes (i.e., third through-holes) Thc at the positions overlapping the first electrically-conductive structures 161n when viewed from above (step S4 of FIG. 7). As a material of the second insulating layer 170, the same material as that used in the first insulating layer 150A, such as photosensitive material, can be used. By performing photolithography after application of the photosensitive material, the material of the insulating film can be left unremoved in regions other than the through-holes.

FIG. 16C is a schematic enlarged view showing a part of the array of the light emitting structures 120 after formation of the second insulating layer 170. As shown in FIG. 16C, the through-holes Thc are defined at the positions overlapping the first electrically-conductive structures 161n.

A portion of the first electrically-conductive structures 161n is exposed at the through-holes Thc.

Refer again to FIG. 16A. In the patterning of the insulating film, not only the through-holes Thc but also through-holes (i.e., sixth through-holes) Thf are formed at the positions overlapping the second electrically-conductive structures 162n when viewed from above. A portion of each of the second electrically-conductive structures 162n is exposed at a respective one of the through-holes Thf.

Then, a plurality of second wirings are formed (step S5 of FIG. 7).

Figure 17A:
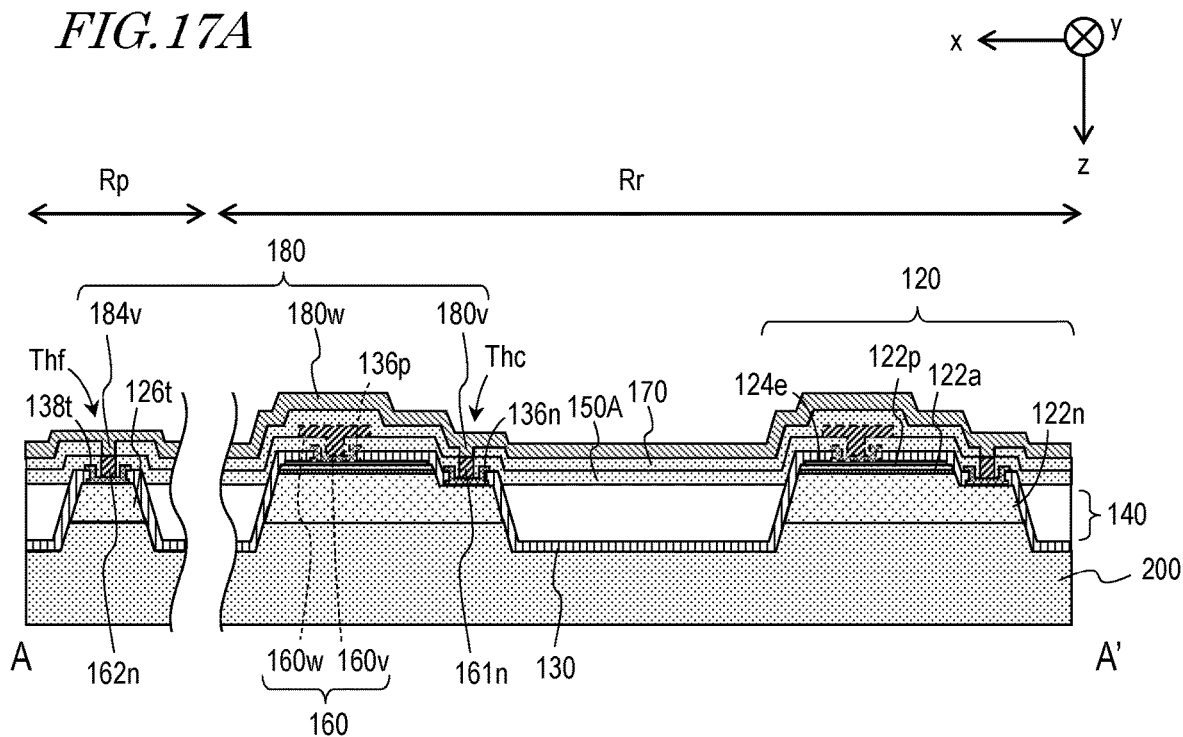
FIG. 17A is a schematic cross-sectional view for description of a method of manufacturing a light emitting device of one embodiment of the present disclosure.
Figure 17B:
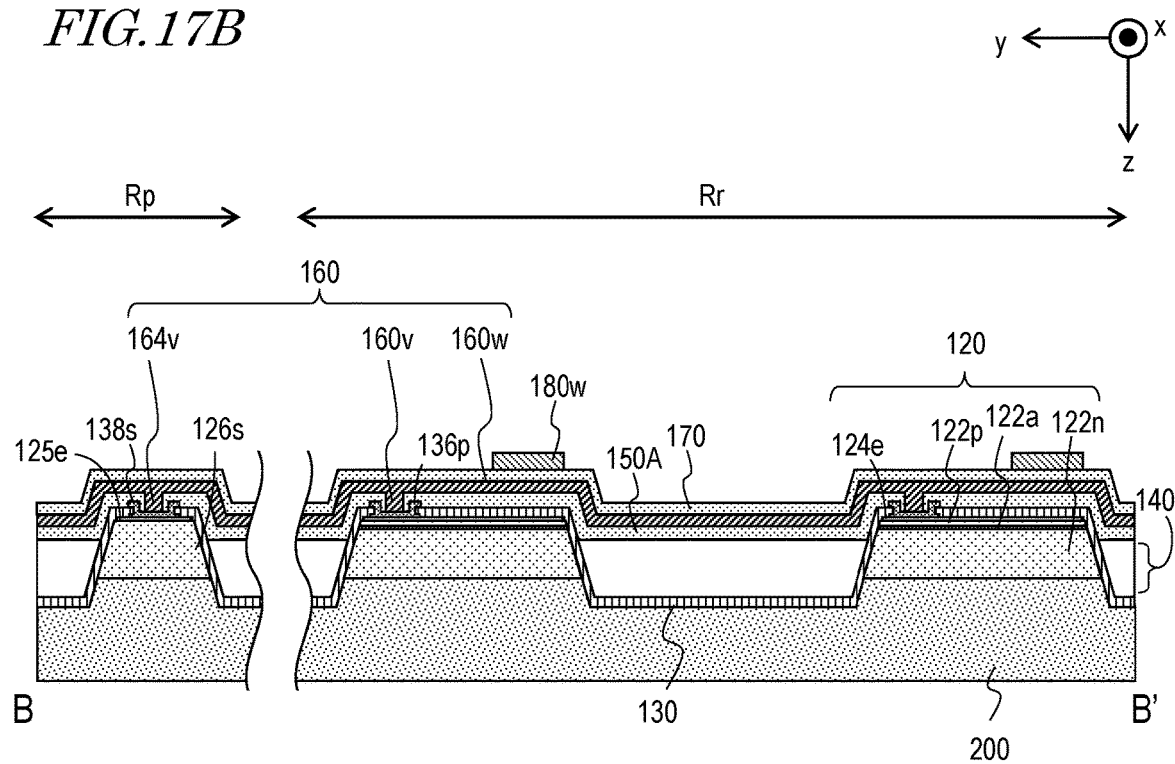
FIG. 17B is a schematic cross-sectional view for description of a method of manufacturing a light emitting device of one embodiment of the present disclosure.

For example, an electrically-conductive film is formed in the form of a multilayer film over an entirety of a surface of the supporting substrate 200 by sequentially depositing Ti, Rh, Au and Ti on the second insulating layer 170 as in the step of forming the p-side wiring layer 160. Thereafter, by patterning the electrically-conductive film, an n-side wiring layer 180 can be formed that includes second wirings 180w and vias 180v as shown in FIG. 17A. In the patterning of the electrically-conductive film, portions of the electrically-conductive film at the positions of the through-holes Thc are left unremoved, so that the via 180v can be formed for each of the through-holes Thc. One end and the other end of the via 180v are connected with the first electrically-conductive structure 161n and the second wiring 180w, respectively. Therefore, each of the second wirings 180w is electrically connected with the n-type semiconductor layers 122n of respective ones of the light emitting structures 120 through respective ones of the vias 180v, respective ones of the first electrically-conductive structures 161n and respective ones of the n-side electrodes 136n. FIG. 17C is a schematic enlarged view showing a part of the array of the light emitting structures 120 after formation of the n-side wiring layer 180. As shown in FIG. 17C, each of the second wirings 180w is provided for a respective one of the rows of the plurality of light emitting structures 120, for example.

In the patterning of the electrically-conductive film, a portion of the electrically-conductive film over regions demarcated by connecting the through-holes Thf and the through-holes Thc is left unremoved, so that the second wiring 180w can be extended to a region above the second island portion 126t. Portions of the electrically-conductive film at the positions of the through-holes Thf are left unremoved, the via 184v can be formed for each of the through-holes Thf as shown in the left part of FIG. 17A. One end and the other end of the via 184v are connected with the second electrically-conductive structure 162n and the second wiring 180w, respectively. The second wiring 180w is electrically connected with the second island portion 126t through the via 184v, the second electrically-conductive structure 162n and the electrode 138t.

Each of the second wirings 180w extends in the first direction (herein, row direction) and is electrically connected with a row of the first electrically-conductive structures 161n that are aligned in the first direction through the vias 180v at the through-holes Thc. Accordingly, each of the second wirings 180w electrically connects together the n-type semiconductor layers 122n of a row of light emitting structures 120 aligned in the first direction through respective ones of the vias 180v and respective ones of the first electrically-conductive structures 161n. Further, in this example, the second wiring 180w extends to the second island portion 126t and is connected with one end of the second electrically-conductive structure 162n through the via 184v, while the other end of the second electrically-conductive structure 162n is connected with the electrode 138t on the second island portion 126t. Thus, in the step of forming the n-side wiring layer 180, each of the second wirings 180w can be electrically connected with a corresponding one of the plurality of second island portions 126t at the through-hole Thf. By applying a voltage to a second island portion 126t, the voltage can be simultaneously applied through a respective one of the second wirings 180w to the n-type semiconductor layers 122n of a row of the light emitting structures 120 that are aligned in the first direction and connected with the respective one of the second wirings 180w.

Figure 18A:
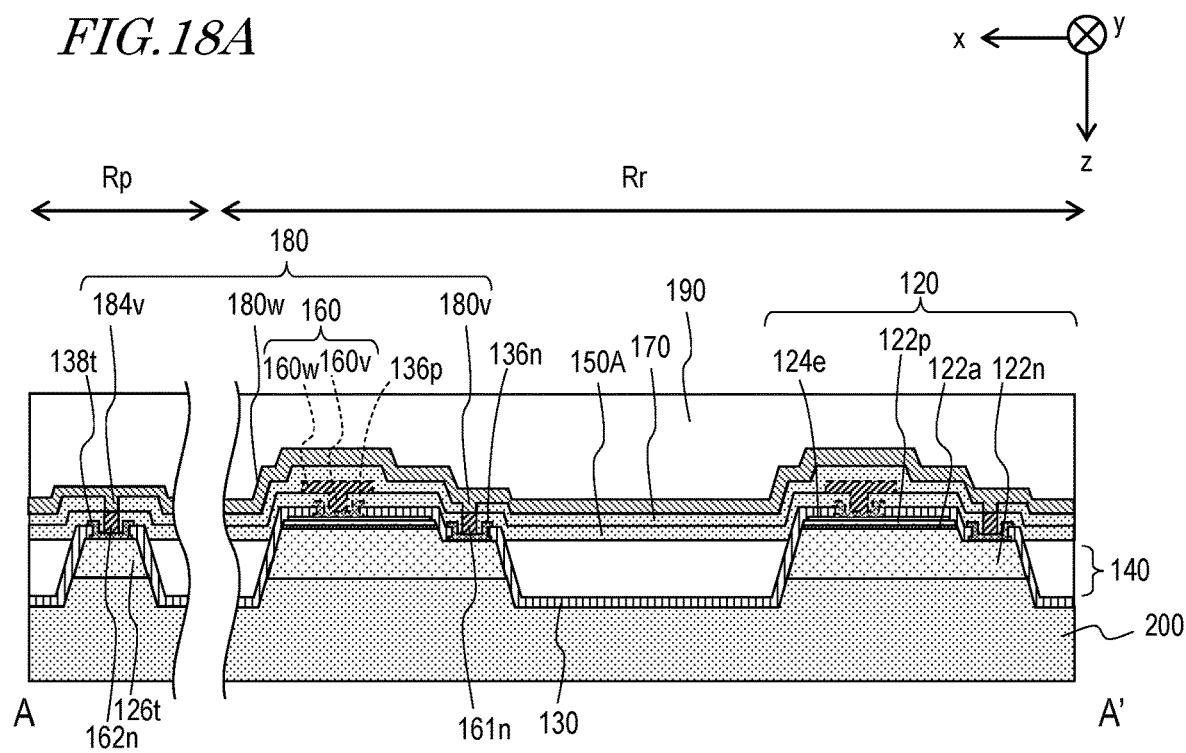
FIG. 18A is a schematic cross-sectional view for description of a method of manufacturing a light emitting device of one embodiment of the present disclosure.
Figure 18B:
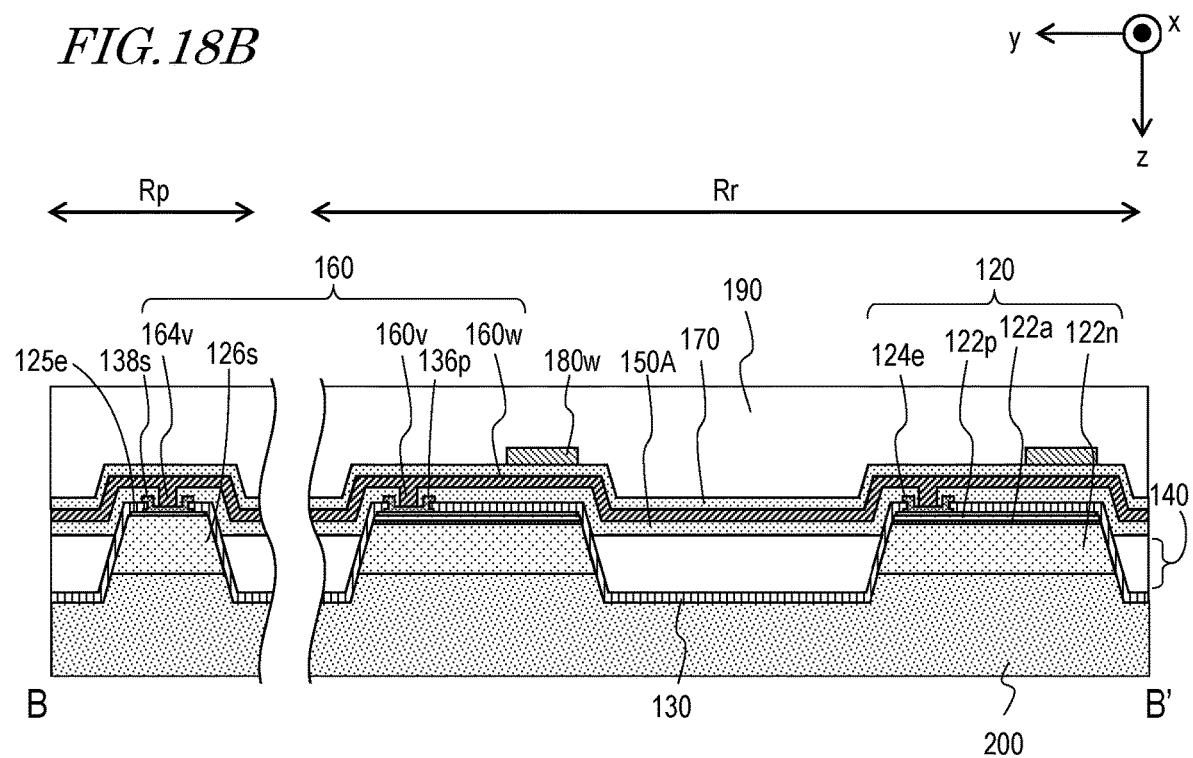
FIG. 18B is a schematic cross-sectional view for description of a method of manufacturing a light emitting device of one embodiment of the present disclosure.

Thereafter, as shown in FIG. 18A and FIG. 18B, a light reflective resin layer 190 may be formed over the second insulating layer 170 so as to cover the n-side wiring layer 180. As the material of the light reflective resin layer 190, the same material as that used for the resin layer 140, e.g., a resin composition in which a light reflective filler is dispersed, can be used. For example, compression molding such as transfer molding is employed for formation of the light reflective resin layer 190. An uncured resin composition in which the light reflective filler is dispersed is applied onto the second insulating layer 170, and the resin composition is cured, so that the light reflective resin layer 190 can be formed. The reflectance of the light reflective resin layer 190 for light emitted from the light emitting structures 120 is, for example, 60% or more. The light reflective resin layer 190 can have a thickness (i.e., the distance between the lowermost portion to the upper surface in a direction perpendicular to the plane on which the light emitting structures 120 are placed) of approximately, 0.2 mm or greater and 2 mm or less. Accordingly, the light emitting device 100A is obtained.

Thereafter, if necessary, the supporting substrate 200 may be removed from the light emitting device 100A (step S6 of FIG. 7). A Si substrate is used for the supporting substrate 200 in this example, the supporting substrate 200 can be removed by, for example, etching. In the case where a sapphire substrate is used for the supporting substrate 200, the sapphire substrate can be separated from the light emitting structures 120 using a laser lift-off (LLO) method.

Accordingly, the light emitting device 100A that has the configuration shown in FIG. 6A and FIG. 6B is obtained.

According to the above-described embodiment, the through-holes Tha and Thb are defined in the first insulating layer 150A at the positions overlapping the first region R1 and the second region R2, respectively, of the n-type semiconductor layer 122n, so that the first electrically-conductive structures 161n can be formed at the through-holes Tha in the step of forming the first wirings 160w. In the above-described embodiment, after the first electrically-conductive structures 161n, each of which is electrically connected with a respective one of the n-type semiconductor layers 122n, are formed, and then the second insulating layer 170 that has the through-holes The each extending to a respective one of the first electrically-conductive structures 161n is formed on the first insulating layer 150A. By forming the second wirings 180w on the second insulating layer 170, the n-type semiconductor layers 122n of respective ones of the light emitting structures 120 can be electrically connected together by respective ones of the second wirings 180w via respective ones of the first electrically-conductive structures 161n. Therefore, it is not necessary to form, in a single step, through-holes each extending through both the first insulating layer below respective ones of the first wirings extending in, for example, the column direction of a respective one of arrays of the light emitting structures 120 and the second insulating layer disposed between the first wirings and the second wirings that intersects with the first wirings. According to the present embodiment, the n-type semiconductor layers 122n of the plurality of light emitting structures 120 can be electrically connected together without formation of through-holes each extending through the two insulating layers. Thus, complication of the manufacturing steps can be avoided as compared with a case where the first electrically-conductive structures 161n are not formed in advance, i.e., a case where through-holes each extending through two insulating layers are collectively formed.

The light emitting structures 120 are formed on the supporting substrate 200 so as to be arranged in rows and columns, for example. By arranging the plurality of light emitting structures 120 in a matrix, a light emitting device that includes an array of light emitting structures 120 can be provided. According to one embodiment of the present disclosure, a wiring layout in which the first wirings 160w and the second wirings 180w intersect with each other can be realized relatively easily. Therefore, the wiring pitch between the light emitting structures 120 can be reduced relatively easily, and a configuration in which a plurality of light emitting structures 120 are densely arranged can be realized.

According to a method in which a semiconductor material is deposited on a supporting substrate 200 and the deposited semiconductor material is patterned to form a plurality of light emitting structures 120, a plurality of first island portions 126s and/or a plurality of second island portions 126t can be formed collectively on the supporting substrate 200 in the step of forming the light emitting structures 120. The first island portions 126s are formed in the peripheral region Rp at an outside of the array of the light emitting structures 120, and each of the first wirings 160w is connected with a respective one of the first island portions 126s, so that the first island portions 126s can be utilized as terminals for supplying electricity to the p-type semiconductor layers 122p of the light emitting structures 120. Likewise, the second island portions 126t are formed in the peripheral region Rp, and each of the second wirings 180w is connected with a respective one of the second island portions 126t, so that the second island portions 126t can be utilized as terminals for supplying power to the n-type semiconductor layers 122n of the light emitting structures 120. Another electrode may further be formed on a surface of the first island portion 126s and/or the second island portion 126t at a side opposite to the reflecting layer 130

(i.e., a surface opposite to the surface on which the electrode 138s and/or the electrode 138t is formed).

In the above-described example, the position of the bottom portion of the first island portion 126s and the position of the bottom portion of the second island portion 126t substantially corresponds to the position of the bottom portion of the p-type semiconductor layer 122p and the position of the bottom portion of the n-type semiconductor layer 122n, respectively. However, the position of the bottom portion of the first island portion 126s and the position of the bottom portion of the second island portion 126t do not need to correspond to the position of the bottom portion of the p-type semiconductor layer 122p and the position of the bottom portion of the n-type semiconductor layer 122n, respectively. For example, the position of the bottom portion of the first island portion 126s may correspond to the position of the bottom portion of the n-type semiconductor layer 122n. If the first island portion 126s has a great height, a relatively large step can be formed in the first wiring 160w. If such a relatively large step is formed, a thickness of a portion of the first wiring 160w sloping along the lateral portion of the first island portion 126s is likely to be reduced, so that disconnection is likely to occur in that part. By reducing the height of the first island portion 126s, a step in the first wiring 160w according to the height of the first island portion 126s can be reduced. Therefore, occurrence of a disconnection in the first wiring 160w which is attributed to the step can be reduced, and the yield and reliability of the light emitting device can be improved. The same applies to a case where a second island portion 126t is formed and the second island portion 126t is used as a terminal. That is, a step formed in the second wiring 180w can be reduced, so that occurrence of disconnection in the second wiring between the n-type semiconductor layer 122n and the second island portion 126t, which is attributed to the step, can be reduced.

In the above-described example, after providing the wafer 200W, the reflecting layer 130 is formed so as to cover each of the light emitting structures 120 before forming the first insulating layer 150A. In the configuration illustrated in FIG. 6A and FIG. 6B, light emitted from the light emitting structures 120 travels upward in each of FIGS. 6A and 6B. The bottom portion and the lateral portions of each of the light emitting structures 120 covered with the reflecting layer 130, emission of light from the bottom surface side of the light emitting device can be reduced, so that the light utilization efficiency can be improved. Further, the reflecting layer 130 can be disposed between adjacent two of the light emitting structures 120. This allows for reducing leakage of light from a light emission region to a non-emission region, when some of the plurality of light emitting structures 120 are selectively activated to emit light. Forming the light reflective resin layer 190 on the second insulating layer 170 after formation of the second wirings 180w, as in the above-described manufacturing process, allows for more effectively reducing emission of light from the bottom surface side of the light emitting device.

Figure 19A:
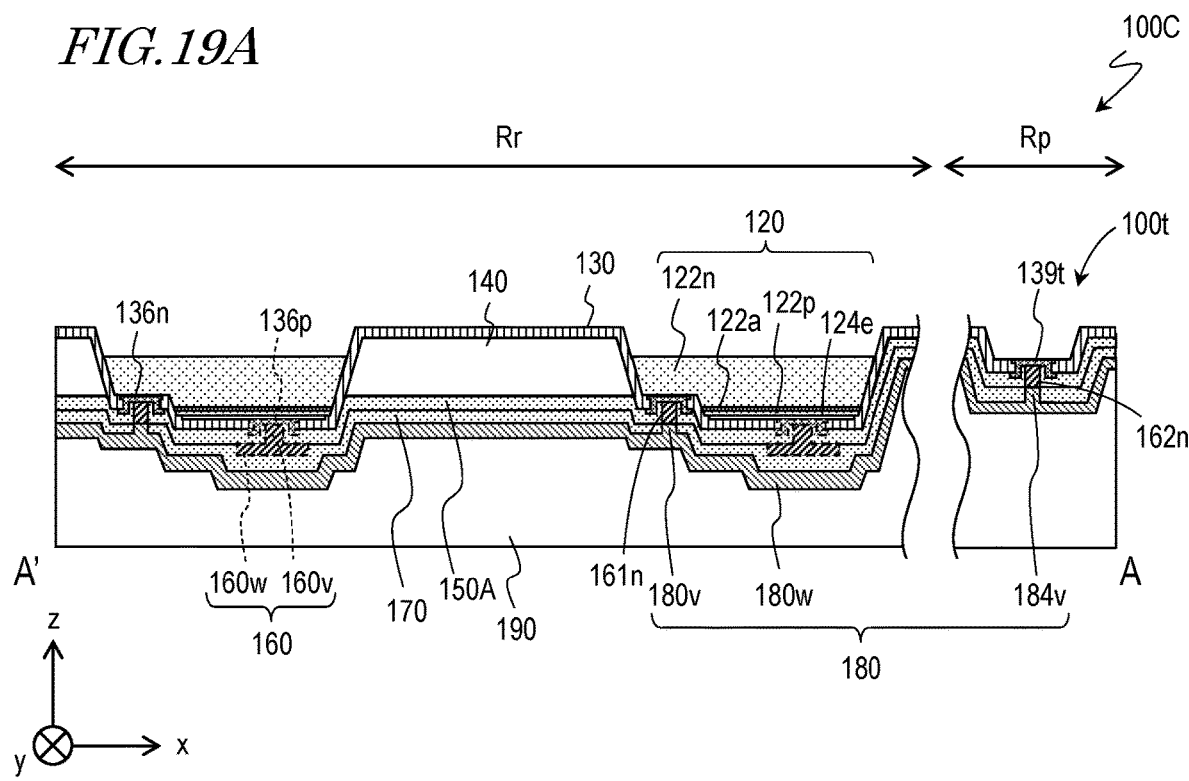
FIG. 19A is a schematic cross-sectional view of a light emitting device that does not include the first island portion and the second island portion, taken along a line A-A' of FIG. 2.
Figure 19B:
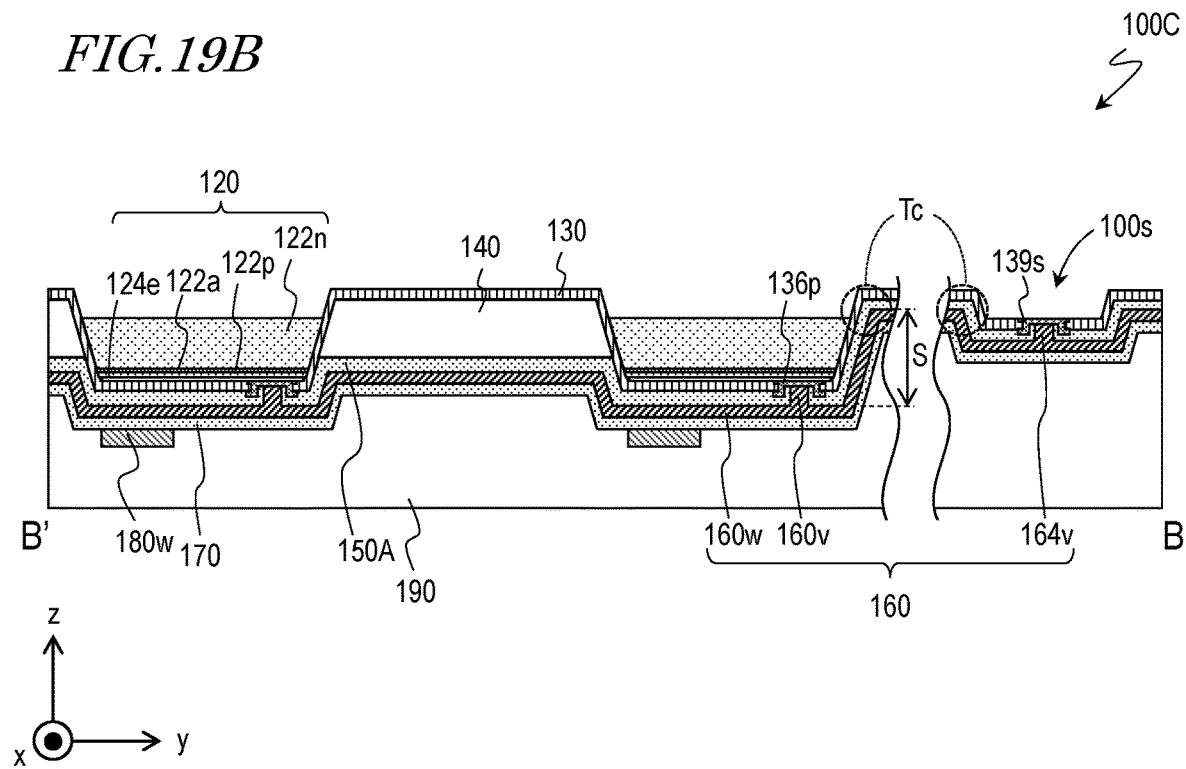
FIG. 19B is a schematic cross-sectional view of a light emitting device that does not include the first island portion and the second island portion, taken along a line B-B' of FIG. 2.

FIG. 19A and FIG. 19B schematically show an example of a cross section of a light emitting device obtained by a method of manufacturing according to the first embodiment of the present disclosure. FIG. 19A and FIG. 19B are cross-sectional views taken along a line A-A' of FIG. 2 and line B-B' of FIG. 2, respectively. The difference between the light emitting device 100C shown in FIG. 19A and FIG. 19B and the light emitting device 100A that has been described above with reference to FIG. 6A and FIG. 6B is that the light emitting device 100C does not include the first island portions 126s or the second island portions 126t.

In the light emitting device 100C shown in FIG. 19A, each terminal portion 100t includes an electrode 139t penetrating through the reflecting layer 130. The electrode 139t is connected with the second wiring 180w through the via 184v. In the light emitting device 100C shown in FIG. 19B, each terminal portion 100s includes an electrode 139s penetrating through the reflecting layer 130. The electrode 139s is connected with the first wiring 160w through the via 164v. Such a configuration allows reduction in dimensions of the peripheral region Rp, and accordingly, the display region Rr can be increased.

Second Example of Method of Manufacturing Light Emitting Device

Figure 20A:
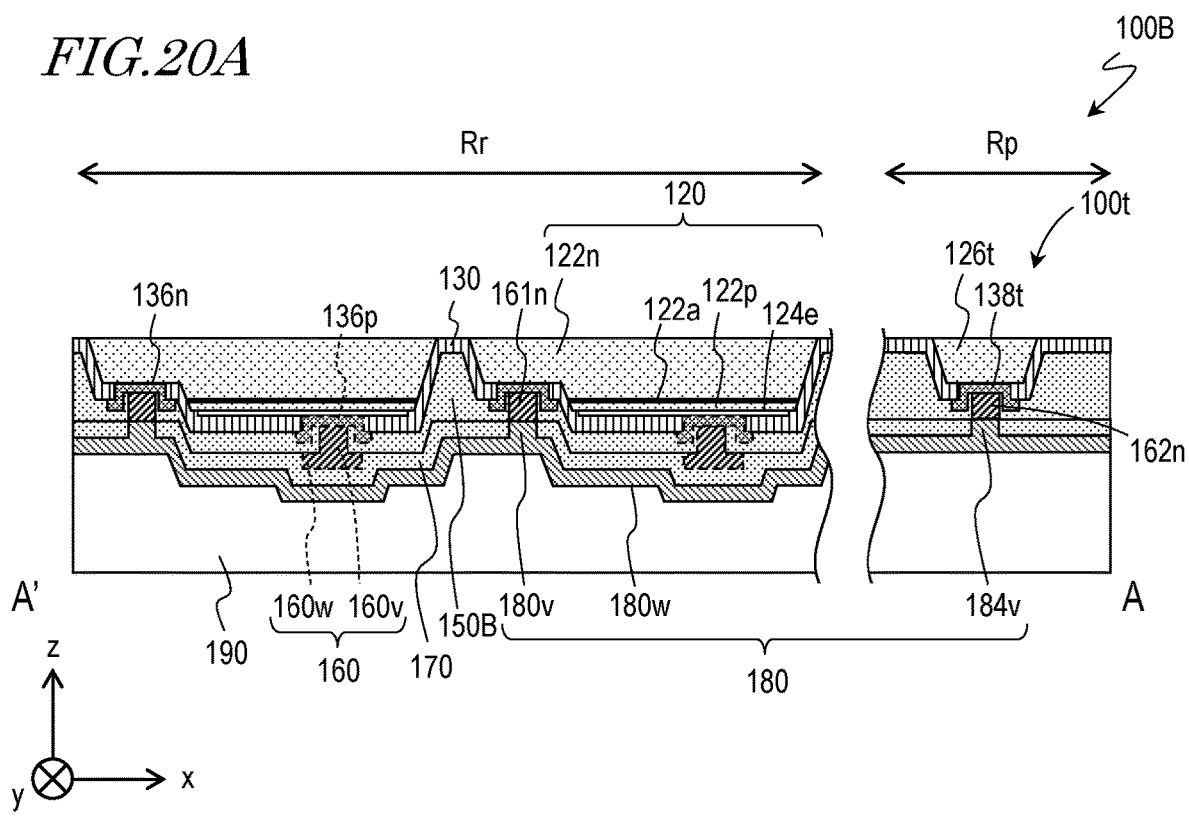
FIG. 20A is a schematic cross-sectional view of another exemplary light emitting device obtained by a manufacturing method of another embodiment of the present disclosure, corresponding to a cross-sectional view taken along the line A-A' of FIG. 2.
Figure 20B:
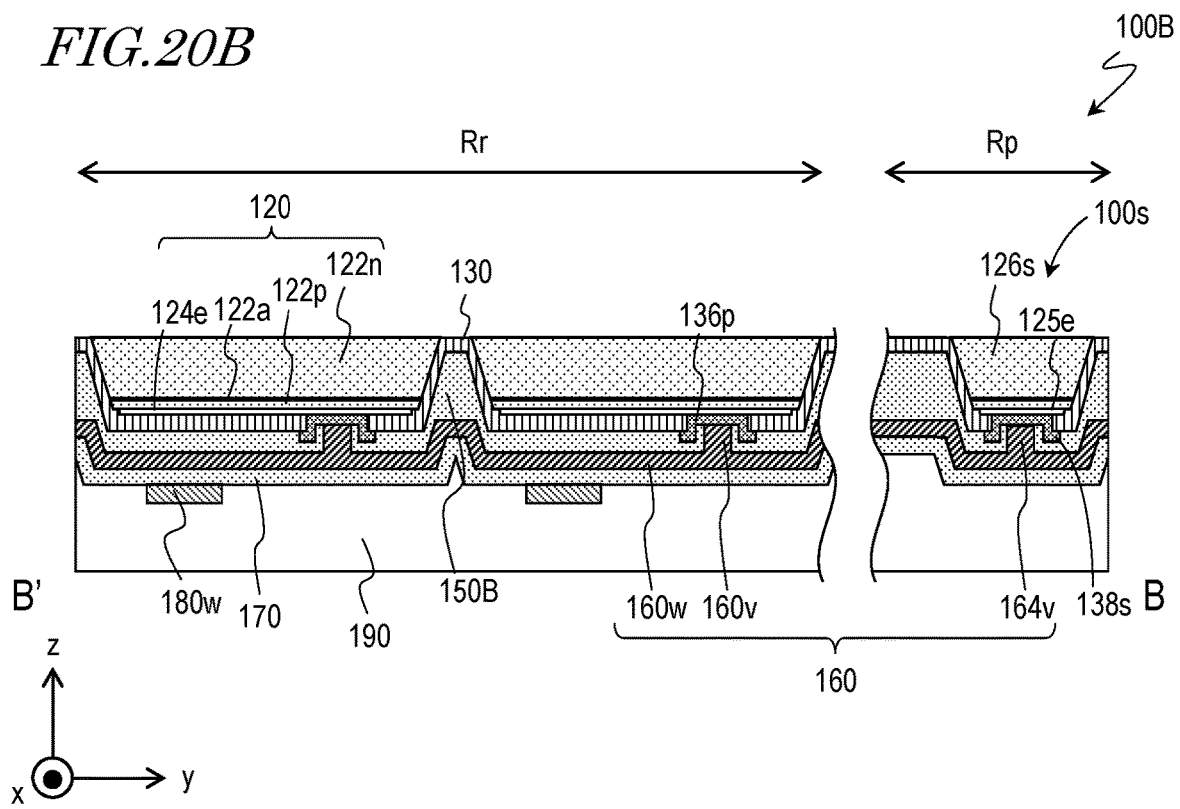
FIG. 20B is a schematic cross-sectional view of another exemplary light emitting device obtained by a manufacturing method of another embodiment of the present disclosure, corresponding to a cross-sectional view taken along the line B-B' of FIG. 2.

Each of FIG. 20A and FIG. 20B schematically shows an example of a cross section of a light emitting device obtained by a manufacturing method according to a second embodiment of the present disclosure. FIG. 20A and FIG. 20B are cross-sectional views taken along a line A-A' of FIG. 2 and a line B-B' of FIG. 2, respectively. The difference between the light emitting device 100B shown in FIG. 20A and FIG. 20B and the light emitting device 100A, which has been described above with reference to FIG. 6A and FIG. 6B is that, in the light emitting device 100B, the resin layer 140 is not disposed, and a portion of a first insulating layer 150B is disposed between adjacent two of the light emitting structures 120. According to such a configuration, the plurality of light emitting structures 120 can be arranged more densely.

Hereinafter, an exemplary method of manufacturing the light emitting device 100B is described with reference to FIG. 21A to FIG. 31B. Of FIG. 21A to FIG. 31B, each of FIG. 21A, FIG. 22A, FIG. 23A, FIG. 24A, FIG. 25A, FIG. 26A, FIG. 27A, FIG. 28A, FIG. 29A, FIG. 30A and FIG. 31A schematically shows the cross section taken along a line A-A' of FIG. 2. Each of FIG. 21B, FIG. 22B, FIG. 23B, FIG. 24B, FIG. 25B, FIG. 26B, FIG. 27B, FIG. 28B, FIG. 29B, FIG. 30B and FIG. 31B schematically shows the cross section taken along a line B-B' of FIG. 2. Hereinafter, the differences from the first example will be described, and the same steps as those of the first example will not be described.

Figure 21A:
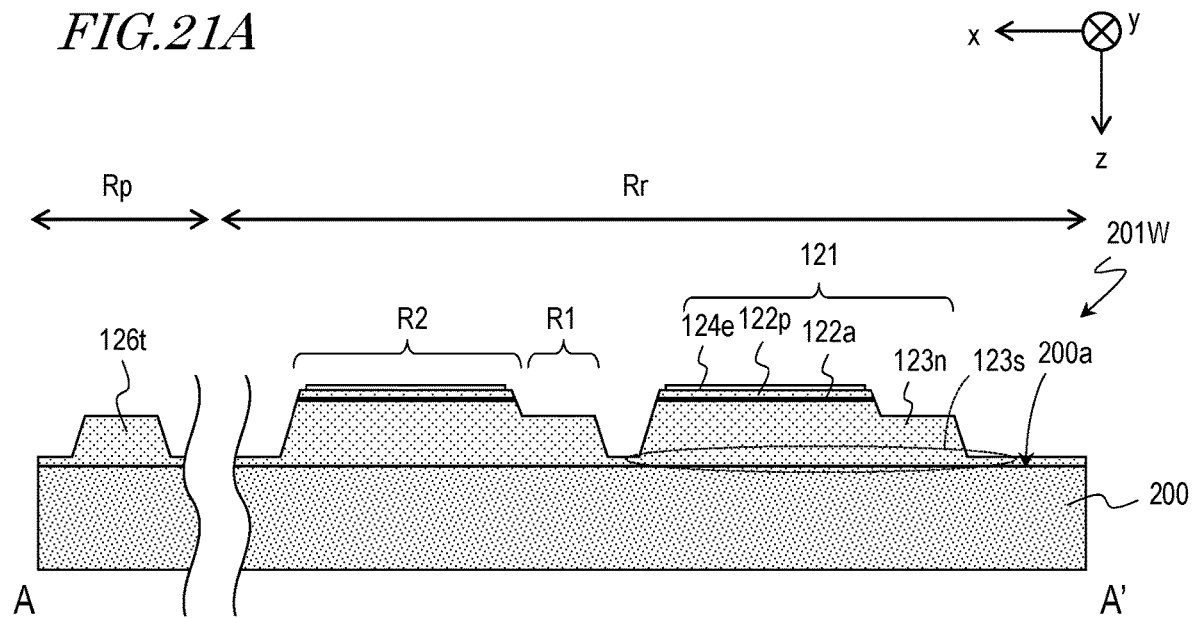
FIG. 21A is a schematic cross-sectional view for description of a method of manufacturing a light emitting device of another embodiment of the present disclosure.
Figure 21B:
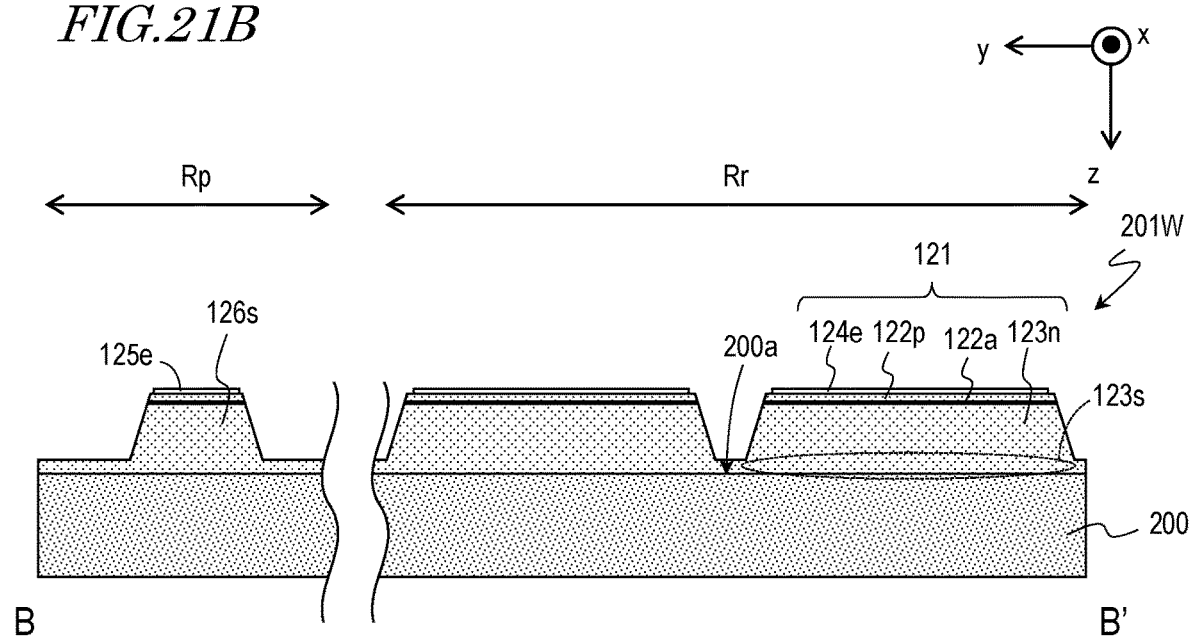
FIG. 21B is a schematic cross-sectional view for description of a method of manufacturing a light emitting device of another embodiment of the present disclosure.

A wafer that includes a plurality of light emitting structures is provided. In the example illustrated in FIG. 21A and FIG. 21B, each of the light emitting structures 121 disposed on the supporting substrate 200 of the wafer 201W includes an n-type semiconductor layer 123n. As shown in FIG. 21A and FIG. 21B, the n-type semiconductor layer 123n includes a portion of a sacrificial layer 123s at a bottom portion facing the supporting substrate 200. The sacrificial layer 123s covers an entirety of a surface of the supporting substrate 200 and is disposed across the plurality of n-type semiconductor layers 123n.

Figure 22A:
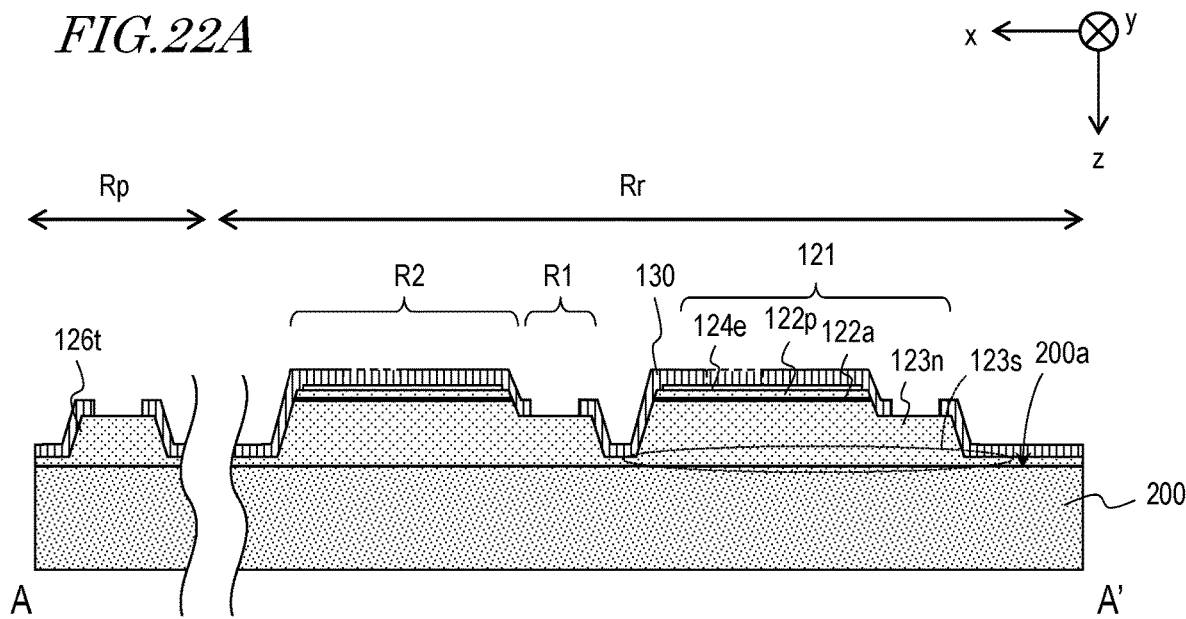
FIG. 22A is a schematic cross-sectional view for description of a method of manufacturing a light emitting device of another embodiment of the present disclosure.
Figure 22B:
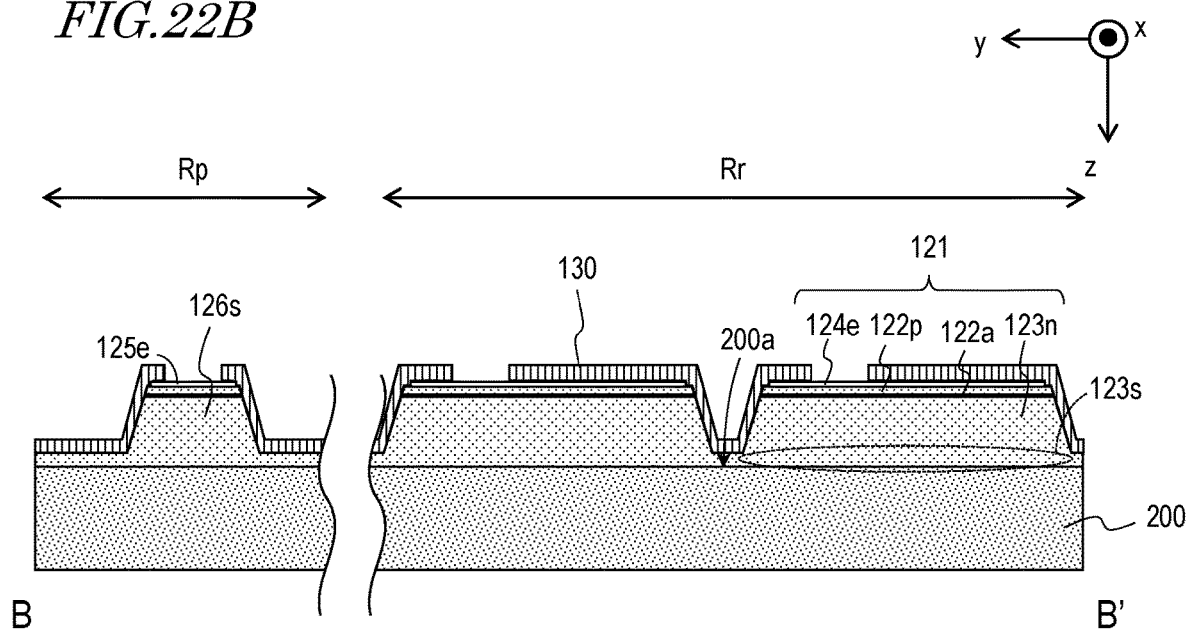
FIG. 22B is a schematic cross-sectional view for description of a method of manufacturing a light emitting device of another embodiment of the present disclosure.
Figure 23A:
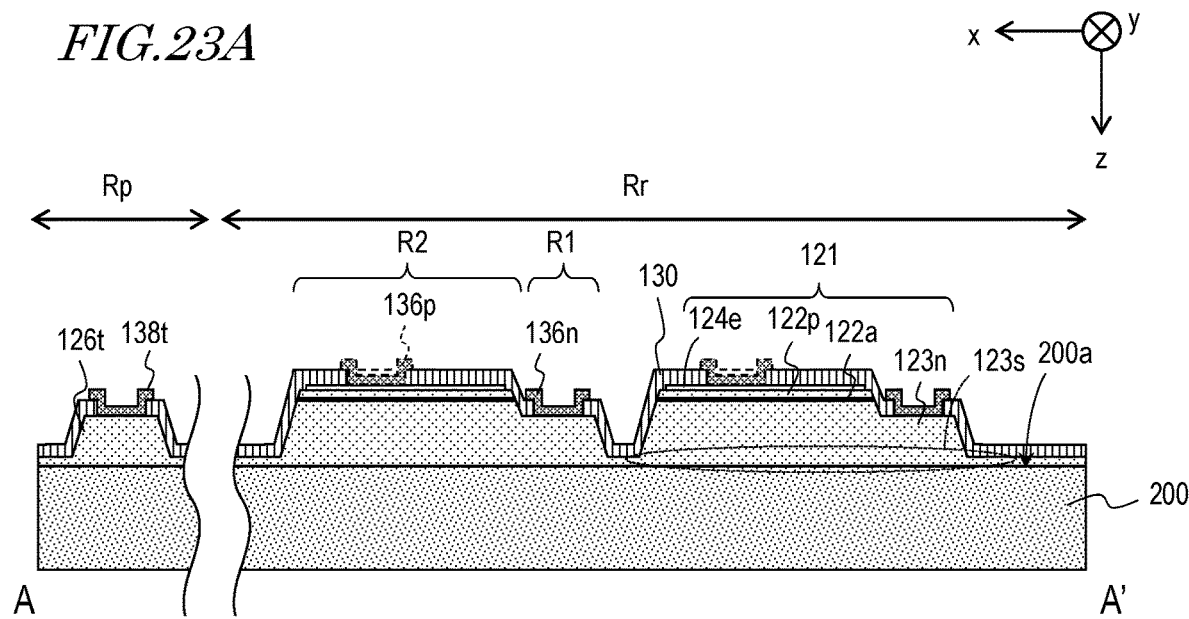
FIG. 23A is a schematic cross-sectional view for description of a method of manufacturing a light emitting device of another embodiment of the present disclosure.
Figure 23B:
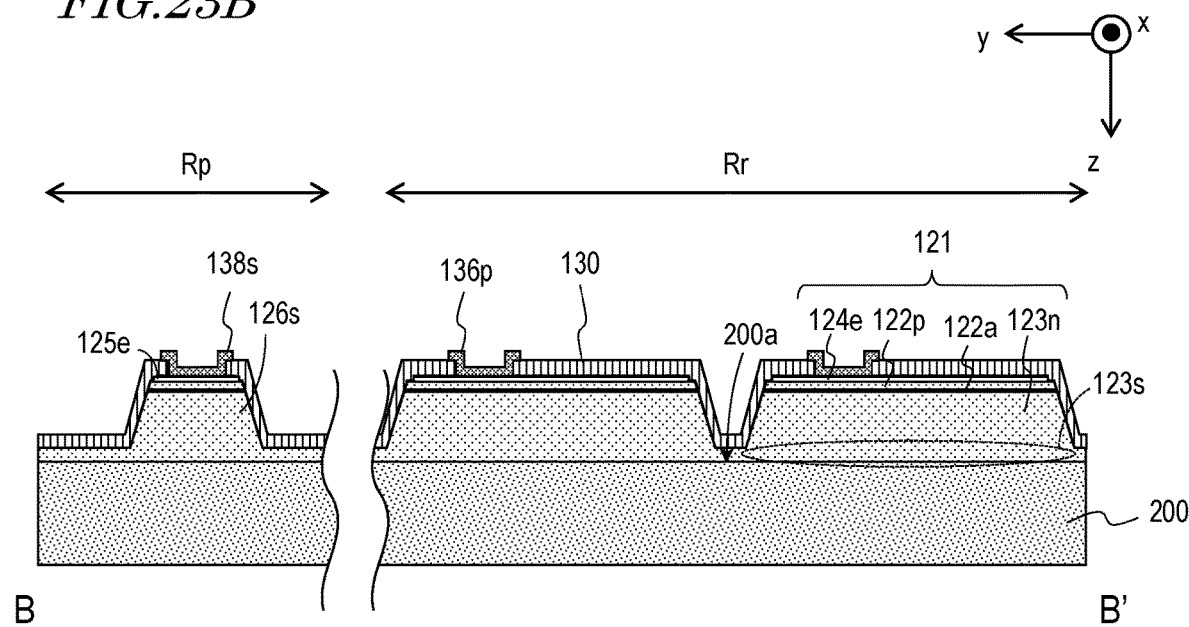
FIG. 23B is a schematic cross-sectional view for description of a method of manufacturing a light emitting device of another embodiment of the present disclosure.

Then, a reflecting film is formed so as to cover an entirety of a surface of the supporting substrate 200. A portion of the reflecting film on a region of the n-type semiconductor layer 123n, in which a contact is to be formed, of each of the light emitting structures 121 and a portion of the reflecting film on a region of the p-type semiconductor layer 122p in which a contact is to be formed are removed by reactive ion etching, or the like, so that contact holes are formed in the reflecting film (FIG. 22A and FIG. 22B). Barrier layers may be formed before formation of the reflecting film, as in the first example. Further, as shown in FIG. 23A and FIG. 23B, an n-side electrode 136n, a p-side electrode 136p, and other components are formed at the contact holes.

Figure 24A:
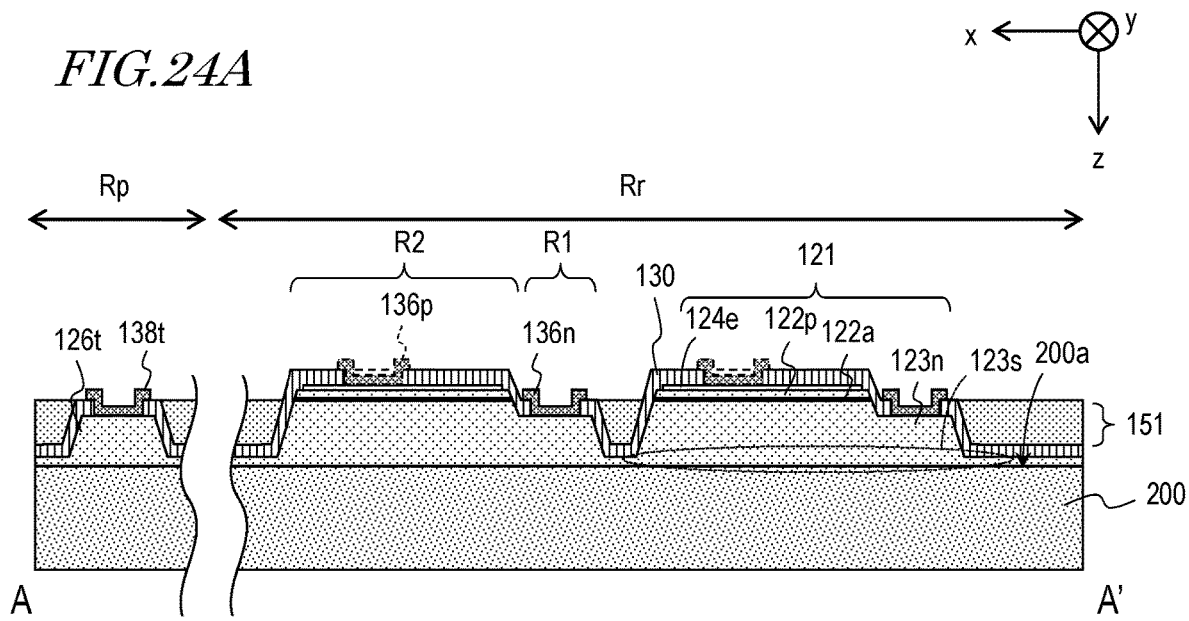
FIG. 24A is a schematic cross-sectional view for description of a method of manufacturing a light emitting device of another embodiment of the present disclosure.
Figure 24B:
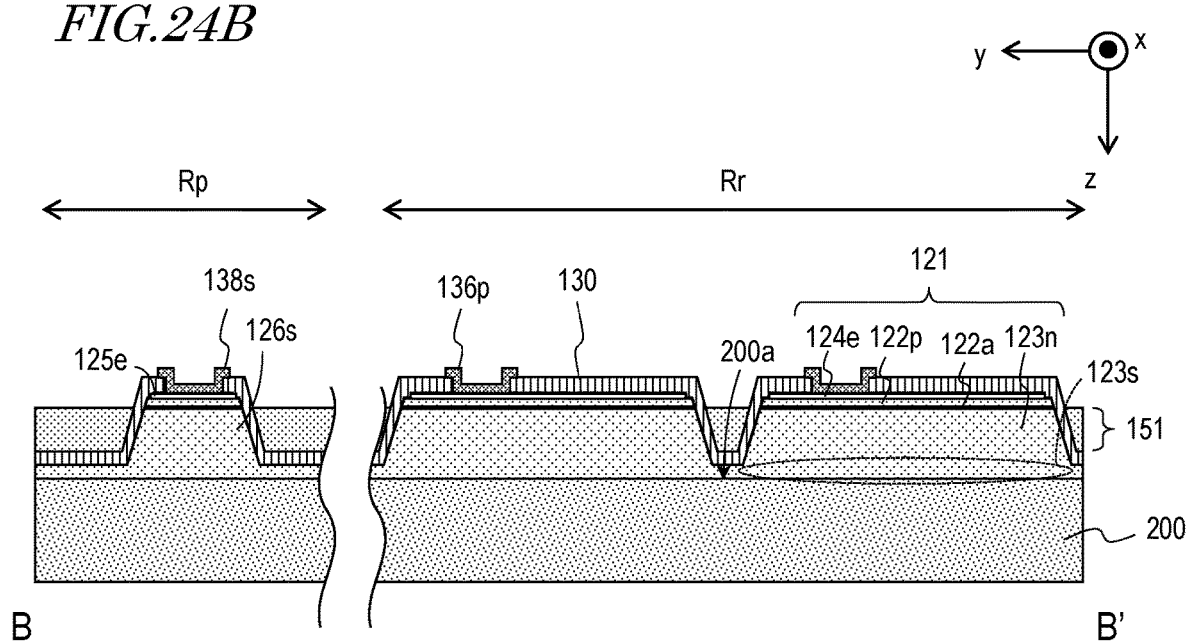
FIG. 24B is a schematic cross-sectional view for description of a method of manufacturing a light emitting device of another embodiment of the present disclosure.

Then, of a region over the reflecting layer 130, a space between respective adjacent two of the light emitting structures 121, a space between the light emitting structures 121 and the first island portions 126s, and a space between the light emitting structures 121 and the second island portions 126t are filled with an uncured resin composition. By curing the resin composition, a resin layer 151 is formed as shown in FIG. 24A and FIG. 24B. As the material of the resin layer 151, for example, an epoxy-based or silicone-based photosensitive material can be used. A light reflective resin layer may be formed as the resin layer 151 using a resin composition in which a light reflective filler is dispersed.

Figure 25A:
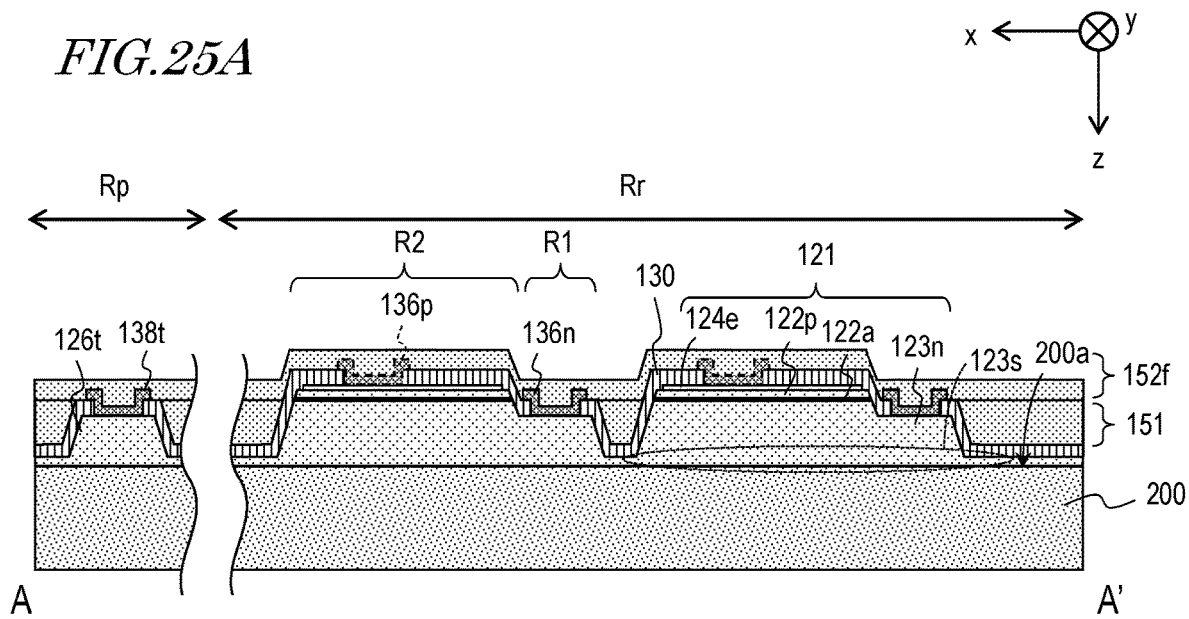
FIG. 25A is a schematic cross-sectional view for description of a method of manufacturing a light emitting device of another embodiment of the present disclosure.
Figure 25B:
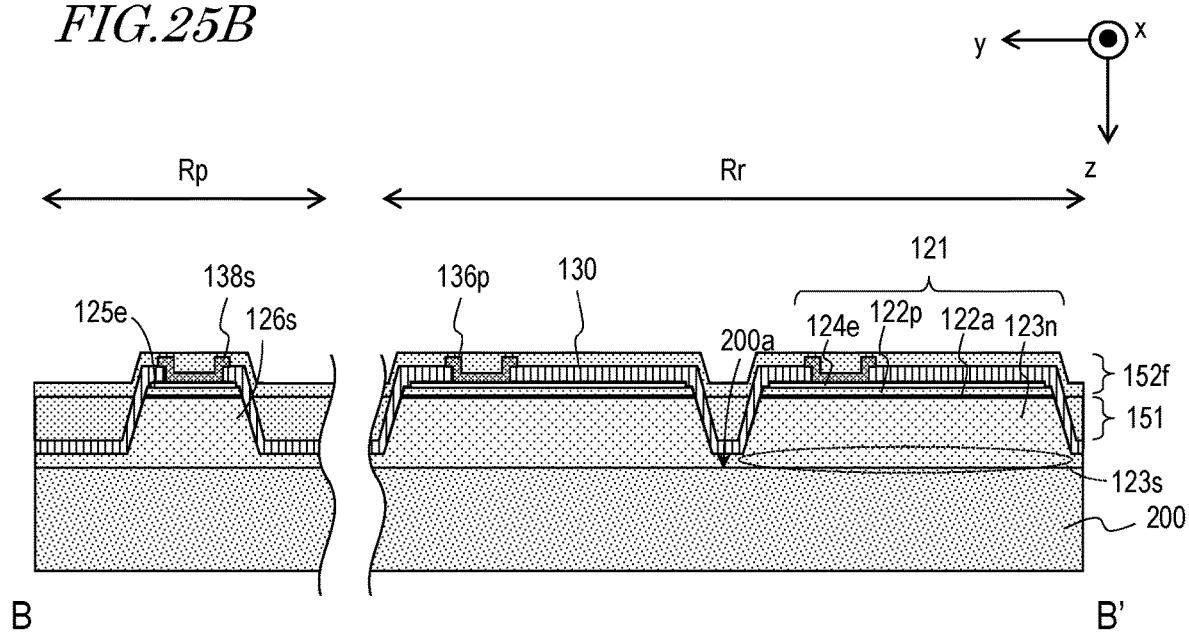
FIG. 25B is a schematic cross-sectional view for description of a method of manufacturing a light emitting device of another embodiment of the present disclosure.
Figure 26A:
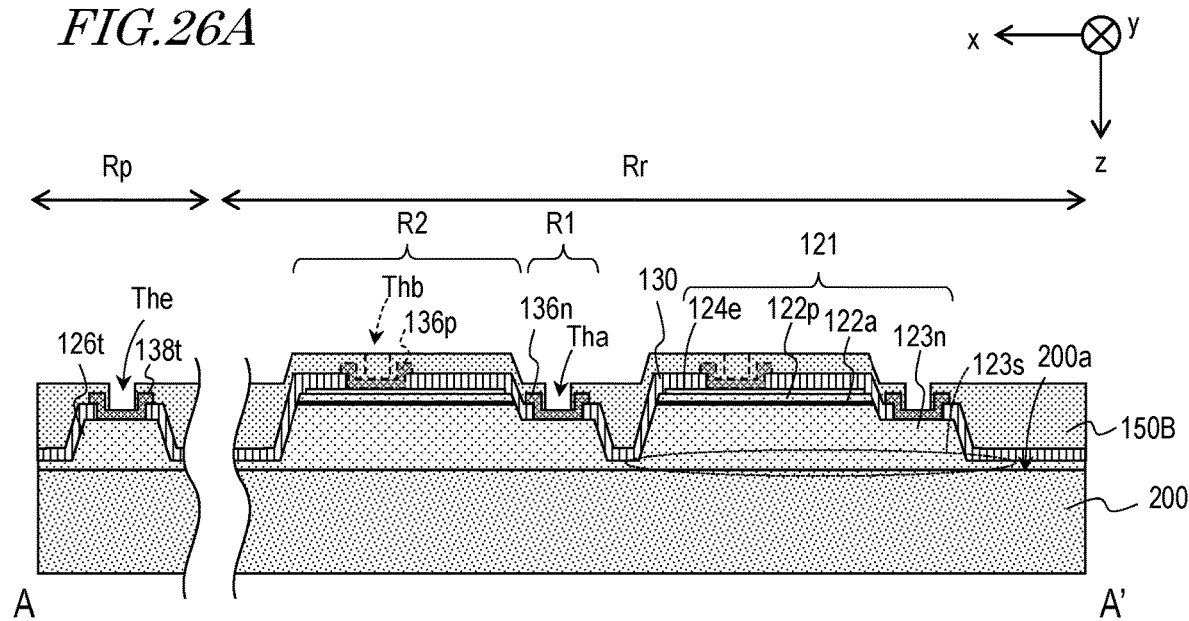
FIG. 26A is a schematic cross-sectional view for description of a method of manufacturing a light emitting device of another embodiment of the present disclosure.
Figure 26B:
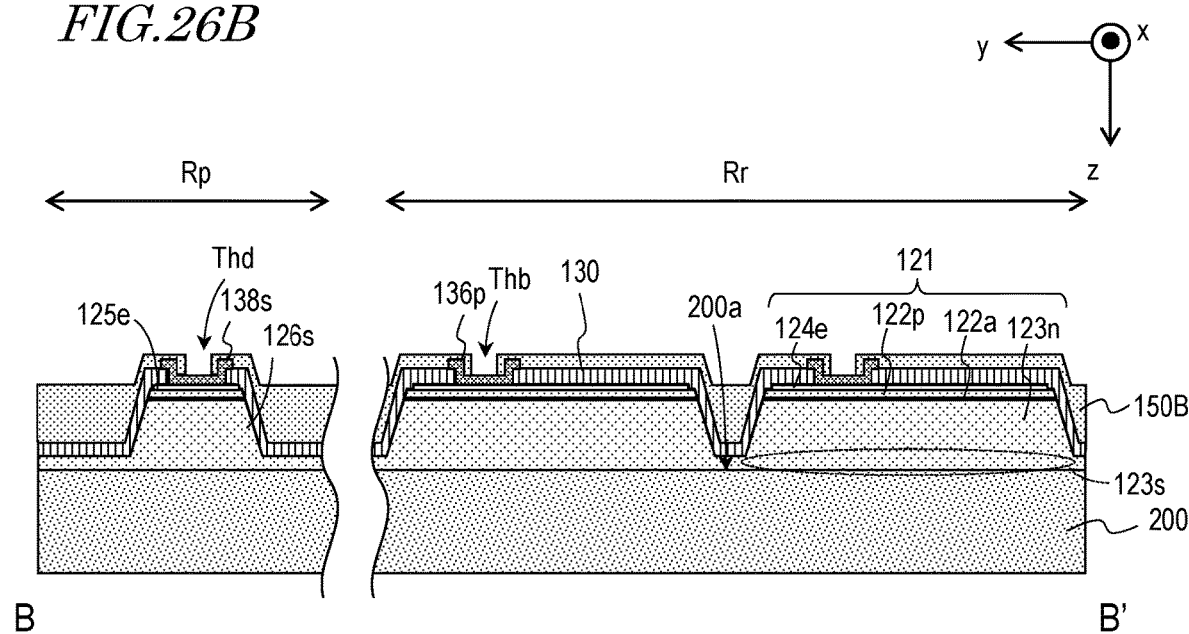
FIG. 26B is a schematic cross-sectional view for description of a method of manufacturing a light emitting device of another embodiment of the present disclosure.

As shown in FIG. 25A and FIG. 25B, an insulating film 152f is formed so as to cover an entirety of a surface of the supporting substrate 200. The insulating film 152f is patterned to form a first insulating layer 150B covering the light emitting structures 121 on the supporting substrate 200 and having a through-hole Tha and a through-hole Thb for each of the light emitting structures 121 as shown in FIG. 26A and FIG. 26B. The appearance of the array of the light emitting structures 121 viewed from the bottom surface side after formation of the first insulating layer 150B is substantially the same as that shown in FIG. 14C and is therefore not shown in the drawings.

Figure 27A:
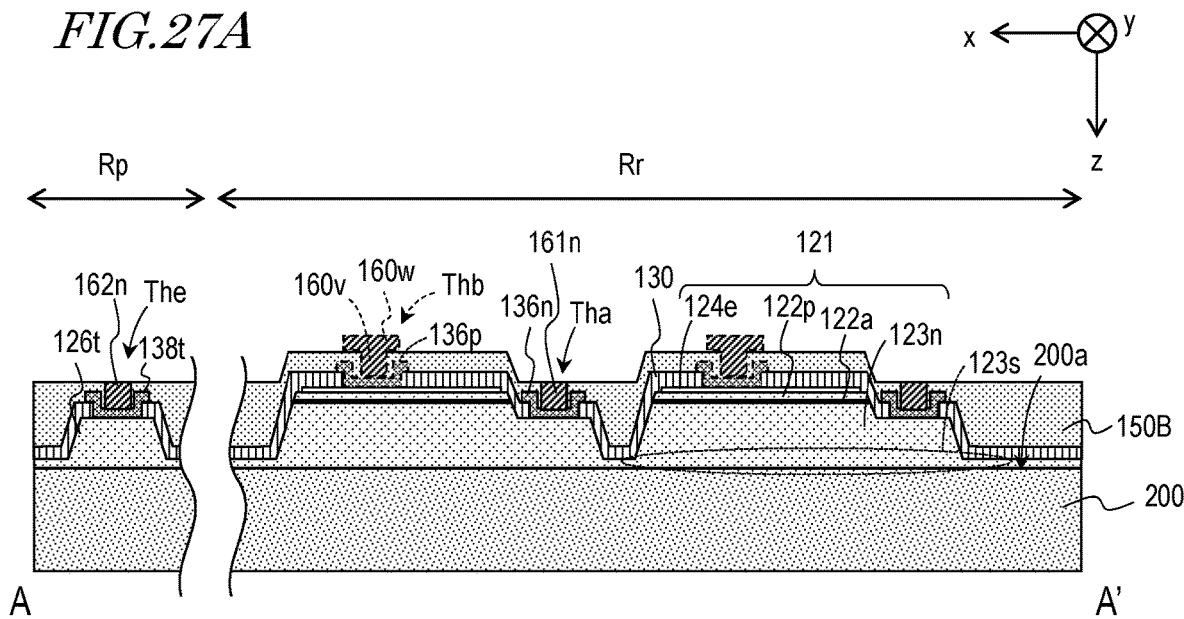
FIG. 27A is a schematic cross-sectional view for description of a method of manufacturing a light emitting device of another embodiment of the present disclosure.
Figure 27B:
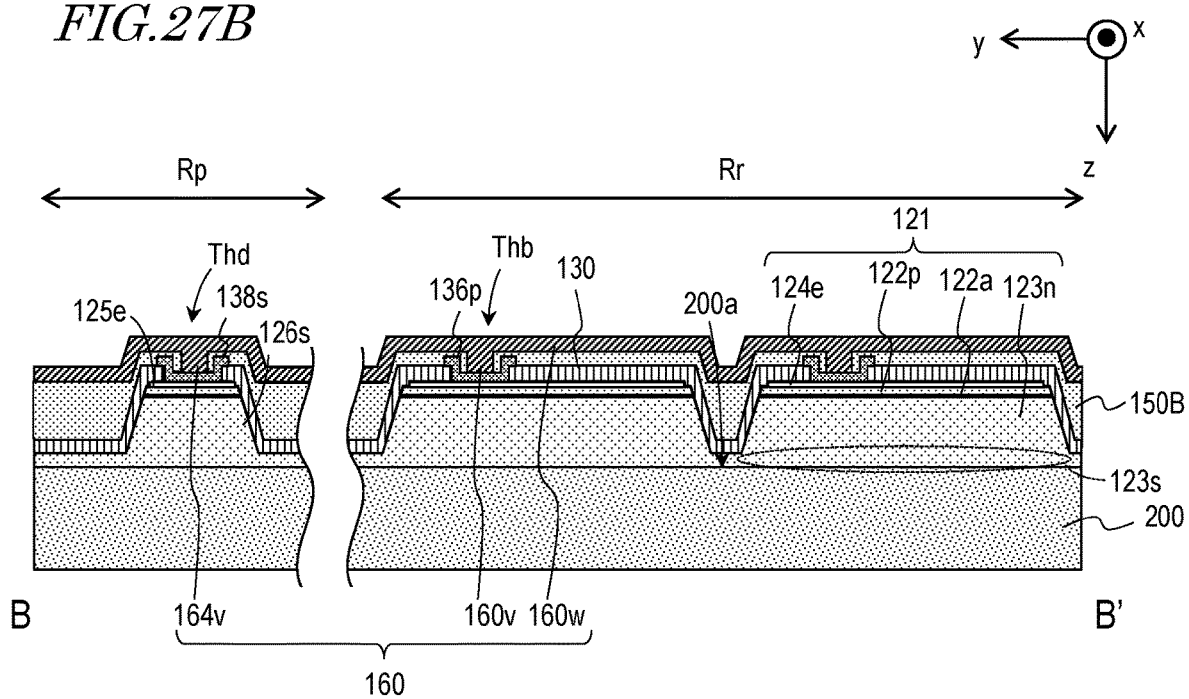
FIG. 27B is a schematic cross-sectional view for description of a method of manufacturing a light emitting device of another embodiment of the present disclosure.

Then, an electrically-conductive film is formed over an entirety of a surface of the supporting substrate 200. The electrically-conductive film is patterned to form a p-side wiring layer 160 that includes first wirings 160w, vias 160v and vias 164v as shown in FIG. 27A and FIG. 27B. In this step, the first electrically-conductive structure 161n is formed together with the first wirings 160w, vias 160v and vias 164v.

Figure 28A:
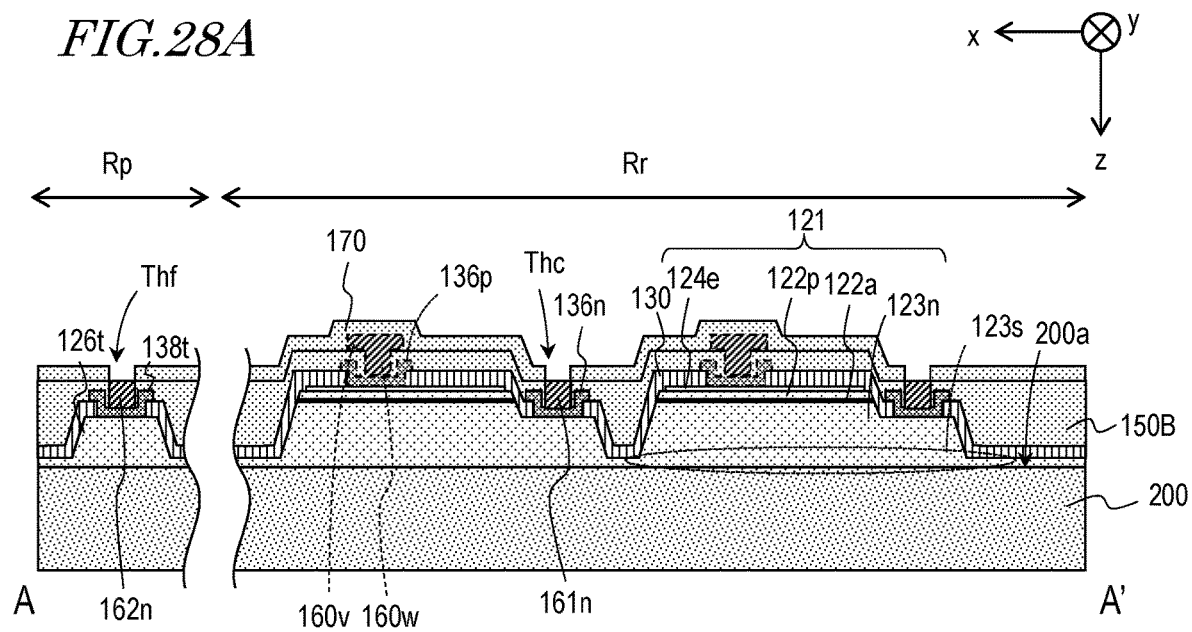
FIG. 28A is a schematic cross-sectional view for description of a method of manufacturing a light emitting device of another embodiment of the present disclosure.
Figure 28B:
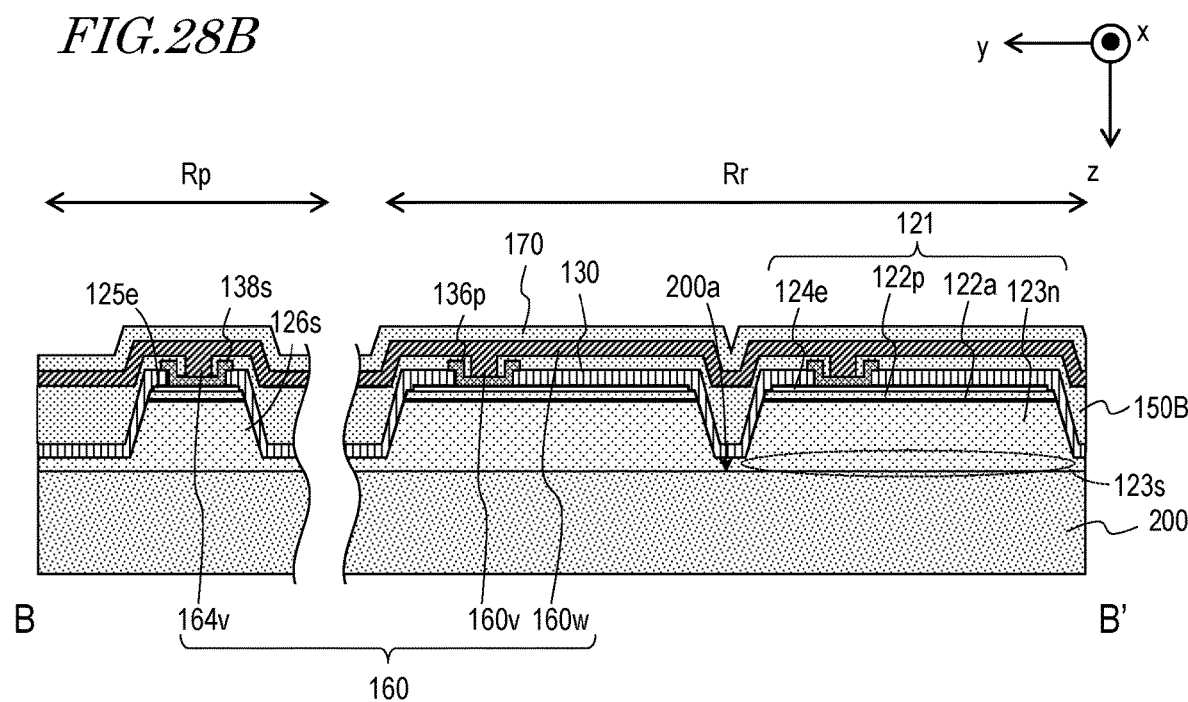
FIG. 28B is a schematic cross-sectional view for description of a method of manufacturing a light emitting device of another embodiment of the present disclosure.
Figure 29A:
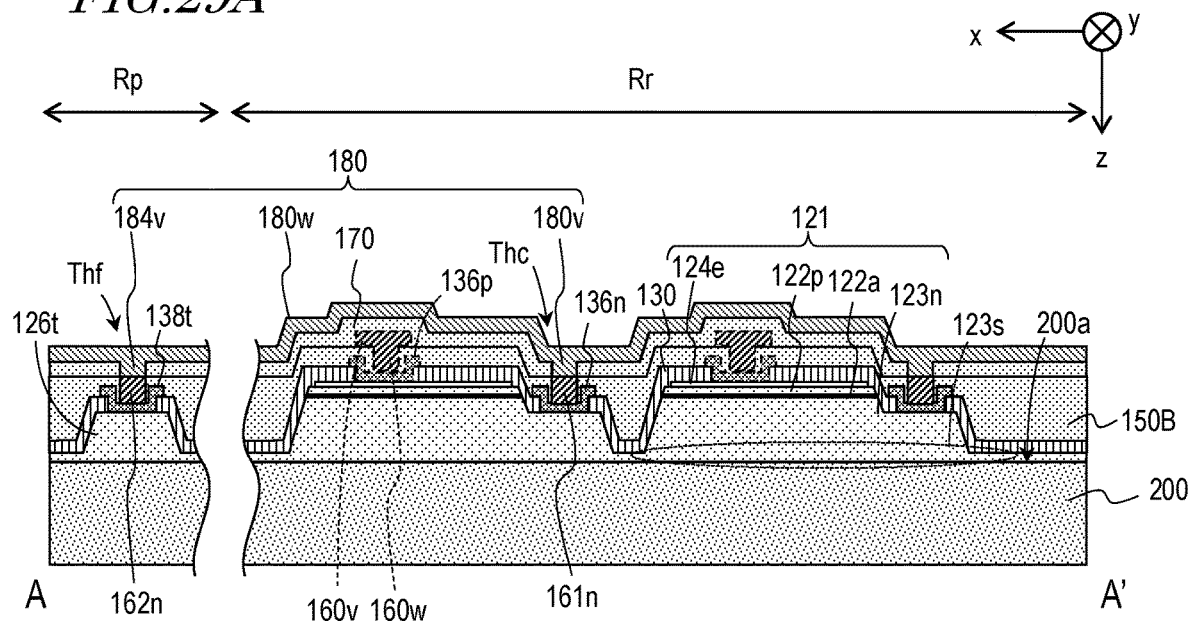
FIG. 29A is a schematic cross-sectional view for description of a method of manufacturing a light emitting device of another embodiment of the present disclosure.
Figure 29B:
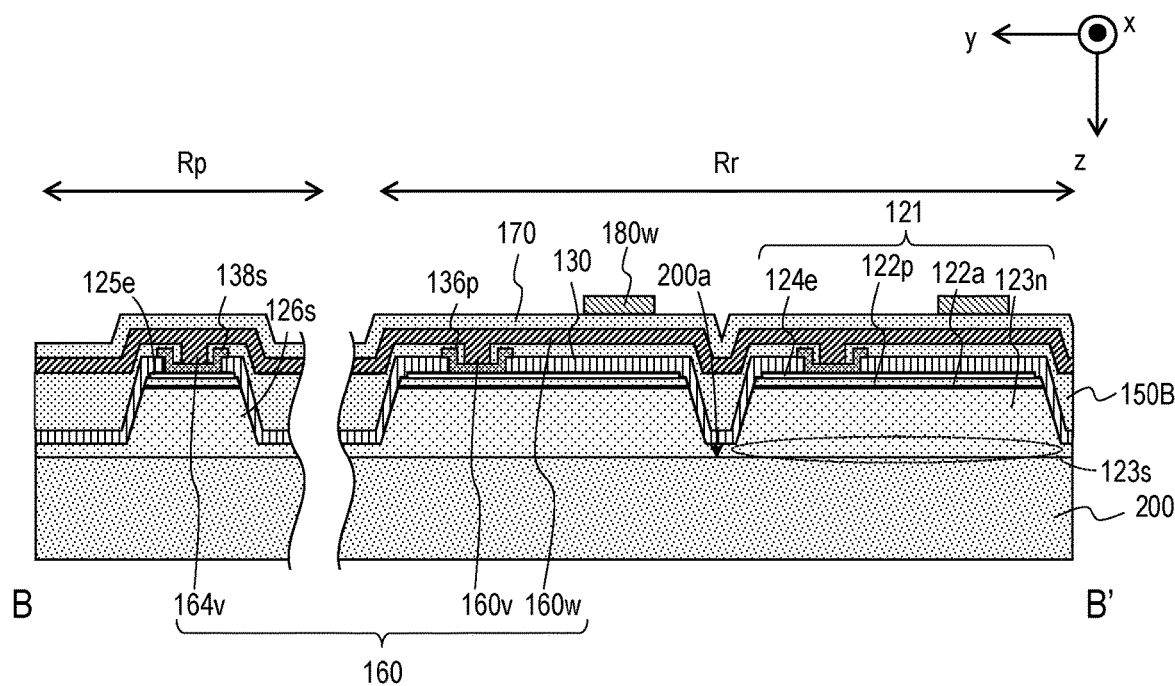
FIG. 29B is a schematic cross-sectional view for description of a method of manufacturing a light emitting device of another embodiment of the present disclosure.

After a second insulating layer 170 is formed as shown in FIG. 28A and FIG. 28B, an n-side wiring layer 180 that includes second wirings 180w and vias 180v as shown in FIG. 29A and FIG. 29B is obtained.

Figure 30A:
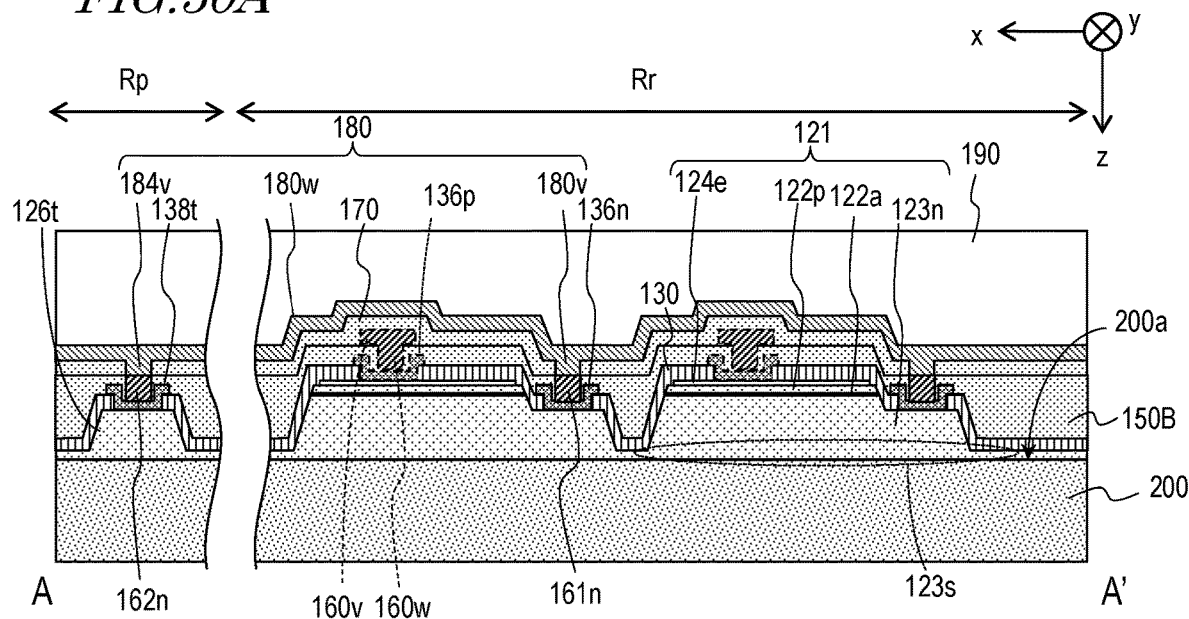
FIG. 30A is a schematic cross-sectional view for description of a method of manufacturing a light emitting device of another embodiment of the present disclosure.
Figure 30B:
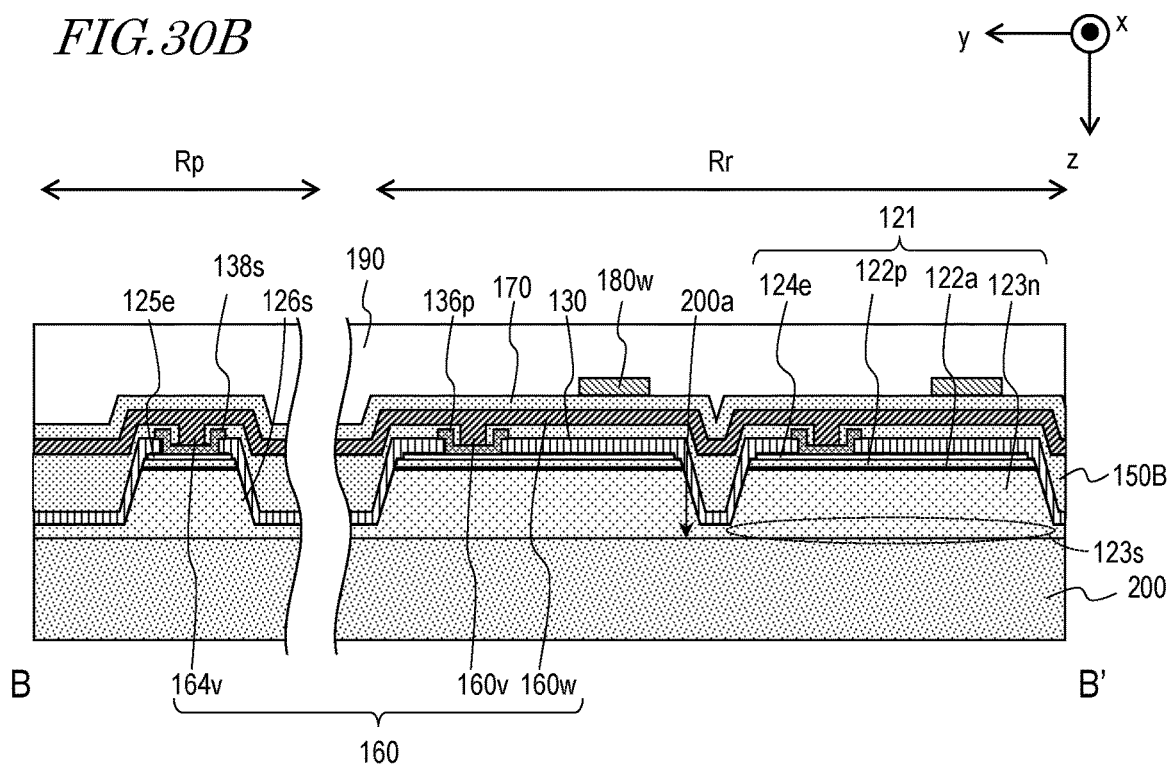
FIG. 30B is a schematic cross-sectional view for description of a method of manufacturing a light emitting device of another embodiment of the present disclosure.

Thereafter, a light reflective resin layer 190 may be formed on the second insulating layer 170 so as to cover the n-side wiring layer 180 as shown in FIG. 30A and FIG. 30B. For example, compression molding such as transfer molding can be used for formation of the light reflective resin layer 190. Alternatively, instead of forming the light reflective resin layer 190, a second supporting substrate may be adhered onto the second insulating layer 170 via an adhesive material or the like so as to cover the n-side wiring layer 180. For the second supporting substrate, a substrate that can support the plurality of light emitting structures can be used. Examples of the second supporting substrate includes a substrate of silicon, sapphire, aluminum nitride or aluminum oxide, and a printed wiring board.

Figure 31A:
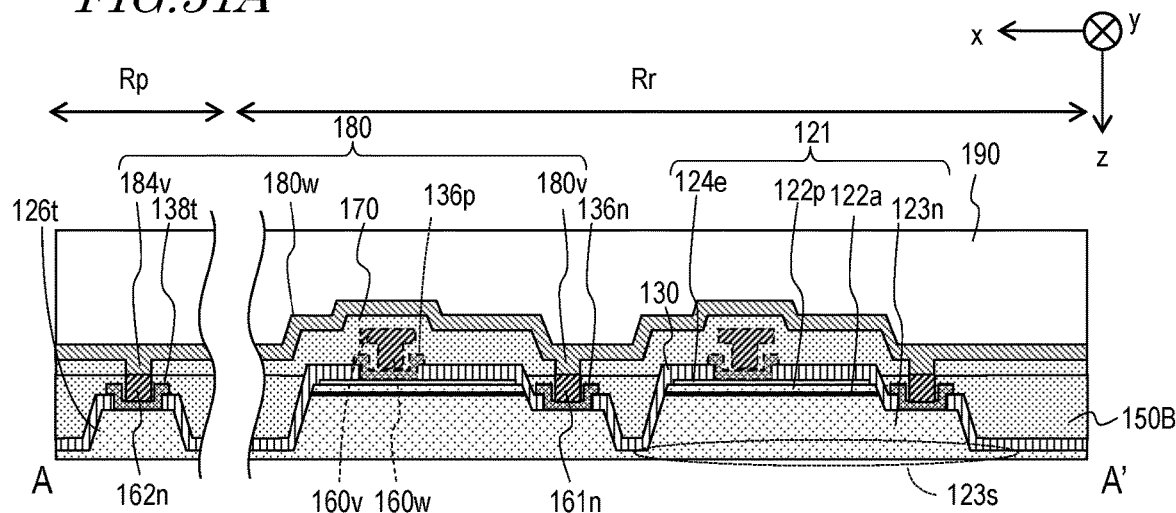
FIG. 31A is a schematic cross-sectional view for description of a method of manufacturing a light emitting device of another embodiment of the present disclosure.
Figure 31B:
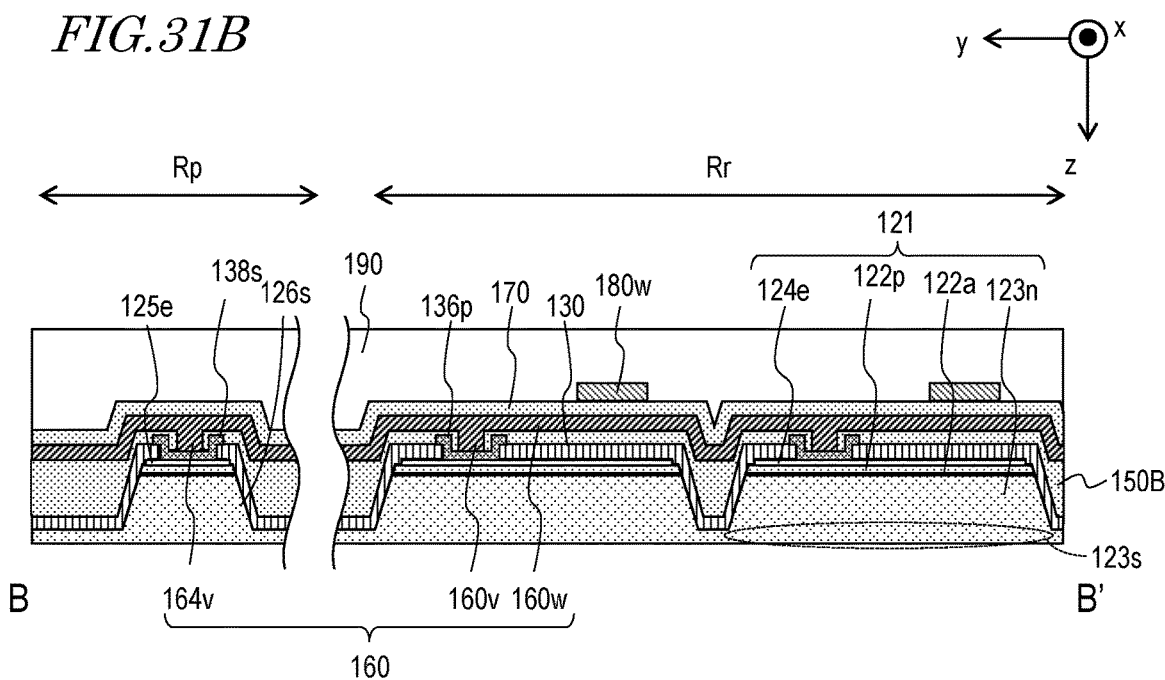
FIG. 31B is a schematic cross-sectional view for description of a method of manufacturing a light emitting device of another embodiment of the present disclosure.

Then, the supporting substrate 200 is removed by etching or the like (see FIG. 31A and FIG. 31B). Thereafter, the sacrificial layer 123s is removed by abrasion using CMP, for example. By removal of the sacrificial layer 123s, the plurality of light emitting structures 121 are spatially apart from each other, resulting in the same structures as the light emitting structures 120 of the first example. That is, an array including a plurality of independent light emitting portions 100e can be formed. With the sacrificial layer 123s disposed at the bottom portion of the n-type semiconductor layers 123n, separation of the supporting substrate 200 can be performed more easily, and structures can be obtained in which the upper surface of the array, which is the light emitting surface, is flat.

Through the above-described steps, the light emitting device 100B can be obtained which has the configuration described above with reference to FIG. 20A and FIG. 20B. The appearance of the light emitting device 100B when viewed from above can be the same as that shown in FIG. 1, in which a portion of the reflecting layer 130 between adjacent ones of light emitting portions 100e has a grid shape. For example, a wall in the form of a grid may be formed on portions of the reflecting layer 130 at the surface of the light emitting device 100. With the wall, leakage of light from a light emission region to a non-emission region can be reduced effectively.

According to certain embodiments of the present disclosure, it is possible to provide a light emitting device that includes a plurality of light emitting structures two-dimensionally arranges while avoiding complication of the manufacturing process. A light emitting device according to the present disclosure is applicable to surface light sources for illuminations, backlighting devices of display apparatuses, etc., display devices in automobiles, signs, signage, advertisement, etc. A light emitting device of the present disclosure is also applicable to decoration with lighting.

The above disclosed subject matter shall be considered illustrative, and not restrictive, and the appended claims are intended to cover all such modifications, enhancements, and other embodiments that fall within the true spirit and scope of the present invention. Thus, to the maximum extent allowed by law, the scope of the present invention may be determined by the broadest permissible interpretation of the following claims and their equivalents, and shall not be restricted or limited by the foregoing detailed description.

What is claimed is:

1. A method of manufacturing a light emitting device, the method comprising:
   providing a wafer that comprises:
      a supporting substrate, and
      a plurality of light emitting structures arranged in a two-dimensional array on a first principal surface of the supporting substrate along a first direction and a second direction, each of the plurality of light emitting structures comprising a first semiconductor layer of a first conductivity type, which includes a first region and a second region, and a second semiconductor layer of a second conductivity type, which covers the second region of the first semiconductor layer, wherein the plurality of light emitting structures includes a first light emitting structure and a second light emitting structure;
   forming a recess in the first principal surface of the supporting substrate between the first light emitting structure and the second light emitting structure;
   forming a resin layer in the recess; and
   removing the supporting substrate so as to expose the first semiconductor layer.

2. The method according to claim 1, further comprising:
   between the step of forming the recess and the step of forming the resin layer, forming a reflecting film covering the plurality of light emitting structures and a surface defining the recess.

3. The method according to claim 1, further comprising:
   between the step of forming the resin layer and the step of removing the supporting substrate, forming a plurality of wirings on the resin layer that electrically connect the plurality of light emitting structures.

4. The method according to claim 1, wherein:
the step of forming the recess comprises forming a first inclined surface and a second inclined surface that are inclined with respect to the first principal surface of the supporting substrate.

5. The method according to claim 2, wherein:
the step of forming the recess comprises forming a first inclined surface and a second inclined surface that are inclined with respect to the first principal surface of the supporting substrate.

6. The method according to claim 4, wherein the first semiconductor layer of the first light emitting structure has a side surface that is flush with the first inclined surface of the recess, and the first semiconductor layer of the second light emitting structure has a side surface that is flush with the second inclined surface of the recess.

7. The method according to claim 5, wherein: the first semiconductor layer of the first light emitting structure has a side surface that is flush with the first inclined surface of the recess, and the first semiconductor layer of the second light emitting structure has a side surface that is flush with the second inclined surface of the recess.

8. The method according to claim 2, wherein:
in the step of forming the reflecting film, the reflecting film defines a plurality of first through-holes and a plurality of second through-holes, each of the first through-holes being disposed above the first region of the first semiconductor layer of a respective one of the light emitting structures, each of the second through-holes being disposed above the second semiconductor layer of a respective one of the light emitting structures.

9. The method according to claim 8, further comprising:
between the step of forming the resin layer and the step of removing the supporting substrate, forming a plurality of wirings on the resin layer that electrically connect the plurality of light emitting structures.

10. The method according to claim 9, wherein:
in the step of forming the plurality of wirings, the plurality of wirings comprise:
a plurality of first wirings, each being electrically connected with the first semiconductor layers of a first subset of the plurality of light emitting structures via the first through-holes, and
a plurality of second wirings, each being electrically connected with the second semiconductor layers of a second subset of the plurality of light emitting structures via the second through-holes.

11. The method according to claim 10, wherein:
the first subset of the plurality of light emitting structures are arranged in a column of the array, and
the second subset of the plurality of light emitting structures are arranged in a row of the array.

12. The method according to claim 5, wherein:
in the step of forming the reflecting film, the reflecting film defines a plurality of first through-holes and a plurality of second through-holes, each of the first through-holes being disposed above the first region of the first semiconductor layer of a respective one of the light emitting structures, each of the second through-holes being disposed above the second semiconductor layer of a respective one of the light emitting structures.

13. The method according to claim 12, further comprising:
between the step of forming the resin layer and the step of removing the supporting substrate, forming a plurality of wirings on the resin layer that electrically connect the plurality of light emitting structures.

14. The method according to claim 13, wherein:
in the step of forming the plurality of wirings, the plurality of wirings comprise:
a plurality of first wirings, each being electrically connected with the first semiconductor layers of a first subset of the plurality of light emitting structures via the first through-holes, and
a plurality of second wirings, each being electrically connected with the second semiconductor layers of a second subset of the plurality of light emitting structures via the second through-holes.

15. The method according to claim 14, wherein:
the first subset of the plurality of light emitting structures are arranged in a column of the array, and
the second subset of the plurality of light emitting structures are arranged in a row of the array.

16. The method according to claim 1, wherein:
the supporting substrate is a Si substrate.

17. The method according to claim 2, wherein:
the supporting substrate is a Si substrate.

18. The method according to claim 4, wherein:
the supporting substrate is a Si substrate.

19. The method according to claim 5, wherein:
the supporting substrate is a Si substrate.

20. The method according to claim 1, wherein:
the reflecting film is a multilayer dielectric film.

21. The method according to claim 2, wherein:
the reflecting film is a multilayer dielectric film.

22. The method according to claim 4, wherein:
the reflecting film is a multilayer dielectric film.

23. The method according to claim 5, wherein:
the reflecting film is a multilayer dielectric film.

* * * * *